(12) United States Patent
Matsuzaki et al.

(10) Patent No.: US 12,230,358 B2
(45) Date of Patent: Feb. 18, 2025

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Takanori Matsuzaki, Kanagawa (JP); Tatsuya Onuki, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 165 days.

(21) Appl. No.: 18/043,103

(22) PCT Filed: Aug. 23, 2021

(86) PCT No.: PCT/IB2021/057699
§ 371 (c)(1),
(2) Date: Feb. 27, 2023

(87) PCT Pub. No.: WO2022/049448
PCT Pub. Date: Mar. 10, 2022

(65) Prior Publication Data
US 2023/0317125 A1 Oct. 5, 2023

(30) Foreign Application Priority Data
Sep. 6, 2020 (JP) .................. 2020-149505

(51) Int. Cl.
*G11C 11/40* (2006.01)
*G11C 7/10* (2006.01)
*G11C 11/4096* (2006.01)

(52) U.S. Cl.
CPC ............ *G11C 7/1096* (2013.01); *G11C 11/40* (2013.01); *G11C 11/4096* (2013.01)

(58) Field of Classification Search
CPC ... G11C 7/1096; G11C 11/40; G11C 11/4096; G11C 14/0027; G11C 11/22; H10N 97/00
See application file for complete search history.

(56) References Cited

U.S. PATENT DOCUMENTS 5,754,466 A * 5/1998 Arase ............... G11C 11/22
   365/145
6,285,577 B1 9/2001 Nakamura
(Continued)

FOREIGN PATENT DOCUMENTS

JP 2003-092533 A 3/2003
JP 2003-178577 A 6/2003
(Continued)

OTHER PUBLICATIONS

Ishizu.T et al., "Embedded Oxide Semiconductor Memories: A Key Enabler for Low-Power ULSI", ECS Transactions, May 21, 2017, vol. 79, No. 1, pp. 149-156, The Electrochemical Society.
Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10, The Japan Society of Applied Physics.
(Continued)

*Primary Examiner* — Khamdan N. Alrobaie
(74) *Attorney, Agent, or Firm* — Fish & Richardson P.C.

(57) ABSTRACT

A data semiconductor device with a long retention time is provided. The semiconductor device includes a first transistor, a second transistor, a ferroelectric capacitor, a first capacitor, and a memory cell. Note that the memory cell includes a third transistor. A first gate of the first transistor is electrically connected to a first terminal of the ferroelectric capacitor, and a first terminal of the first transistor is electrically connected to a second gate of the first transistor and a first terminal of the second transistor. A second terminal of the second transistor is electrically connected to a second terminal of the ferroelectric capacitor and a first terminal of the first capacitor. A back gate of the third transistor is electrically connected to the first terminal of the first transistor. In the above structure, the threshold voltage
(Continued)

of the third transistor can be increased by supplying a negative potential to the first terminal of the first transistor.

12 Claims, 29 Drawing Sheets

(56) References Cited

U.S. PATENT DOCUMENTS

| | | | |
|---|---|---|---|
| 9,818,750 B2 | 11/2017 | Ohshima et al. | |
| 10,388,364 B2 | 8/2019 | Ishizu et al. | |
| 11,538,520 B1* | 12/2022 | Cheng | G11C 13/0069 |
| 2009/0039341 A1 | 2/2009 | Marsman et al. | |
| 2009/0173978 A1 | 7/2009 | Kato | |
| 2012/0063208 A1 | 3/2012 | Koyama et al. | |
| 2017/0186749 A1 | 6/2017 | Ohshima et al. | |
| 2019/0019553 A1* | 1/2019 | Derner | H10B 12/30 |
| 2023/0044659 A1 | 2/2023 | Godo et al. | |
| 2023/0335173 A1* | 10/2023 | Yamazaki | G11C 11/221 |
| 2024/0029773 A1* | 1/2024 | Okamoto | G11C 11/2293 |

FOREIGN PATENT DOCUMENTS

| | | |
|---|---|---|
| JP | 2009-164473 A | 7/2009 |
| JP | 2017-121046 A | 7/2017 |
| KR | 2017-0077792 A | 7/2017 |

OTHER PUBLICATIONS

Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics), 2012, vol. 51, pp. 021201-1-021201-7, The Japan Society of Applied Physics.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

International Search Report (Application No. PCT/IB2021/057699) Dated Oct. 26, 2021.

Written Opinion (Application No. PCT/IB2021/057699) Dated Oct. 26, 2021.

\* cited by examiner

FIG. 25A
| Amorphous | Intermediate state<br>New crystalline phase<br>Crystalline | Crystal |
|---|---|---|
| •completely<br>amorphous | •CAAC<br>•nc<br>•CAC<br>excluding<br>single crystal<br>and poly crystal | •single crystal<br>•poly crystal |
FIG. 25B
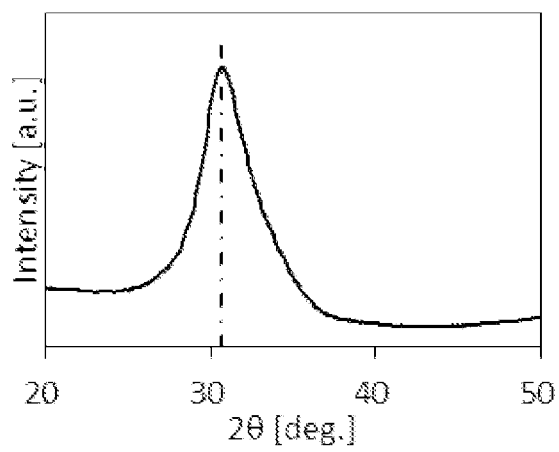
FIG. 25C
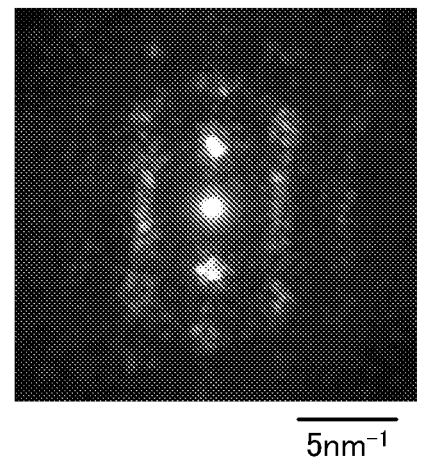

SEMICONDUCTOR DEVICE AND ELECTRONIC DEVICE

CROSS REFERENCE TO RELATED APPLICATIONS

This application is a U.S. National Phase Application under 35 U.S.C. § 371 of International Application PCT/IB2021/057699, filed on Aug. 23, 2021, which is incorporated by reference and claims the benefit of a foreign priority application filed in Japan on Sep. 6, 2020, as Application No. 2020-149505.

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

As a semiconductor applicable to a transistor, a metal oxide has been attracting attention. In particular, an In—Ga—Zn oxide is a typical example of multi-component metal oxides. From researches on the In—Ga—Zn oxide, a CAAC (c-axis aligned crystalline) structure and an nc (nanocrystalline) structure, which are neither single crystal nor amorphous, have been found (e.g., Non-Patent Document 1).

It has been reported that a transistor including a metal oxide semiconductor in a channel formation region (hereinafter referred to as an "oxide semiconductor transistor" or an "OS transistor" in some cases) has extremely low off-state current (e.g., Non-Patent Documents 1 and 2). A variety of semiconductor devices using OS transistors have been manufactured (e.g., Non-Patent Documents 3 and 4).

The manufacturing process of an OS transistor can be incorporated in a CMOS process with a conventional Si transistor, and an OS transistor can be stacked over a Si transistor. For example, Patent Document 1 discloses a structure in which a plurality of memory cell array layers including OS transistors are stacked over a substrate provided with Si transistors.

REFERENCE

Patent Document

[Patent Document 1] United States Patent Application Publication No. 2012/0063208

Non-Patent Document

[Non-Patent Document 1] S. Yamazaki et al., "Properties of crystalline In—Ga—Zn-oxide semiconductor and its transistor characteristics", Jpn. J. Appl. Phys., vol. 53, 04ED18 (2014).
[Non-Patent Document 2] K. Kato et al., "Evaluation of Off-State Current Characteristics of Transistor Using Oxide Semiconductor Material, Indium-Gallium-Zinc Oxide", Jpn. J. Appl. Phys., vol. 51, 021201 (2012).
[Non-Patent Document 3] S. Amano et al., "Low Power LC Display Using In—Ga—Zn-Oxide TFTs Based on Variable Frame Frequency," SID Symp. Dig. Papers, vol. 41, pp. 626-629 (2010).
[Non-Patent Document 4] T. Ishizu et al., "Embedded Oxide Semiconductor Memories: A Key Enabler for Low-Power ULSI", ECS Tran., vol. 79, pp. 149-156 (2017).

SUMMARY OF THE INVENTION

Problems to be Solved by the Invention

Since off-state current flowing through an OS transistor is extremely low as described above, with the use of an OS transistor as a writing transistor or the like included in a memory cell of a memory device, a memory cell with a low off-state leakage current can be formed.

The amount of data handled in electronic devices or the like tends to increase recently, and miniaturization of memory devices, specifically, memory cells has been attempted in order to increase storage capacity. In the case where the size of a writing transistor (e.g., a channel length and a channel width) is reduced as the miniaturization of memory cells, variations in electrical characteristics of writing transistors included in a plurality of memory cells are easily caused. In particular, in the case where variations in threshold voltages of the writing transistors are caused, off-state currents of some writing transistors become high, and memory cells including such writing transistors might have a short data retention time. Therefore, the writing transistor preferably have a structure in which the threshold voltage can be controlled in order to increase the threshold voltage. In addition, an external circuit for controlling the threshold voltages of the transistors is preferably provided in the memory device.

An object of one embodiment of the present invention is to provide a semiconductor device including a circuit for controlling the threshold voltage of a transistor. Another object of one embodiment of the present invention is to provide a semiconductor device including a memory cell with a long data retention time. Another object of one embodiment of the present invention is to provide a semiconductor device in which the number of refresh operations of data retained in a memory cell can be reduced. Another object of one embodiment of the present invention is to provide a novel semiconductor device. Another object of one embodiment of the present invention is to provide an electronic device including the semiconductor device.

Note that the objects of one embodiment of the present invention are not limited to the objects listed above. The objects listed above do not preclude the existence of other objects. The other objects are objects that are not described in this section and will be described below. The objects that are not described in this section are derived from the description of the specification, the drawings, or the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1) One embodiment of the present invention is a semiconductor device including a first transistor, a second transistor, a ferroelectric capacitor, and a first capacitor. A first gate of the first transistor is electrically connected to a first terminal of the ferroelectric capacitor, and a first terminal of the first transistor is electrically connected to a second gate of the first transistor and a first terminal of the second transistor. A second terminal of the second transistor is electrically connected to a second terminal of the ferroelectric capacitor and a first terminal of the first capacitor.

(2) In one embodiment of the present invention of (1), the ferroelectric capacitor may include a dielectric, and the dielectric may include an oxide including hafnium, zirconium, or both.

(3) One embodiment of the present invention is a semiconductor device including a first transistor, a second transistor, a first ferroelectric capacitor, and a second ferroelectric capacitor. A first gate of the first transistor is electrically connected to a first terminal of the first ferroelectric capacitor, and a first terminal of the first transistor is electrically connected to a second gate of the first transistor and a first terminal of the second transistor. A second terminal of the second transistor is electrically connected to a second terminal of the first ferroelectric capacitor and a first terminal of the second ferroelectric capacitor.

(4) In one embodiment of the present invention of (3), each of the first ferroelectric capacitor and the second ferroelectric capacitor may include a dielectric, and the dielectric may include an oxide including hafnium, zirconium, or both.

(5) In one embodiment of the present invention of any one of (1) to (4), a second capacitor may further be included. In particular, a first terminal of the second capacitor is preferably electrically connected to the first terminal of the first transistor and the first terminal of the second transistor.

(6) In one embodiment of the present invention of any one of (1) to (5), a second gate of the second transistor may be electrically connected to a first gate of the second transistor.

(7) In one embodiment of the present invention of any one of (1) to (6), a memory cell including a third transistor may further be included. In particular, one of a first gate and a second gate of the third transistor is preferably electrically connected to the first terminal of the first transistor.

(8) One embodiment of the present invention is an electronic device including the semiconductor device of any one of (1) to (7) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, an electronic device, and the like themselves are semiconductor devices in some cases, or include semiconductor devices in some cases.

In the case where there is a description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, at least one element that enables electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conducting state (on state) or a non-conducting state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of a current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description, X and Y are electrically connected, includes the case where X and Y are electrically connected (i.e., the case where X and Y are connected through another element or another circuit) and the case where X and Y are directly connected (i.e., the case where X and Y are connected without through another element or another circuit).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that the above expressions are examples, and there is no limitation on the expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element, a wiring, or the like having a resistance higher than 0Ω. Therefore, in this specification and the like, a "resistor" sometimes includes a wiring having a resistance value, a transistor in which a current flows between its source and drain, a diode, and a coil. Thus, the term "resistor" can be replaced with the terms "resistance", "load", "region having a resistance value", and the like in some cases; inversely, the terms "resistance", "load", and "region having a resistance value" can be replaced with the term "resistor" and the like in some cases. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1 \times 10^9$Ω.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element or the like that has a pair of electrodes and a dielectric between the electrodes. The terms "capacitor", "parasitic capacitance", "gate capacitance", and the like can be replaced with the term "capacitance" and the like in some cases; inversely, the term "capacitance" can be replaced with the terms "capacitor", "parasitic capacitance", "gate capacitance", and the like in some cases. The term "pair of electrodes" in "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 μF.

In this specification and the like, a transistor includes three terminals called a gate, a source, and a drain. The gate is a control terminal for controlling the conducting state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be replaced with each other in this specification and the like in some cases. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of an operation in a saturation region, so that a flat slope of voltage-current characteristics can be obtained. By utilizing the flat slope of the voltage-current characteristics, an ideal current source circuit or an active load having an extremely high resistance value can be obtained. As a result, a differential circuit, a current mirror circuit, or the like having excellent properties can be obtained.

The case where a single circuit element is illustrated in a circuit diagram may indicate a case where the circuit element includes a plurality circuit elements. For example, the case where a single resistor is illustrated in a circuit diagram may indicate a case where two or more resistors are electrically connected to each other in series. For another example, the case where a single capacitor is illustrated in a circuit diagram may indicate a case where two or more capacitors are electrically connected to each other in parallel. For another example, the case where a single transistor is illustrated in a circuit diagram may indicate a case where two or more transistors are electrically connected to each other in series and their gates are electrically connected to each other. Similarly, for another example, the case where a single switch is illustrated in a circuit diagram may indicate a case where a switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure, the device structure, and the like. Furthermore, a terminal, a wiring, and the like can each be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, are changed with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles is caused" can be rephrased as "electrical conduction of negatively charged particles is caused in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of a current" in a wiring or the like refers to the direction in which a carrier with a positive charge moves, and the amount of a current is expressed as a positive value. In other words, the direction in which a carrier with a negative charge moves is opposite to the direction of a current, and the amount of a current is expressed as a negative value. Thus, in the case where the polarity of a current (or the direction of a current) is not specified in this specification and the like, the description "a current flows from element A to element B" can be rephrased as "a current flows from element B to element A", for example. As another example, the description "current is input to element A" can be rephrased as "current is output from element A".

Ordinal numbers such as "first", "second", and "third" in this specification and the like are used in order to avoid confusion among components. Thus, the terms do not limit the number of components. Furthermore, the terms do not limit the order of components. For example, a "first" component in one embodiment in this specification and the like can be referred to as a "second" component in other embodiments or claims. For another example, a "first" component in one embodiment in this specification and the like can be omitted in other embodiments or claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to that described with a term in this specification and the like and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms such as "film" and "layer" can be interchanged with each other depending on the situation. For example, the term "conductive layer" can be changed into the term "conductive film" in some cases. Moreover, the term "insulating film" can be changed into the term "insulating layer" in some cases. Alternatively, the term "film", "layer", or the like is not used and can be interchanged with another term depending on the case or according to circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "electrode," "wiring," and "terminal" do not functionally limit those components. For example, an "electrode" is used as part of a wiring in some cases, and vice versa. Furthermore, the term "electrode" or "wiring" can also include the case where a plurality of "electrodes" and/or "wirings" are formed in an integrated manner. For example, a "terminal" is used as part of a "wiring" or an "electrode" in some cases, and vice versa. Furthermore, the term "terminal" can also include the case where a plurality of "electrodes", "wirings", "terminals", or the like are formed in an integrated manner. Therefore, for example, an "electrode" can be part of a "wiring" or a "terminal", and a "terminal" can be part of a "wiring" or an "electrode". Moreover, the term "electrode", "wiring", "terminal", or the like is sometimes replaced with the term "region", for example.

In this specification and the like, the terms "wiring", "signal line", "power supply line", and the like can be interchanged with each other depending on the case or according to circumstances. For example, the term "wiring" can be changed into the term "signal line" in some cases. As another example, the term "wiring" can be changed into the term "power supply line" in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or according to circumstances. Conversely, the term "signal" or the like can be changed into the term "potential" in some cases.

In this specification and the like, an impurity in a semiconductor refers to, for example, elements other than the main components of a semiconductor layer. For instance, an element with a concentration lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, when the semiconductor is a silicon layer, examples of impurities that change the characteristics of the semiconductor include Group 1 elements, Group 2 elements, Group 13 elements, and Group 15 elements (except oxygen and hydrogen).

In this specification and the like, a switch has a function of being in a conducting state (on state) or a non-conducting state (off state) to determine whether a current flows or not. Alternatively, a switch has a function of selecting and changing a current path. Thus, a switch may have two or more terminals through which a current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and an MOS transistor), a diode (e.g., a PN diode, a PIN diode, a Schottky diode, an MIM (Metal Insulator Metal) diode, an MIS (Metal Insulator Semiconductor) diode, and a diode-connected transistor), and a logic circuit in which such elements are combined. Note that in the case of using a transistor as a switch, a "conducting state" of the transistor refers to, for example, a state where a source electrode and a drain electrode of the transistor can be regarded as being electrically short-circuited, a state where current can flow between the source electrode and the drain electrode, or the like. Furthermore, a "non-conducting state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. Moreover, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 800 and less than or equal to 100°. Thus, the case where the angle is greater than or equal to 850 and less than or equal to 950 is also included. Furthermore, "approximately perpendicular" or "substantially perpendicular" indicates a state where two straight lines are placed at an angle greater than or equal to 600 and less than or equal to 120°.

Effect of the Invention

One embodiment of the present invention can provide a semiconductor device including a circuit for controlling the threshold voltage of a transistor. One embodiment of the present invention can provide a semiconductor device including a memory cell with a long data retention time. One embodiment of the present invention can provide a semiconductor device in which the number of refresh operations of data retained in a memory cell can be reduced. One embodiment of the present invention can provide a novel semiconductor device. One embodiment of the present invention can provide an electronic device including the semiconductor device.

Note that the effects of one embodiment of the present invention are not limited to the effects listed above. The effects listed above do not preclude the existence of other effects. The other effects are effects that are not described in this section and will be described below. The effects that are not described in this section are derived from the description of the specification, the drawings, or the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 25A is a diagram showing classification of crystal structures, FIG. 25B is a diagram showing an XRD spectrum of crystalline IGZO, and FIG. 25C is a diagram showing a nanobeam electron diffraction pattern of crystalline IGZO.

MODE FOR CARRYING OUT THE INVENTION

Figure 1A:
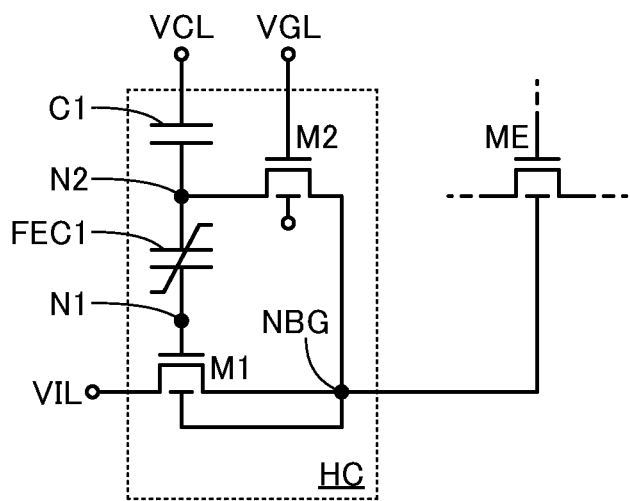
FIG. 1A and FIG. 1B are circuit diagrams each illustrating a configuration example of a semiconductor device.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide included in a channel formation region of a transistor is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, content described in the embodiment is content described using a variety of diagrams or content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification will be described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description of the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted by the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a circuit configuration of a semiconductor device of one embodiment of the present invention will be described.

Configuration Example 1

FIG. TA illustrates a retention circuit for retaining a potential of a back gate of a transistor ME as an example. A circuit HC, which is a retention circuit, includes a transistor M1, a transistor M2, a capacitor C1, and a capacitor FEC1.

The transistor M1 and the transistor M2 are preferably OS transistors. In addition, it is further preferable that a channel formation region of each of the transistor M1 and the transistor M2 include an oxide containing at least one of indium, gallium, and zinc. Alternatively, the channel formation region of each of the transistor M1 and the transistor M2 may be an oxide containing at least one of indium, an element M(Examples of the element M are one or more kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc. It is further preferable that the transistor M1 and the transistor M2 have a structure of a transistor described in Embodiment 3.

The transistor M1 and the transistor M2 may function as switching elements unless otherwise specified. That is, voltages in a range where the transistor M1 and the transistor M2 operate as switching elements may be appropriately input to the gates, the sources, and the drains of the transistor M1 and the transistor M2.

The capacitor FEC1 is a capacitor containing a material that can have ferroelectricity as a dielectric. In this specification and the like, a capacitor containing a material that can have ferroelectricity as a dielectric is referred to as a ferroelectric capacitor.

Examples of the material that can have ferroelectricity include hafnium oxide, zirconium oxide, HfZrOx (X is a real number greater than 0), a material obtained by adding an element J1 (the element J1 here is zirconium (Zr), silicon (Si), aluminum (Al), gadolinium (Gd), yttrium (Y), lanthanum (La), strontium (Sr), or the like) to hafnium oxide, and a material obtained by adding an element J2 (the element J2 here is hafnium (Hf), silicon (Si), aluminum (Al), gadolinium (Gd), yttrium (Y), lanthanum (La), strontium (Sr), or the like) to zirconium oxide. As the material that can have ferroelectricity, piezoelectric ceramic having a perovskite structure, such as PbTiOx, barium strontium titanate (BST), strontium titanate, lead zirconate titanate (PZT), strontium bismuth tantalate (SBT), bismuth ferrite (BFO), or barium titanate may be used. The material that can show ferroelectricity can be a mixture or a compound selected from the above-listed materials, for example. The material that can show ferroelectricity can have a stacked structure of a plurality of materials selected from the above-listed materials. Since a material or the like in which the element J1 is added to a hafnium oxide, a zirconium oxide, HfZrOx, and a hafnium oxide may change its crystal structure (characteristics) depending on a process and the like as well as deposition conditions, a material that exhibits ferroelectricity is referred to not only as a ferroelectric but also as a material that can show ferroelectricity or a material that shows ferroelectricity in this specification and the like.

A material that can have ferroelectricity is an insulator and has a property in which application of an electric field from the outside causes internal polarization and the polarization remains even after the electric field is made zero; thus, such a material can be used as a nonvolatile memory element. Hence, the use of the material as a dielectric sandwiched between a pair of electrodes of a capacitor allows the capacitor to be a "capacitor that can have ferroelectricity" or "ferroelectric capacitor". In this specification and the like, the material that can have ferroelectricity is sometimes represented as being provided between the first terminal and the second terminal of the capacitor. Note that a memory circuit using a capacitor that can have ferroelectricity is sometimes referred to as an FeRAM (Ferroelectric Random Access Memory), a ferroelectric memory, or the like.

Note that in this specification and the like, a circuit symbol of a ferroelectric capacitor (e.g., the capacitor FEC1) is a circuit symbol of a capacitor to which a diagonal line is added, as illustrated in FIG. TA. As another circuit symbol, a circuit symbol of a capacitor including a plurality of diagonal lines between two parallel lines as illustrated in FIG. 1B may be used.

The transistor M1, the transistor M2, and the transistor ME illustrated in FIG. 1 are each an n-channel transistor having a structure including gates over and below a channel, and each of the transistor M1, the transistor M2, and the transistor ME includes a first gate and a second gate. For convenience, the first gate is referred to as a gate (referred to as a front gate in some cases) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

A first terminal of the transistor M1 is electrically connected to a wiring VIL, a second terminal of the transistor M1 is electrically connected to a back gate of the transistor M1 and a first terminal of the transistor M2, and a gate of the transistor M1 is electrically connected to a first terminal of the capacitor FECT. A second terminal of the transistor M2 is electrically connected to a second terminal of the capacitor FECT and a first terminal of the capacitor C1, and a gate of the transistor M2 is electrically connected to a wiring VGL. A second terminal of the capacitor C1 is electrically connected to a wiring VCL.

In particular, each of the second terminal of the transistor M1, the back gate of the transistor M1, and the first terminal of the transistor M2 is electrically connected to the back gate of the transistor ME. Note that depending on the circuit configuration, each of the second terminal of the transistor M1, the back gate of the transistor M1, and the first terminal of the transistor M2 may be electrically connected to the gate of the transistor ME, not the back gate thereof.

In this specification and the like, a point where the gate of the transistor M1 and the first terminal of the capacitor FEC1 are electrically connected to each other is referred to as anode N1. A point where the second terminal of the capacitor FEC1, the first terminal of the capacitor C1, and the second terminal of the transistor M2 are electrically connected to one another is referred to as a node N2. A point where the second terminal of the transistor M1, the back gate of the transistor M1, and the first terminal of the transistor M2 are electrically connected to one another is referred to as a node NBG. That is, a potential applied to the back gate of the transistor ME can be a potential of the node NBG.

Since the node N1 is not electrically connected to a circuit element, a terminal, a wiring, or the like other than the gate of the transistor M1 and the first terminal of the capacitor FEC1, no voltage is directly input from a voltage source or the like to the node N1. Thus, in the circuit configuration in FIG. 1, the node N1 is in a floating state. An initial potential of the node N1 can be determined at the time of manufacturing a semiconductor device (specifically, at the time of forming the circuit HC, for example).

The wiring VIL functions as a wiring supplying a constant voltage. In the case where the threshold voltage of the transistor ME is shifted to the positive direction, for example, the constant voltage can be a low-level potential, a ground potential, a negative potential, or the like. In the case where the threshold voltage of the transistor ME is shifted to the negative direction, for example, the constant voltage can be a high-level potential, a positive potential, or the like.

The wiring VCL functions as a wiring that supplies a voltage for polarizing the material that can show ferroelectricity included in the capacitor FEC1. For example, in the case where the voltage is a positive potential and the material is polarized, the direction of an electric field caused in the material is from the first terminal of the capacitor FEC1 to the second terminal thereof. For another example, in the case where the voltage is a negative potential and the material is polarized, the direction of an electric field caused in the material is from the second terminal of the capacitor FEC1 to the first terminal thereof. The wiring VCL may supply voltage that does not polarize the material that can show ferroelectricity included in the capacitor FEC1.

The wiring VGL functions as a wiring supplying a signal potential for controlling switching between an on state and an off state of the transistor M2. For example, the transistor M2 can be brought into an on state when the voltage supplied by the wiring VGL is set to a high-level potential, and the transistor M2 can be brought into an off state when the voltage supplied by the wiring VGL is set to a low-level potential.

Operation Example

Next, an operation example of the circuit HC in FIG. TA is described.

<<Potential Writing Operation Example to Capacitor FEC1>>

Figure 2A:
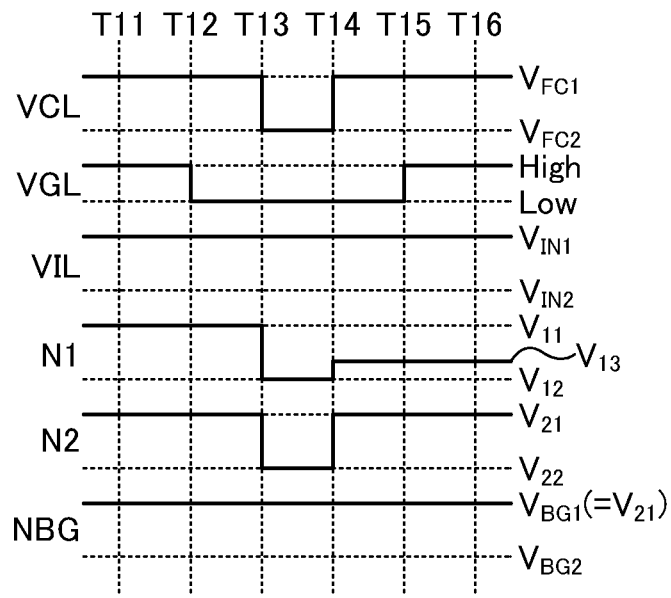
FIG. 2A and FIG. 2B are timing charts showing an operation example of a semiconductor device.

FIG. 2A is a timing chart showing an operation example of the circuit HC. The timing chart in FIG. 2A shows changes in the potentials of the wiring VCL, the wiring VGL, the wiring VIL, the node N1, the node N2, and the node NBG from Time T11 to Time T16 and around the period. In particular, FIG. 2A shows an operation example of potential writing to the capacitor FEC1. In FIG. 2A, a high-level potential is denoted by "high" and a low-level potential is denoted by "low".

From Time T11 to Time T12, a potential of an initial state is supplied to each of the wiring VCL, the wiring VGL, and the wiring VIL that are electrically connected to the circuit HC. Specifically, for example, a potential $V_{FC1}$ is supplied to the wiring VCL, a high-level potential is supplied to the wiring VGL, and a potential $V_{IN1}$ is supplied to the wiring VIL. Note that $V_{FC1}$ can be a positive potential, a high-level potential, or a ground potential, for example, and $V_{IN1}$ can be a positive potential, a high-level potential, or a ground potential, for example.

The potential of the node N1 is set to $V_{IN1}$ and the potential of the node N2 is set to $V_{12}$. Note that the potential $V_{11}$ of the node N1 is lower than the potential $V_{21}$ of the node N2. Note that a voltage between the first terminal and the second terminal of the capacitor FEC1 is $|V_{11}-V_{21}|$; the voltage does not cause polarization in a dielectric that can have ferroelectricity and is contained in the capacitor FEC1. From Time T11 to Time T12, the potential $V_{11}$ of the node N1 may be not a potential lower than the potential $V_{21}$ of the node N2 but a potential equal to or higher than the potential $V_{21}$, as long as polarization is not caused in a dielectric that can have ferroelectricity and is contained in the capacitor FEC1.

Since a high-level potential from the wiring VGL is supplied to the gate of the transistor M2, the transistor M2 is in an on state. Thus, electrical continuity is established between the node N2 and the node NBG, and accordingly a potential $V_{BG1}$ of the node NBG becomes substantially equal to the potential $V_{21}$ of the node N2.

From Time T12 to Time T13, a low-level potential is supplied to the wiring VGL. Thus, the low-level potential from the wiring VGL is supplied to the gate of the transistor M2, so that the transistor M2 is brought into an off state.

Since the transistor M2 is brought into an off state, the node N2 is brought into a floating state.

From Time T13 to Time T14, the potential $V_{FC1}$ supplied by the wiring VCL changes to a potential $V_{FC2}$. The potential $V_{FC2}$ is a potential lower than $V_{FC1}$, and is a potential with which polarization can be caused in a dielectric that can have ferroelectricity and is contained in the capacitor FEC1.

Since the node N2 is in a floating state, when the potential supplied by the wiring VCL changes from $V_{FC1}$ to $V_{FC2}$, the potential of the node N2 also changes in accordance with the voltage change due to capacitive coupling of the capacitor C1. In this operation example, from Time T13 to Time T14, the potential of the node N2 changes from $V_{21}$ to $V_{22}$. Since the potential $V_{FC2}$ is a potential lower than $V_{FC1}$, the potential $V_{22}$ is a potential lower than $V_{21}$.

Since the node N1 is also in a floating state, when the potential of the node N2 changes from $V_{21}$ to $V_{22}$, the potential of the node N1 also changes in accordance with the voltage change due to capacitive coupling of the capacitor FEC1. Note that a gate capacitance between the gate and the first terminal of the transistor M1 exists between the node N1 and the wiring VIL, and a gate capacitance between the gate and the second terminal of the transistor M1 exists between the node N1 and the node NBG; thus, the voltage change in the node N1 is sometimes smaller than the voltage change $V_{21}-V_{22}$ in the node N2. In this case, the potential of the node N1 changes from $V_{11}$ to $V_{12}$.

At this time, a voltage between the first terminal and the second terminal of the capacitor FEC1 becomes $|V_{12}-V_{22}|$, and in the capacitor FEC1, polarization is caused in a dielectric that can have ferroelectricity and is contained in the capacitor FEC1. That is, the operation of writing to the capacitor FEC1 is performed at this timing.

When the potential $V_{IN1}$ supplied by the wiring VIL is a positive potential, a high-level potential, or the like and the potential $V_{IN1}$ is supplied from the wiring VIL to the transistor M1, the potential of the node N1 can be boosted through the gate and the first terminal of the transistor M1 in some cases. This can increase the voltage $|V_{12}-V_{22}|$ between the first terminal and the second terminal of the capacitor FEC1 and sometimes can easily cause polarization in the dielectric that can have ferroelectricity and is contained in the capacitor FEC1.

From Time T14 to Time T15, the potential $V_{FC2}$ supplied by the wiring VCL changes to $V_{FC1}$. That is, the potential supplied by the wiring VCL from Time T14 to Time T15 is equal to the potential supplied by the wiring VCL before Time T13.

Since the node N2 is in a floating state after Time T12, the potential of the node N2 returns from $V_{22}$ to $V_{21}$ when the potential $V_{FC2}$ supplied by the wiring VCL changes to $V_{FC1}$.

When the potential of the node N2 changes from $V_{22}$ to $V_{21}$, the potential $V_{12}$ of the node N1 also changes due to capacitive coupling of the capacitor FEC1. Note that the operation from Time T13 to Time T14 causes polarization in the dielectric that can have ferroelectricity and is contained in the capacitor FEC1; thus, the potential of the node N1 does not return to the original potential $V_{11}$ and becomes a potential higher than the potential $V_{12}$ and lower than the potential $V_{11}$. Specifically, in this operation example, from Time T14 to Time T15, the potential of the node N1 changes from the potential $V_{12}$ to a potential $V_{13}$.

Note that the potential $V_{13}$ is a potential lower than the potential $V_{21}$ and the potential $V_{IN1}$. Here, a gate-source voltage $V_{13}-V_{IN1}$ of the transistor M1 is lower than the threshold voltage of the transistor M1, and the transistor M1 is in an off state.

From Time T15 to Time T16, a high-level potential is supplied to the wiring VGL. Accordingly, the high-level potential from the wiring VGL is supplied to the gate of the transistor M2, so that the transistor M2 is brought into an off state.

By the above operation, potential writing to the capacitor FEC1 can be performed.

<<Potential Writing Operation Example to Back Gate of Transistor ME>>

Figure 2B:
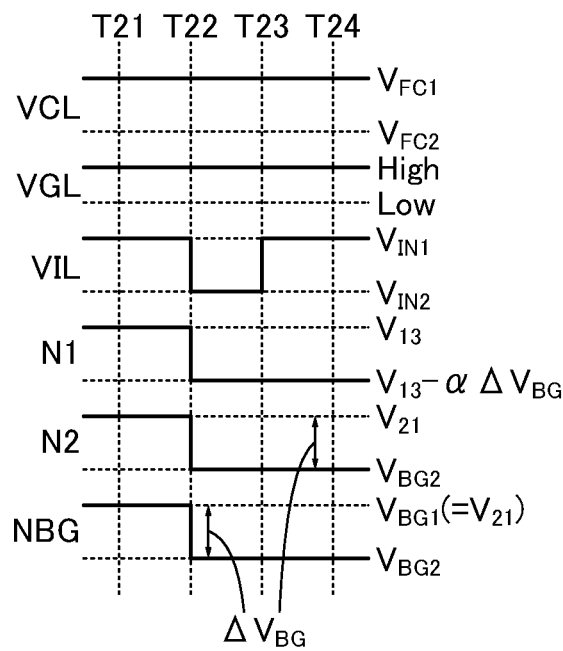

FIG. 2B is a timing chart showing an operation example of the circuit HC. The timing chart in FIG. 2B shows changes in the potentials of the wiring VCL, the wiring VGL, the wiring VIL, the node N1, the node N2, and the node NBG from Time T21 to Time T24 and around the period. In particular, FIG. 2B shows an operation example of potential writing to the back gate of the transistor ME. In FIG. 2B, a high-level potential is denoted by "high" and a low-level potential is denoted by "low".

Time T21 is after Time T16 in the timing chart of FIG. 2A. Thus, from Time T21 to Time T22, the potential $V_{FC1}$ is supplied to the wiring VCL, a high-level potential is supplied to the wiring VGL, and the potential $V_{IN1}$ is supplied to the wiring VIL. In addition, the potential of the node N1 is $V_{13}$, the potential of the node N2 is $V_{21}$, and that of the node NBG is $V_{BG1}$ (=$V_{21}$).

From Time T22 to Time T23, the potential $V_{IN1}$ supplied by the wiring VIL changes to a potential $V_{IN2}$. Note that the potential $V_{IN2}$ is a potential lower than $V_{IN1}$. The potential $V_{IN2}$ can be a negative potential, for example.

Since the potential $V_{IN2}$ is supplied from the wiring VIL to the first terminal of the transistor M1, the gate-source voltage of the transistor M1 is $V_{13}-V_{IN2}$. Here, $V_{13}-V_{IN2}$ is a voltage higher than the threshold voltage of the transistor M1.

When $V_{13}-V_{IN2}$ is set to a voltage higher than the threshold voltage of the transistor M1, the transistor M1 is brought into an on state. In addition, a high-level potential is supplied to the wiring VGL and the transistor M2 is in also an on state, so that the potential from the wiring VIL is supplied to the node N2 through the transistor M1, the node NBG, and the transistor M2.

Specifically, the potentials of the node N2 and the node NBG each decrease from $V_{21}$. In this operation example, from Time T22 to Time T23, the potentials of the node N2 and the node NBG each decrease from $V_{21}$ by a voltage $\Delta V_{BG}$. In addition, the potentials of the node N2 and the node NBG each decease by $\Delta V_{BG}$ to be $V_{BG2}$.

When the potential of the node N2 decreases from $V_{21}$ to $V_{BG2}$, the potential $V_{13}$ of the node N1 also decreases due to capacitive coupling of the capacitor FEC1. Note that in this operation example, from Time T22 to Time T23, the potential of the node N1 is $V_{13}-\alpha\Delta V_{BG}$. Note that $\alpha$ is a capacitive coupling coefficient of the capacitor FEC1.

From Time T23 to Time T24, the potential $V_{IN2}$ supplied by the wiring VIL changes to $V_{IN1}$. That is, the potential supplied by the wiring VIL from Time T23 to Time T24 is equal to the potential supplied by the wiring VIL before Time T22.

Since the potential $V_{IN1}$ from the wiring VIL is supplied to the first terminal of the transistor M1, the gate-source voltage of the transistor M1 is $V_{13}-\alpha\Delta V_{BG}-V_{IN1}$. Note that $V_{13}-\alpha\Delta V_{BG}$ is a potential lower than $V_{13}$, and $V_{13}$ is a potential lower than $V_{IN1}$. Since $V_{13}-V_{IN1}$ is lower than the threshold voltage of the transistor M1, $V_{13}-\alpha\Delta V_{BG}-V_{IN1}$ is also lower than the threshold voltage of the transistor M1. Thus, the transistor M1 is in an off state from Time T23 to Time T24.

By the above operation, the voltage $V_{BG2}$ can be written to the node NBG of the circuit HC. In particular, when $V_{IN2}$ is a negative potential, $V_{BG2}$ can be a negative potential, so that $V_{BG2}$ can be written to the node NBG of the circuit HC as a negative potential. In addition, the transistor M1 can be brought into an off state by setting the gate-source voltage of the transistor M1 to be lower than the threshold voltage thereof, so that the negative potential $V_{BG2}$ of the node NBG can be retained for a long time. Accordingly, the negative potential $V_{BG2}$ can be supplied to the back gate of the transistor ME for a long time. Furthermore, according to circumstances, the negative potential retained in the node NBG may be refreshed by a similar operation.

<<Rewriting Operation of Potential Applied to Node NBG>>

Next, an operation example of the case where the potential of the node NBG is rewritten after Time T24 in the operation example of FIG. 2B will be described.

[Case of Decreasing Potential of Node NBG]

Figure 3A:
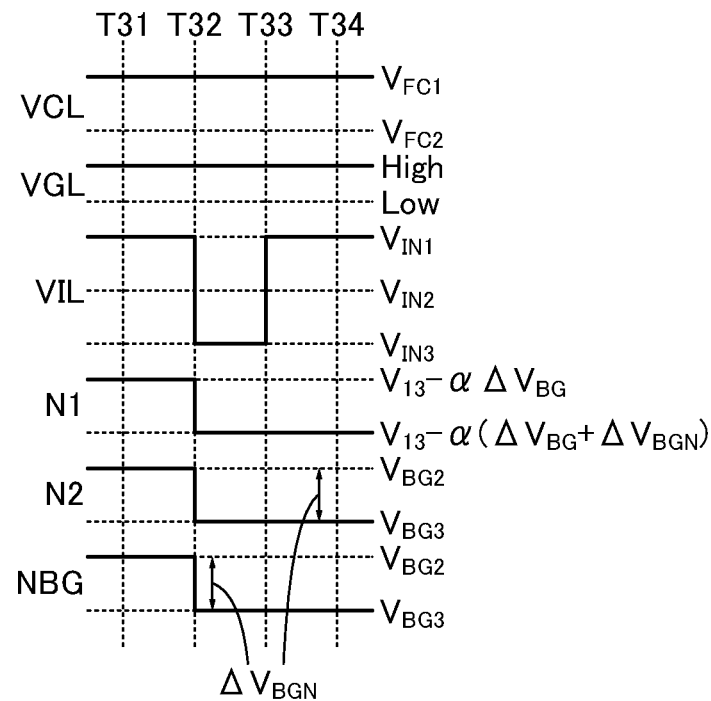
FIG. 3A and FIG. 3B are timing charts showing an operation example of a semiconductor device.

In the case where the potential of the node NBG is decreased, the circuit HC can be operated as in a timing chart shown in FIG. 3A, for example. The timing chart in FIG. 3A shows changes in the potentials of the wiring VCL, the wiring VGL, the wiring VIL, the node N1, the node N2, and the node NBG from Time T31 to Time T34 and around the period. In FIG. 3A, a high-level potential is denoted by "high" and a low-level potential is denoted by "low".

Time T31 is after Time T24 in the timing chart of FIG. 2B. Thus, from Time T31 to Time T32, the potential $V_{FC1}$ is supplied to the wiring VCL, a high-level potential is supplied to the wiring VGL, and the potential $V_{IN1}$ is supplied to the wiring VIL. In addition, the potential of the node N1 is $V_{13}-\alpha\Delta V_{BG}$, the potential of the node N2 is $V_{BG2}$, and that of the node NBG is $V_{BG2}$.

From Time T32 to Time T33, the potential $V_{IN1}$ supplied by the wiring VIL changes to a potential $V_{IN3}$. Note that the potential $V_{IN3}$ is set to a potential lower than $V_{IN2}$. The potential $V_{IN3}$ can be a negative potential lower than $V_{IN2}$, for example.

Since the potential $V_{IN3}$ is supplied from the wiring VIL to the first terminal of the transistor M1, the gate-source voltage of the transistor M1 is $V_{13}-\alpha\Delta V_{BG}-V_{IN3}$. Here, $V_{13}-\alpha\Delta V_{BG}-V_{IN3}$ is a voltage higher than the threshold voltage of the transistor M1.

Since $V_{13}-\alpha\Delta V_{BG}-V_{IN3}$ is a voltage higher than the threshold voltage of the transistor M1, the transistor M1 is brought into an on state. In addition, a high-level potential is supplied to the wiring VGL and the transistor M2 is also in an on state, so that the potential from the wiring VIL is supplied to the node N2 through the transistor M1, the node NBG, and the transistor M2.

Specifically, the potentials of the node N2 and the node NBG each decrease from $V_{BG2}$. In this operation example, from Time T32 to Time T33, the potentials of the node N2 and the node NBG each decrease from $V_{BG2}$ by a voltage $\Delta V_{BGN}$. In addition, the potentials of the node N2 and the node NBG each decrease by $\Delta V_{BGN}$ to be a potential $V_{BG3}$.

When the potential of the node N2 decreases from $V_{BG2}$ to $V_{BG3}$, the potential $V_{13}-\alpha\Delta V_{BG}$ of the node N1 also decreases due to capacitive coupling of the capacitor FEC1. Note that in this operation example, from Time T32 to Time T33, the potential of the node N1 is $V_{13}-\alpha(\Delta V_{BG}+\Delta V_{BGN})$.

From Time T33 to Time T34, the potential $V_{IN3}$ supplied by the wiring VIL changes to $V_{IN1}$. That is, the potential supplied by the wiring VCL from Time T33 to Time T34 is equal to the potential supplied by the wiring VIL before Time T32.

Since the potential $V_{IN1}$ from the wiring VIL is supplied to the first terminal of the transistor M1 at this time, the gate-source voltage of the transistor M1 is $V_{13}-\alpha(\Delta V_{BG}+\Delta V_{BGN})-V_{IN1}$. Note that $V_{13}-\alpha(\Delta V_{BG}+\Delta V_{BGN})$ is a potential lower than $V_{13}$, and $V_{13}$ is a potential lower than $V_{IN1}$. Since $V_{13}-V_{IN1}$ is lower than the threshold voltage of the transistor M1, $V_{13}-\alpha(\Delta V_{BG}+\Delta V_{BGN})-V_{IN1}$ is also lower than the threshold voltage of the transistor M1. Thus, the transistor M1 is in an off state from Time T33 to Time T34.

Figure 3B:
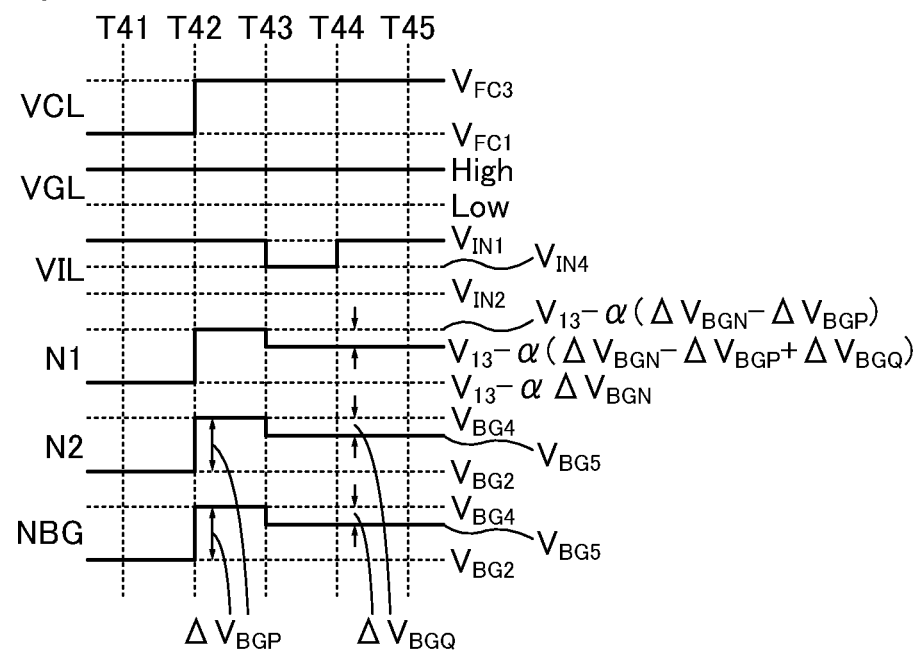

By making the circuit HC perform the operation example of FIG. 3B, a voltage written to the node NBG in the operation example of FIG. 2B can be rewritten to a smaller voltage.

[Case of Increasing Potential of Node NBG]

In the case where the potential of the node NBG is increased, the circuit HC can be operated as in a timing chart shown in FIG. 3B. The timing chart in FIG. 3B, for example, shows changes in the potentials of the wiring VCL, the wiring VGL, the wiring VIL, the node N1, the node N2, and the node NBG from Time T41 to Time T44 and around the period. In FIG. 3B, a high-level potential is denoted by "high" and a low-level potential is denoted by "low".

Time T41 is after Time T24 in the timing chart of FIG. 2B. Thus, from Time T41 to Time T42, the potential $V_{FC1}$ is supplied to the wiring VCL, a high-level potential is supplied to the wiring VGL, and the potential Vi is supplied to the wiring VIL. In addition, the potential of the node N1 is $V_{13}-\alpha\Delta V_{BG}$, the potential of the node N2 is $V_{BG2}$, and that of the node NBG is $V_{BG2}$.

From Time T42 to Time T43, the potential $V_{FC1}$ supplied by the wiring VCL changes to a potential $V_{FC3}$. Note that the potential $V_{FC3}$ is a potential higher than $V_{FC1}$.

In the case where the node N2 and the node NBG are in a floating state, when the potential supplied by the wiring VCL changes from $V_{FC1}$ to $V_{FC3}$, the potentials of the node N2 and the node NBG also change in accordance with the voltage change due to capacitive coupling of the capacitor C1. In this operation example, from Time T42 to Time T43, the potentials of the node N2 and the node NBG each increase from $V_{BG2}$ by $\Delta V_{BGP}$. In addition, the potentials of the node N2 and the node NBG each increase by $\Delta V_{BGP}$ to be a potential $V_{BG4}$.

Since the node N1 is also in a floating state, when the potential of the node N2 changes from $V_{BG2}$ to $V_{BG4}$, the potential of the node N1 also changes in accordance with the voltage change due to capacitive coupling of the capacitor FEC1. In this operation example, the potential of the node N1 changes from $V_{13}-\alpha\Delta V_{BG}$ to $V_{13}-\alpha(\Delta V_{BG}-\Delta V_{BGP})$.

Note that a voltage between the node N1 and the node N2 from Time T42 to Time T43 does not cause inversion of polarization in the dielectric that can have ferroelectricity and is contained in the capacitor FEC1. In other words, a voltage supplied by the wiring VCL which changes from the potential $V_{FC1}$ to the potential $V_{FC3}$ is a voltage that does not cause inversion of polarization in the dielectric.

Since the potential $V_{IN1}$ from the wiring VIL is supplied to the first terminal of the transistor M1, the gate-source voltage of the transistor M1 is $V_{13}-\alpha(\Delta V_{BG}-\Delta V_{BGP})-V_{IN1}$. Since the gate-source voltage of the transistor M1 from Time T41 to Time T42 is $V_{13}-\alpha\Delta V_{BG}-V_{IN1}$, the gate-source voltage of the transistor M1 increases by $\Delta V_{BGP}$ because of the operation from Time T42 to Time T43 (the change in the potential supplied by the wiring VCL from $V_{FC1}$ to $V_{FC3}$).

Here, $V_{13}-\alpha(\Delta V_{BG}-\Delta V_{BGP})-V_{IN1}$ is lower than the threshold voltage of the transistor M1, and the transistor M1 in an off state.

From Time T43 to Time T44, the potential $V_{IN1}$ supplied by the wiring VIL changes to a potential $V_{IN4}$. Note that the potential $V_{IN4}$ is a potential lower than Vi and higher than the potential $V_{IN2}$. The potential $V_{IN4}$ can be a negative potential lower than $V_{IN1}$ and higher than $V_{IN2}$, for example.

Since the potential $V_{IN4}$ from the wiring VIL is supplied to the first terminal of the transistor M1, the gate-source voltage of the transistor M1 is $V_{13}-\alpha(\Delta V_{BG}-\Delta V_{BGP})-V_{IN4}$. Here, $V_{13}-\alpha(\Delta V_{BG}-\Delta V_{BGP})-V_{IN4}$ is a voltage higher than the threshold voltage of the transistor M1.

When $V_{13}-\alpha(\Delta V_{BG}-\Delta V_{BGP})-V_{IN4}$ is set to a voltage higher than the threshold voltage of the transistor M1, the transistor M1 is brought into an on state. Since a high-level potential is supplied to the wiring VGL and the transistor M2 is also in an on state, the potential from the wiring VIL is supplied to the node N2 through the transistor M1, the node NBG, and the transistor M2.

Specifically, the potentials of the node N2 and the node NBG each decrease from $V_{BG4}$. In this operation example, from Time T43 to Time T44, the potentials of the node N2 and the node NBG each decrease from $V_{BG4}$ by a voltage $\Delta V_{BGQ}$. In addition, the potentials of the node N2 and the node NBG each decrease by $\Delta V_{BGQ}$ to be a potential $V_{BG5}$.

When the potential of the node N2 decreases from $V_{BG4}$ to $V_{BG5}$, the potential $V_{13}-\alpha(\Delta V_{BGN}-\Delta V_{BGP})$ of the node N1 also decreases due to capacitive coupling of the capacitor FEC1. Note that in this operation example, from Time T43 to Time T44, the potential of the node N1 is $V_{13}-\alpha(\Delta V_{BGN}-\Delta V_{BGP}+\Delta V_{BGQ})$.

From Time T44 to Time T45, the potential $V_{IN4}$ supplied by the wiring VIL changes to $V_{IN1}$. That is, the potential supplied by the wiring VIL from Time T44 to Time T45 is equal to the potential supplied by the wiring VIL before Time T43.

Since the potential $V_{IN1}$ from the wiring VIL is supplied to the first terminal of the transistor M1 at this time, the gate-source voltage of the transistor M1 is $V_{13}-\alpha(\Delta V_{BGN}-\Delta V_{BGP}+\Delta V_{BGQ})-V_{IN1}$. Note that $V_{13}-\alpha(\Delta V_{BGN}-\Delta V_{BGP}+\Delta V_{BGQ})$ is a potential lower than $V_{13}$, and $V_{13}$ is a potential lower than Vin. Since $V_{13}-V_{IN1}$ is lower than the threshold voltage of the transistor M1, $V_{13}-\alpha(\Delta V_{BGN}-\Delta V_{BGP}+\Delta V_{BGQ})-V_{IN1}$ is also lower than the threshold voltage of the transistor M1. Thus, the transistor M1 is in an off state from Time T44 to Time T45.

By the above operation, the voltage $V_{BG5}$ higher than the voltage $V_{BG2}$ can be written to the node NBG of the circuit HC. Since the transistor M1 is in an off state, the negative potential $V_{BG5}$ of the node NBG can be retained for a long time, whereby the potential $V_{BG5}$ can be supplied to the back gate of the transistor ME for a long time.

By the operation of the timing charts in FIG. 3A and FIG. 3B, the voltage $V_{BG2}$ written to the node NBG of the circuit HC can be rewritten to another potential.

Configuration Example 2

Next, a modification example of the circuit HC in FIG. 1, which is a semiconductor device of one embodiment of the present invention, is described.

Although the connection structure of the back gate of the transistor M2 is not illustrated in FIG. 1, a portion to which the back gate of the transistor M2 is connected can be determined at the design stage.

For example, in the case where on-state current of the transistor M2 is desired to be increased, the gate and the back gate of the transistor M2 are electrically connected to each other. Specifically, the back gate of the transistor M2 may be electrically connected to the gate of the transistor M2 as in the circuit HC illustrated in FIG. 4A.

Alternatively, for example, in the transistor M2, a wiring electrically connected to an external circuit or the like may be provided and a fixed potential or a variable potential may be supplied to the back gate of the transistor by the external circuit or the like to change the threshold voltage of the transistor or to reduce the off-state current of the transistor M2. Specifically, for example, the back gate of the transistor M2 may be electrically connected to the wiring VBL as in the circuit HC illustrated in FIG. 4B. In the configuration in FIG. 4B, a low-level potential, the ground potential, a negative potential, or the like is applied to the wiring VBL to increase the threshold voltage of the transistor M2, whereby the off-state current of the transistor M2 can be reduced. In contrast, in the case where the on-state current of the transistor M2 is desired to be increased, a high-level potential, a positive potential, or the like is applied to the wiring VBL to reduce the threshold voltage of the transistor M2.

Although the portion to which the back gate of the transistor M2 is connected is described in the above example, the transistor M2 does not necessarily include the back gate.

Figure 4A:
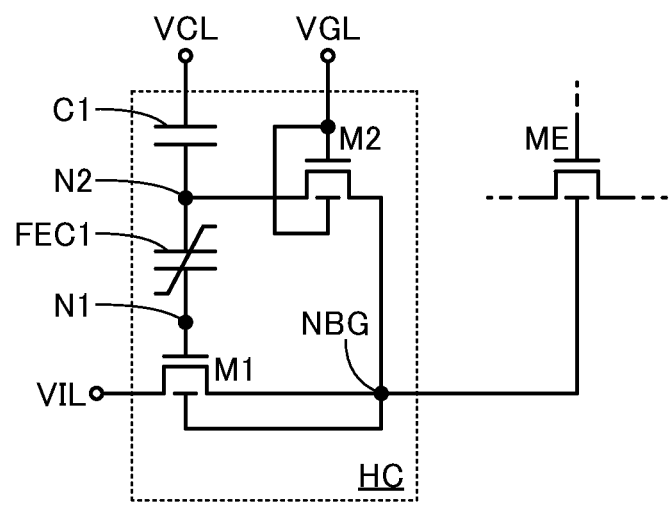
FIG. 4A and FIG. 4B are circuit diagrams each illustrating a configuration example of a semiconductor device.
Figure 4B:
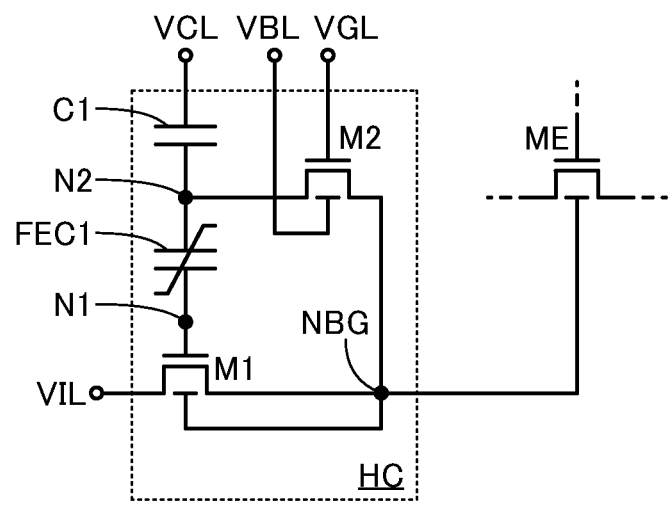

Note that FIG. 4A and FIG. 4B illustrate the modification examples of the portion to which the back gate of the transistor M2 in FIG. 1 is connected; similarly, portions to which back gates of transistors described in other parts in this specification and the like and transistors illustrated in other drawings are connected can be determined at the design stage. In addition, the presence or absence of the back gates of the transistors described in other parts in this specification and the like and the transistors illustrated in other drawings can also be determined at the design stage.

For example, a modification example of a portion to which the back gate of the transistor M1 of the circuit HC in FIG. 1 is connected is described. As an example of the semiconductor device of one embodiment of the present invention, the configuration as illustrated in FIG. 5A in which the back gate of the transistor M1 in the circuit HC in FIG. 1 is not electrically connected to the second terminal of the transistor M1, the first terminal of the transistor M2, and the back gate of the transistor ME but electrically connected to the gate of the transistor M1 may be employed.

Figure 5A:
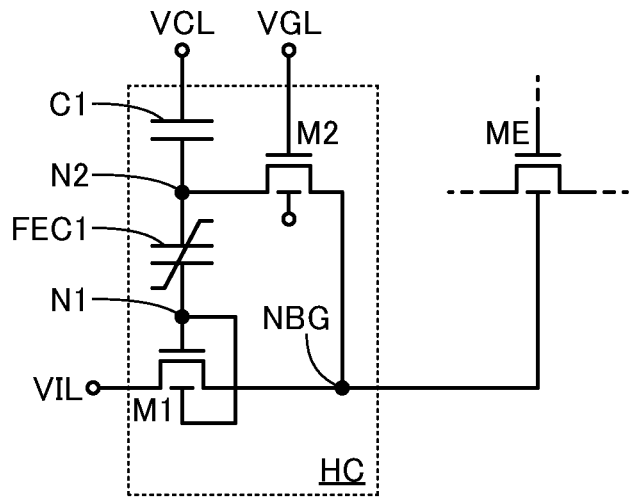
FIG. 5A and FIG. 5B are circuit diagrams each illustrating a configuration example of a semiconductor device.

When the gate and the back gate of the transistor M1 are electrically connected to each other as illustrated in FIG. 5A, the amount of on-state current of the transistor M1 can be increased.

Figure 5B:
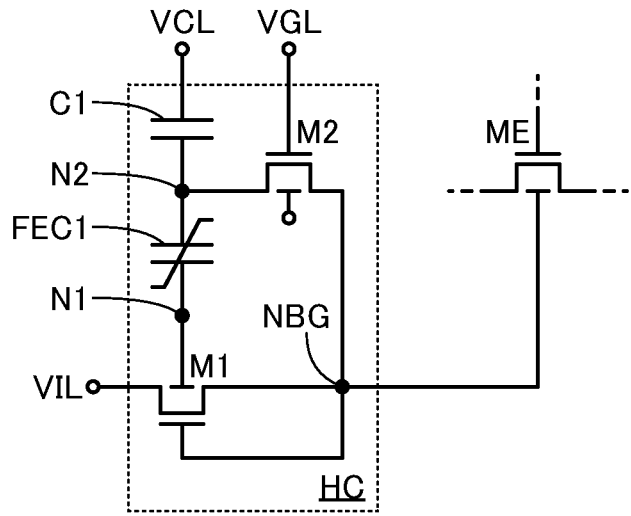

As an example of the semiconductor device of one embodiment of the present invention, the configuration as illustrated in FIG. 5B in which the gate and the back gate of the transistor M1 in the circuit HC in FIG. 1 are interchanged may be employed.

Configuration Example 3

Next, a semiconductor device of one embodiment of the present invention which has a circuit configuration different from those of the circuits HC in FIG. 1, FIG. 4A, FIG. 4B, FIG. 5A, and FIG. 5B.

Figure 6:
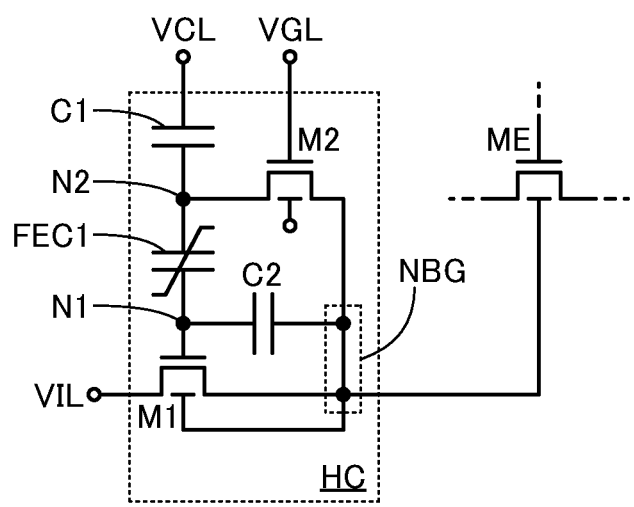
FIG. 6 is a circuit diagram illustrating a configuration example of a semiconductor device.

The circuit HC illustrated in FIG. 6 is a modification example of the circuit HC in FIG. 1, and different from the circuit HC in FIG. 1 in including a capacitor C2. In the circuit HC in FIG. 6, a first terminal of the capacitor C2 is electrically connected to the second terminal of the transistor M1, the back gate of the transistor M1, the first terminal of the transistor M2, and the back gate of the transistor ME. A second terminal of the capacitor C2 is electrically connected to the second terminal of the capacitor FEC1 and the gate of the transistor M1. That is, the circuit HC in FIG. 6 has a configuration in which the capacitor C2 is provided between the node N1 and the node NBG.

The capacitor C2 is provided between the node N1 and the node NBG, whereby voltage between the gate and the second terminal of the transistor M1 can be retained. Accordingly, for example, when the potential of the node N2 changes from $V_{21}$ to $V_{22}$ between Time T13 and Time T14 in the timing chart of FIG. 2A, a change in the voltage of the node N1 can be smaller than the change in the voltage of the node N2, $V_{21}-V_{22}$. Therefore, by providing the capacitor C2 between the node N1 and the node NBG, for example, the operation from Time T13 to Time T14 in the timing chart of FIG. 2A can easily polarize a dielectric that can show ferroelectricity included in the capacitor FEC1 in some cases.

Configuration Example 4

Next, a semiconductor device of one embodiment of the present invention which has a circuit configuration different from those of the circuits HC in FIG. 1 and FIG. 4A to FIG. 6 is described.

Figure 7:
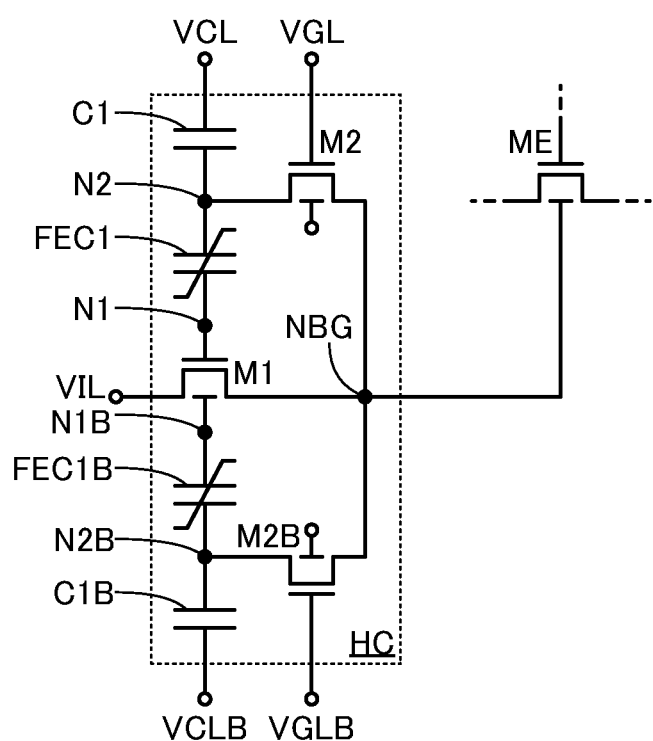
FIG. 7 is a circuit diagram illustrating a configuration example of a semiconductor device.

The circuit HC illustrated in FIG. 7 is a modification example of the circuit HC in FIG. 1, and different from the circuit HC in FIG. 1 in that the circuit HC illustrated in FIG. 7 includes a transistor M2B, a capacitor C1B, and a capacitor FEC1B and in that the back gate of the transistor M1 is not electrically connected to the second terminal of the transistor M1, the first terminal of the transistor M2, and the back gate of the transistor ME but is electrically connected to a first terminal of the capacitor FEC1B.

As the transistor M2B, a transistor usable as the transistor M2 can be used, for example. As the capacitor FEC1B, for example, a ferroelectric capacitor usable as the capacitor FEC1 can be used. As the capacitor C1B, for example, a capacitor usable as the capacitor C1 can be used.

A first terminal of the transistor M2B is electrically connected to the second terminal of the transistor M1, the first terminal of the transistor M2, and the back gate of the transistor ME. A second terminal of the transistor M2B is electrically connected to a first terminal of the capacitor C1B and a second terminal of the capacitor FEC1B. A gate of the transistor M2B is electrically connected to a wiring VGLB. A second terminal of the capacitor C1B is electrically connected to a wiring VCLB.

In FIG. 7, a point where the back gate of the transistor M1 and the first terminal of the capacitor FEC1B are electrically connected to each other is referred to as a node N1B. A point where the second terminal of the capacitor FEC1B, the first terminal of the capacitor C1B, and the second terminal of the transistor M2B are electrically connected to one another is referred to as a node N2B. A point where the second terminal of the transistor M1, the first terminal of the transistor M2, and the first terminal of the transistor M2B are electrically connected to one another is referred to as a node NBG. That is, a potential applied to the back gate of the transistor ME can be a potential of the node NBG.

The wiring VCLB functions as a wiring that supplies a voltage for polarizing the material that can show ferroelectricity included in the capacitor FEC1B. For example, in the case where the material is polarized and the direction of an electric field caused in the material is from the first terminal of the capacitor FEC1B to the second terminal thereof, the voltage may be a positive potential. For another example, in the case where the material is polarized and the direction of an electric field caused in the material is from the second terminal of the capacitor FEC1B to the first terminal thereof, the voltage may be a negative potential. The wiring VCLB may supply voltage that does not polarize the material that can show ferroelectricity and that is included in the capacitor FEC1B.

The wiring VGLB functions as a wiring supplying a signal potential for controlling switching between an on state and an off state of the transistor M2B. For example, the transistor M2B can be brought into an on state when the voltage supplied by the wiring VGLB is set to a high-level potential, and the transistor M2 can be brought into an off state when the voltage supplied by the wiring VGLB is set to a low-level potential.

Although the circuit HC in FIG. 1 has a configuration in which the potential of the gate of the transistor M1 is retained by the capacitor FEC1, the circuit HC in FIG. 7 has a configuration in which the potential of the gate of the transistor M1 is retained by the capacitor FEC1 and the potential of the back gate of the transistor M1 is retained by the capacitor FEC1B. Since the circuit HC in FIG. 7 has a configuration in which a potential can be applied to the back gate of the transistor M1, the off-state current of the transistor M1 in the circuit HC in FIG. 7 can have a lower off-state current than the transistor M1 in the circuit HC in FIG. 1 in some cases.

Note that a method of writing a potential to the back gate of the transistor M1 (potential writing to the capacitor FEC1B) can be performed in a manner similar to that of a method of writing a potential to the gate of the transistor M1 (potential writing to the capacitor FEC1) by replacing the wiring VCL, the wiring VGL, the node N1, and the node N2 in the timing charts of FIG. 2A, FIG. 2B, FIG. 3A, and FIG. 3B with the wiring VCLB, the wiring VGLB, the node N1B, and the node N2B, respectively.

The wiring VCL and the wiring VCLB may be combined into one wiring VCL, the wiring VGL and the wiring VGLB may be combined into one wiring VGLB (not illustrated). With such a configuration, operation examples in the timing charts of FIG. 2A, FIG. 2B, FIG. 3A, and FIG. 3B are performed, whereby polarization can be caused in dielectrics included in the capacitor FEC1 and the capacitor FEC1B at the same time. The potentials of the gate and the back gate of the transistor M1 can be retained at the same time.

Configuration Example 5

Next, a semiconductor device of one embodiment of the present invention which has a circuit configuration different from those of the circuits HC in FIG. 1 and FIG. 4A to FIG. 7 is described.

Figure 8A:
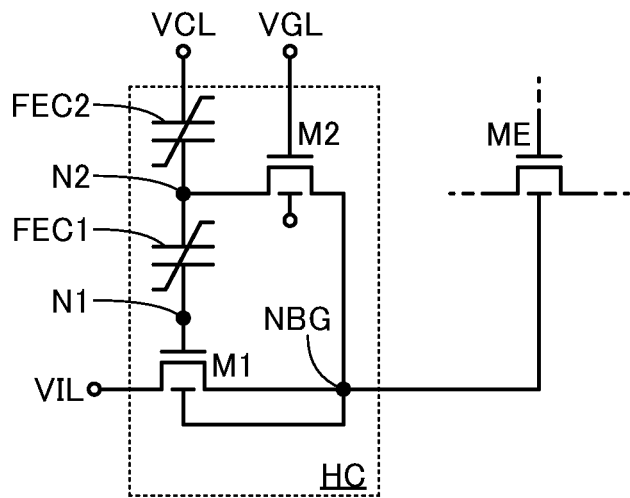
FIG. 8A and FIG. 8B are circuit diagrams each illustrating a configuration example of a semiconductor device.

The circuit HC in FIG. 8A is a modification example of the circuit HC in FIG. 1, and has a configuration in which the capacitor C1 included in the circuit HC in FIG. 1 is replaced with a capacitor FEC2 including a dielectric that can show ferroelectricity.

Even when the capacitor C1 in the circuit HC in FIG. 1 is replaced with the capacitor FEC2 which is a ferroelectric capacitor, the operation examples in the timing charts of FIG. 2A, FIG. 2B, FIG. 3(A), and FIG. 3(B) can be performed in some cases.

When the same material is used for the capacitor FEC1 and the capacitor FEC2, the capacitor FEC1 and the capacitor FEC2 can be formed at the same time in the manufacturing process of the circuit HC, whereby time required for manufacturing the circuit HC can be shortened in some cases.

Figure 8B:
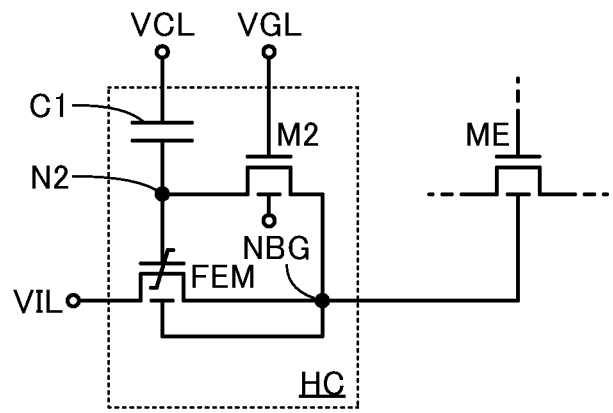

The circuit HC in FIG. 8B is a modification example of the circuit HC in FIG. 1, and has a configuration in which the transistor M1 and the capacitor FEC1 included in the circuit HC in FIG. 1 are replaced with FeFET (Ferroelectric FET).

The circuit HC in FIG. 8B includes a transistor FEM as the FeFET, and a gate of the transistor FEM is electrically connected to the first terminal of the capacitor C1 and the second terminal of the transistor M2. Portions to which the first terminal, the second terminal, and the back gate of the transistor FEM are electrically connected correspond to the first terminal, the second terminal, and the back gate, respectively, of the transistor M1 included in the circuit HC in FIG. 1.

Even when the transistor M1 and the capacitor FEC1 in the circuit HC in FIG. 1 are replaced with the transistors FEM which are FeFETs, the operation examples in the timing charts of FIG. 2A, FIG. 2B, FIG. 3(A), and FIG. 3(B) can be performed.

As described above, FIG. 1 to FIG. 8B are employed for the semiconductor device of one embodiment of the present invention, whereby a potential input to the transistor ME can be retained for a long time. When the potential is a negative potential, the threshold voltage of the transistor ME can be increased. In particular, for example, when a writing transistor included in a memory cell is used as the transistor ME, the writing transistor can have a low off-state current, so that the memory cell can retain data for a long time.

Configuration Example 6

Next, a semiconductor device of one embodiment of the present invention which has a circuit configuration different from those of the circuits HC in FIG. 1 and FIG. 4A to FIG. 8 is described.

Figure 9:
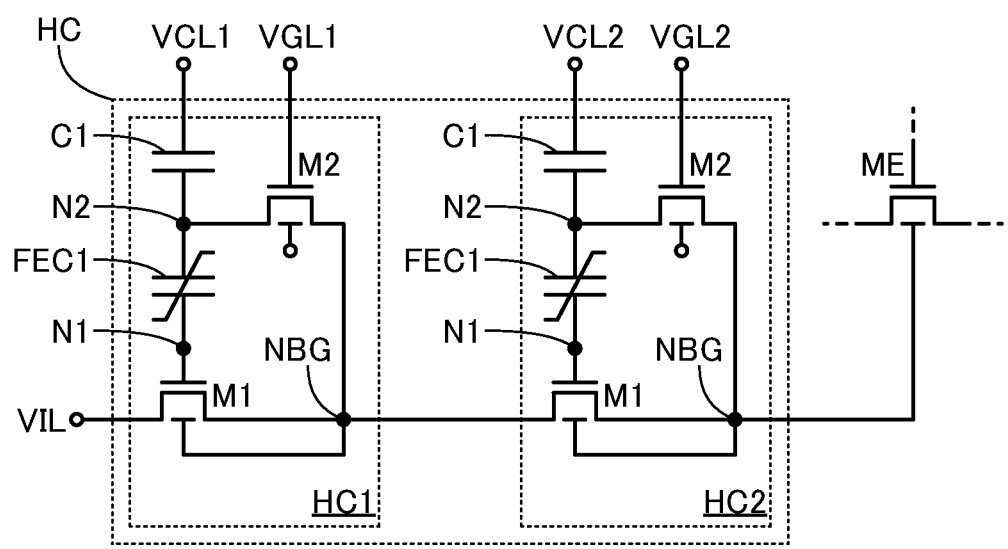
FIG. 9 is a circuit diagram illustrating a configuration example of a semiconductor device.

The circuit HC in FIG. 9 includes a circuit HC1 and a circuit HC2 which have a circuit configuration similar to that of the circuit HC in FIG. 1. In the circuit HC1, the first terminal of the transistor M1 is electrically connected to the wiring VIL, the second terminal of the capacitor C1 is electrically connected to a wiring VCL1, and the gate of the transistor M2 is electrically connected to a wiring VGL1. In the circuit HC2, the second terminal of the capacitor C1 is electrically connected to a wiring VCL2, the gate of the transistor M2 is electrically connected to a wiring VGL2, and the second terminal of the transistor M1, the back gate of the transistor M1, and the first terminal of the transistor M2 are electrically connected to the back gate of the transistor ME.

The circuit HC1 and the circuit HC2 are electrically connected in series. Specifically, the node NBG of the circuit HC1 is electrically connected to the first terminal of the transistor M1 in the circuit HC2.

In FIG. 9, the wiring VCL1 and the wiring VCL2 correspond to the wiring VCL in FIG. 1, and the wiring VGL1 and the wiring VGL2 correspond to the wiring VGL in FIG. 1.

The circuit HC1 and the circuit HC2, which have the circuit configuration similar to that of the circuit HC in FIG. 1, are electrically connected in series as illustrated in FIG. 9, whereby a source-drain voltage of each of the transistor M1 in the circuit HC1 and the transistor M1 in the circuit HC2 can be lower than a source-drain voltage of the transistor M1 in the circuit HC in FIG. 1. Accordingly, in the circuit HC in FIG. 9, drain current flowing through each of the transistor M1 in the circuit HC1 and the transistor M1 in the circuit HC2 can be reduced. That is, with the configuration of the circuit HC in FIG. 9, withstanding voltage between the wiring VIL and the transistor ME can be higher than that of the circuit HC in FIG. 1.

Note that although FIG. 9 illustrates the configuration in which two circuits each having the same circuit configuration as the circuit HC in FIG. 1 are connected in series, the semiconductor device of one embodiment of the present invention may have a configuration in which three or more circuits having the same circuit configuration as the circuit HC are connected in series.

With the use of the circuit HC described in any of Configuration example 1 to Configuration example 6, a negative potential applied to the back gate of the transistor ME can be retained for a long time.

Note that this embodiment can be combined with any of the other embodiments in this specification as appropriate.

Embodiment 2

In this embodiment, a memory device for which the circuit HC described in Embodiment 1 is used will be described.

Figure 10A:
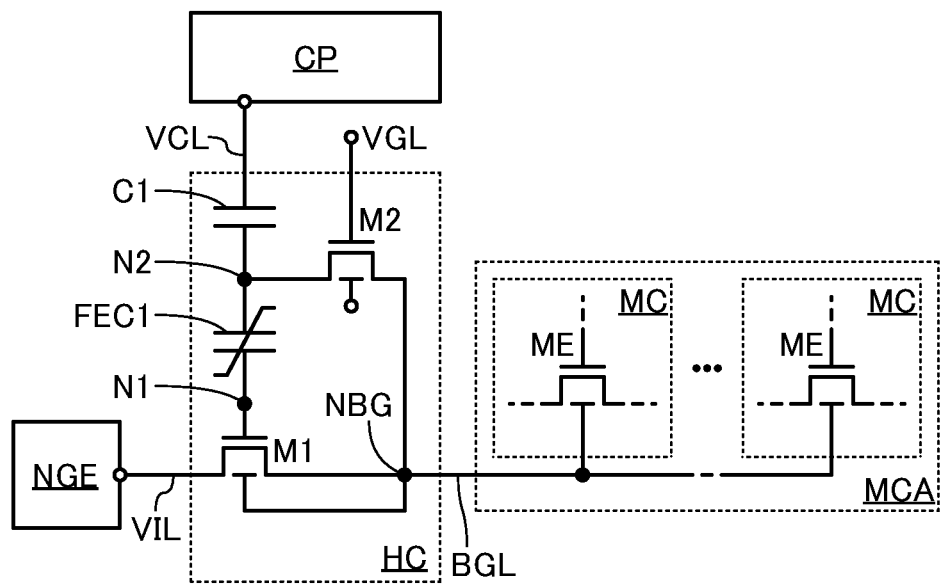
FIG. 10A and FIG. 10B are circuit diagrams each illustrating a configuration example of a semiconductor device.

FIG. 10A illustrates a circuit configuration of a memory device for which the circuit HC in FIG. 1 is used, as an example. In FIG. 10A, the memory device includes a memory cell array MCA, and the memory cell array MCA includes a plurality of memory cells MC. Each of the plurality of memory cells MC includes the transistor ME. Note that the transistor ME can be, for example, a writing transistor in the memory cell MC (a writing and reading transistor depending on the configuration of the memory cell MC).

In FIG. 10A, the back gate of the transistor ME in each of the plurality of memory cells MC is electrically connected to a wiring BGL. The wiring BGL is electrically connected to the second terminal of the transistor M1, the back gate of the transistor M1, and the first terminal of the transistor M2.

In FIG. 10A, the wiring VCL is electrically connected to a circuit CP. The wiring VIL is electrically connected to a negative voltage generation circuit NGE.

The circuit CP has a function of a voltage generation circuit. For example, voltage generated by the circuit CP can be a high-level potential, a low-level potential, a positive potential, a negative potential, or the like. The voltage generated by the circuit CP is input to the second terminal of the capacitor C1 in the circuit HC through the wiring VCL.

The negative voltage generation circuit NGE has a function of generating a negative voltage. The negative voltage generation circuit NGE generates a negative potential and supplies the negative potential to the first terminal of the transistor M1 in the circuit HC through the wiring VIL.

One or both of the circuit CP and the negative voltage generation circuit NGE may include a charge pump circuit capable of generating a negative potential, as an example.

Figure 10B:
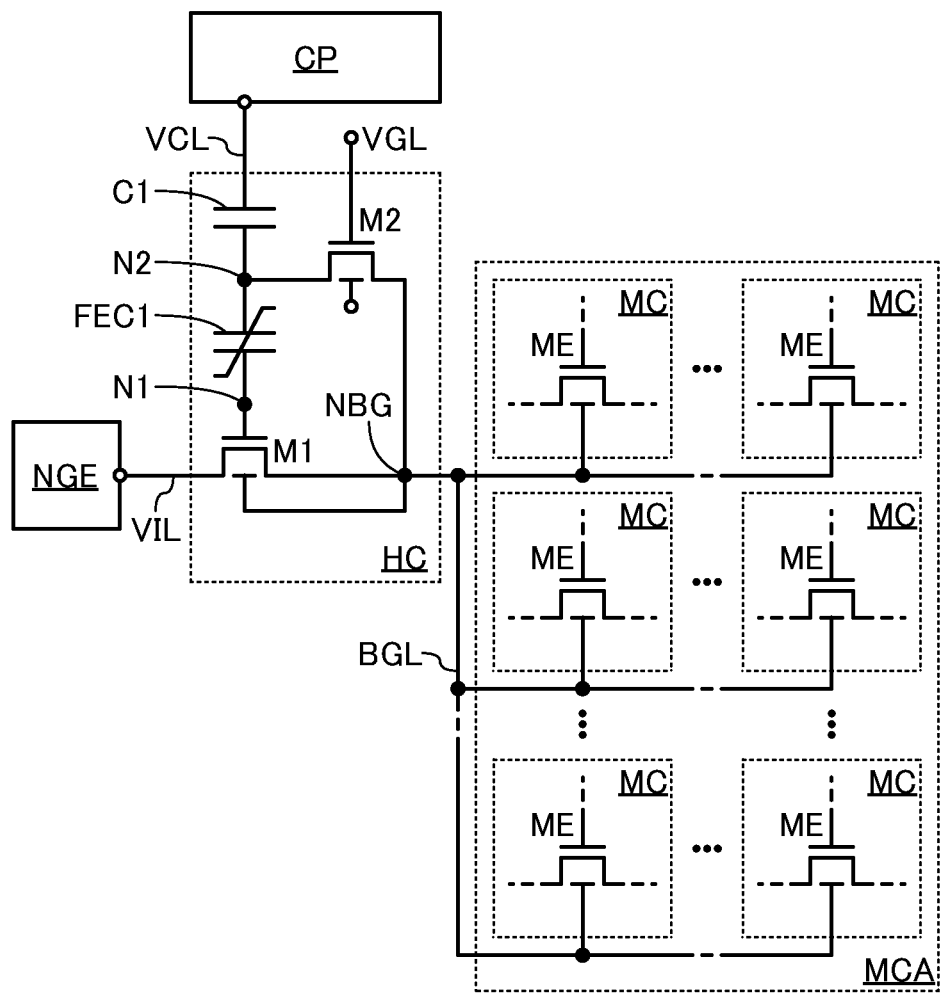

Note that although the memory cells MC electrically connected to the wiring BGL are the memory cells MC positioned in a certain row in the memory cell array MCA in FIG. 10A, the semiconductor device of one embodiment of the present invention is not limited to this configuration. For example, as illustrated in FIG. 10B, the wiring BGL may be extended to a plurality of rows in the memory cell array MCA, and may be electrically connected to the back gate of the transistor ME in each of the plurality of memory cells MC arranged in a matrix. With the configuration illustrated in FIG. 10B, the circuit HC does not need to be provided for each row; thus, the circuit area of the semiconductor device can be reduced.

Next, configuration examples of a memory cell that can be used as the memory cell MC is described.

Figure 11A:
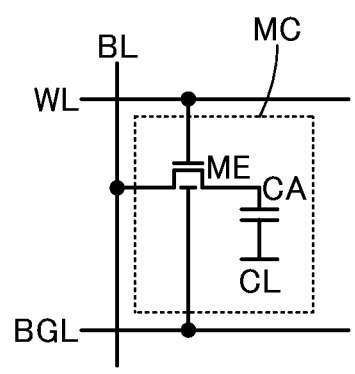
FIG. 11A and FIG. 11B are circuit diagrams each illustrating a configuration example of a circuit included in a semiconductor device.

FIG. 11A illustrates a configuration example of the memory cell MC that can be used as the memory cells MC in FIG. 10A and FIG. 10B. The memory cell MC in FIG. 11A is an example of a memory cell called a DRAM (Dynamic Random Access Memory), and includes the transistor ME and the capacitor CA. In particular, in this specification and the like, a DRAM including a memory cell including one OS transistor and one capacitor is referred to as a DOSRAM (Dynamic Oxide Semiconductor Random Access Memory) (registered trademark) in some cases.

A first terminal of the transistor ME is electrically connected to a first terminal of the capacitor CA, a second terminal of the transistor ME is electrically connected to a wiring BL, the gate of the transistor M1 is electrically connected to a wiring WL, and the back gate of the transistor ME is electrically connected to the wiring BGL. A second terminal of the capacitor CA is electrically connected to a wiring CL.

The wiring BL functions as a bit line, and the wiring WL functions as a word line. The wiring CL functions as a wiring for applying a predetermined potential to the second terminal of the capacitor CA. The potential can be, for example, a high-level potential, a low-level potential, the ground potential, or the like. The wiring BGL functions as a wiring for applying a predetermined potential to the back gate of the transistor ME. In particular, with the use of the circuit HC in FIG. 10A or FIG. 10B, a negative potential can be applied to the back gate of the transistor ME, the threshold voltage of the transistor ME can be high, and the transistor ME can operate in a normally-off state.

Note that in this specification and the like, "normally on" means a state where a channel exists without application of a voltage to a gate and a current flows through the transistor. Moreover, "normally off" means that a current per micrometer of channel width flowing through a transistor when a potential is not applied to a gate or the ground potential is supplied to the gate is lower than or equal to $1 \times 10^{-20}$ A at room temperature, lower than or equal to $1 \times 10^{-18}$ A at 85° C., or lower than or equal to $1 \times 10^{-16}$ A at 125° C.

When the potential supplied by the wiring CL is equal to the potential supplied by the wiring BGL, the wiring CL may be a wiring electrically connected to the wiring BGL.

Note that the directions in which the wiring BL and the wiring WL are extended are not limited to those illustrated in the circuit diagram of FIG. 11A; for example, the wiring BL may be extended in the horizontal directions on the drawing, and the wiring WL may be extended in the vertical directions on the drawing.

Figure 11B:
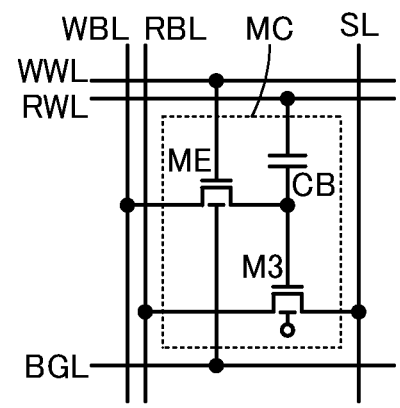

FIG. 11B illustrates a configuration example of the memory cell MC that can be used as the memory cells MC in FIG. 10A and FIG. 10B, which is different from FIG. 11A. The memory cell MC in FIG. 11B is a gain-cell memory cell in which an OS transistor is used as a transistor M3, and the memory cell MC in FIG. 11B includes the transistor ME, the transistor M3, and a capacitor CB. In this specification and the like, a memory device including the memory cell is referred to as a NOSRAM (Nonvolatile Oxide Semiconductor Random Access Memory) (registered trademark) in some cases.

Note that instead of an OS transistor, a transistor including silicon in a channel formation region (hereinafter referred to as a Si transistor) can be used as the transistor M3. As silicon, amorphous silicon (sometimes referred to as hydrogenated amorphous silicon), microcrystalline silicon, polycrystalline silicon, single crystal silicon, or the like can be used, for example. Furthermore, as the transistor M3, a transistor including Ge or the like in a channel formation region, a transistor including a compound semiconductor such as ZnSe, CdS, GaAs, InP, GaN, or SiGe in a channel formation region, a transistor including a carbon nanotube in a channel formation region, a transistor including an organic semiconductor in a channel formation region, or the like can be used, in addition to the OS transistor and the Si transistor.

The first terminal of the transistor ME is electrically connected to the first terminal of the capacitor CB and a gate of the transistor M3, the second terminal of the transistor ME is electrically connected to the wiring WBL, the gate of the transistor ME is electrically connected to a wiring WWL, and the back gate of the transistor ME is electrically connected to the wiring BGL. A second terminal of the capacitor CB is electrically connected to a wiring RWL. A first terminal of the transistor M3 is electrically connected to a wiring RBL, and a second terminal of the transistor M3 is electrically connected to a wiring SL.

The wiring WBL functions as a write bit line, the wiring RBL functions as a read bit line, the wiring WWL functions as a write word line, and the wiring RWL functions as a read word line. The wiring SL functions as a wiring for applying a predetermined potential to the second terminal of the transistor M3. The potential can be, for example, a low-level potential, the ground potential, or the like. The potential may be a high-level potential depending on circumstances. In the case where writing operation is performed, for example, the wiring RWL is set at a high-level potential and the wiring WWL is set at a high-level potential, and then the wiring WBL supplies data for writing, whereby the data can be written to a first terminal of the capacitor CB. After that, the wiring WWL is set at a low-level potential, whereby the data can be retained in the first terminal of the capacitor CB. After the wiring WWL is set at a low-level potential, the wiring RWL is preferably set at a low-level potential. In the case where reading operation is performed, for example, the wiring RBL is precharged to a high-level potential, and then the wiring RWL is set at a high-level potential, whereby the data retained in the first terminal of the capacitor CB can be read. At this time, the potential of the wiring RBL is determined depending on the data.

The above description of the wirings is just examples and the functions of the wirings can be changed as appropriate. For example, the wiring RWL may be a wiring to which a predetermined potential is applied and the wiring SL may be a wiring functioning as a read word line. In the case where writing operation is performed, for example, the wiring WBL supplies data for writing, whereby the data can be written to the first terminal of the capacitor CB. After that, the wiring WWL is set at a low-level potential, whereby the data can be retained in the first terminal of the capacitor CB. In the case where reading operation is performed, for example, the wiring RBL and the wiring SL are set at a high-level potential, whereby the wiring RBL is brought into an electrically floating state. After that, the wiring SL is set at a low-level potential, whereby the data retained in the first terminal of the capacitor CB can be read. At this time, the potential of the wiring RBL is determined depending on the data.

Furthermore, for example, the wiring WBL functioning as a write bit line and the wiring RBL functioning as a read bit wiring may be combined into one wiring.

Note that the directions in which the wiring WBL, the wiring RBL, the wiring WWL, the wiring RWL, and the wiring SL are extended are not limited to the circuit diagram of FIG. 11B; for example, at least one of the wiring WBL, the wiring RBL, and the wiring SL may be extended in the horizontal directions on the drawing, and the wiring WWL and/or the wiring RWL may be extended in the vertical directions on the drawing.

<Memory Device>

Next, memory devices which can include the memory cell in FIG. 11A or FIG. 11B are described.

Figure 12:
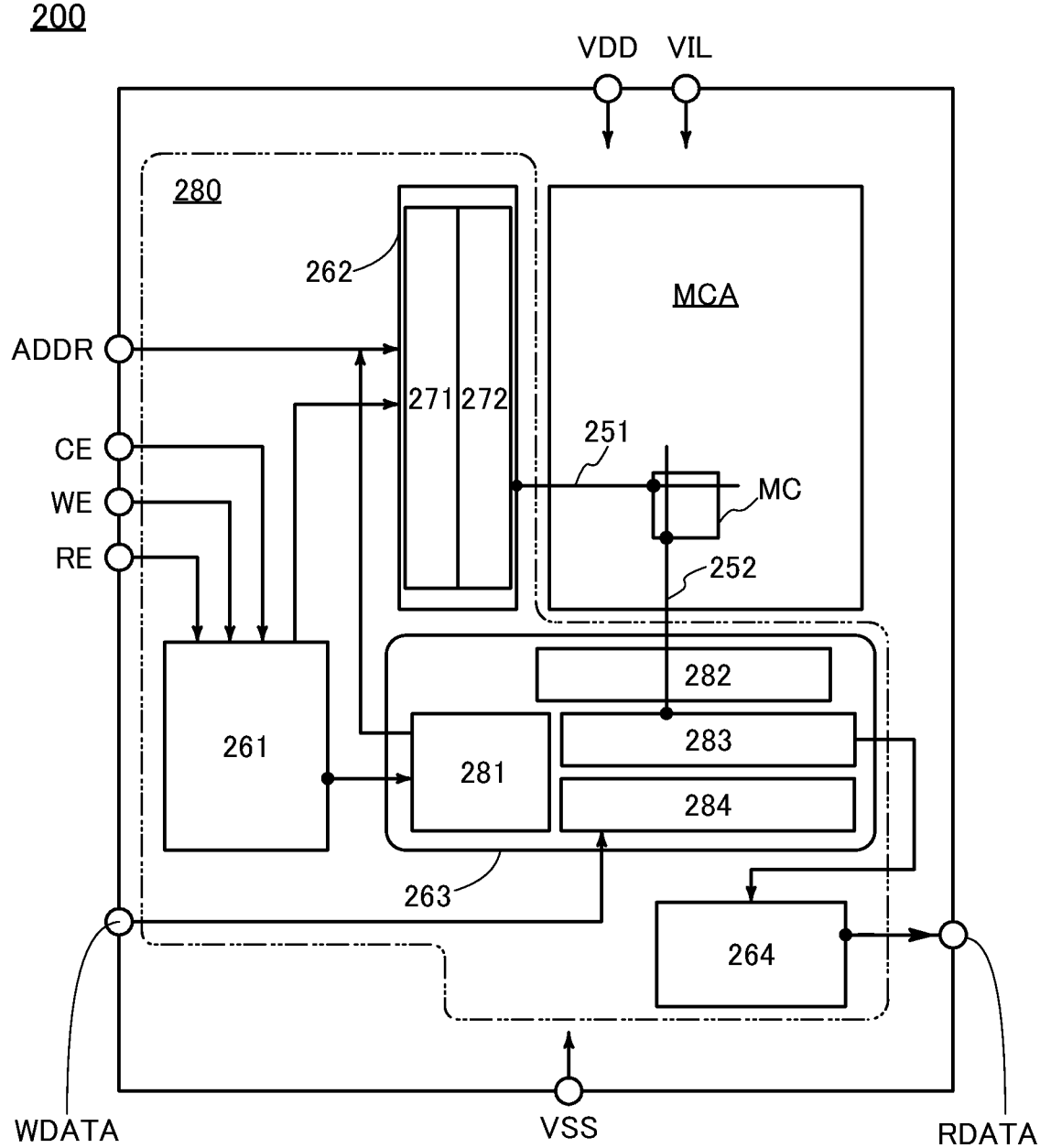
FIG. 12 is a block diagram illustrating a configuration example of a memory device including a semiconductor device.

FIG. 12 is a block diagram illustrating a configuration example of a semiconductor device functioning as a memory device. A semiconductor device 200 includes a peripheral circuit 280 and the memory cell array MCA. The peripheral circuit 280 includes a control logic circuit 261, a row driver circuit 262, a column driver circuit 263, and an output circuit 264.

A plurality of memory cells MC are arranged in a matrix in the memory cell array MCA. The row driver circuit 262 includes a row decoder 271 and a word line driver circuit 272. The column driver circuit 263 includes a column decoder 281, a precharge circuit 282, an amplifier circuit 283, and a write circuit 284.

In the memory cell array MCA, a wiring 251 is extended in the row direction and a wiring 252 is extended in the column direction. Note that although FIG. 12 illustrates one wiring 251 and one wiring 252, a plurality of wirings may be extended as the wiring 251 in the row direction of the memory cell array MCA, and a plurality of wirings may be extended as the wiring 252 in the column direction of the memory cell array MCA.

In the case where the memory cell MC in FIG. 12 is the memory cell MC in FIG. 11A, the wiring 251 can be, for example, the wiring WL and the wiring 252 can be, for example, the wiring BL.

In the case where the memory cell MC in FIG. 12 is the memory cell MC in FIG. 11B, the wiring 251 can be, for example, a group of wirings including the wiring WWL and the wiring RWL, and the wiring 252 can be, for example, a group of wirings including the wiring WBL and the wiring RBL.

Note that although FIG. 11A and FIG. 11B illustrate the wiring BGL extended in the row direction, the wiring BGL may be included in the wiring 251 or may be included in the wiring 252. That is, the circuit HC, the circuit CP, the negative voltage generation circuit NGE, and the like which are illustrated in FIG. 10A, FIG. 10B, and the like and electrically connected to the wiring BGL can be provided in the row driver circuit 262 or the column driver circuit 263 illustrated in FIG. 12.

The precharge circuit 282 has a function of precharging the wiring BL, the wiring RBL, or the like described above, for example. The precharge circuit 282 may include the circuit HC, the circuit CP, and the negative voltage generation circuit NGE illustrated in FIG. 10A and FIG. 10B. The amplifier circuit 283 has a function of amplifying a data signal read from the wiring BL, the wiring RBL, or the like, for example. The amplified data signal is output to the outside of the semiconductor device 200 as a digital data signal RDATA through the output circuit 264.

As power supply voltage from the outside, low power supply voltage (VSS), high power supply voltage (VDD) for the peripheral circuit 280, and high power supply voltage (VIL) for the memory cell array MCA are supplied to the semiconductor device 200.

Control signals (CE, WE, and RE), an address signal ADDR, and a data signal WDATA are also input to the semiconductor device 200 from the outside. The address signal ADDR is input to the row decoder 271 and the column decoder 281, and WDATA is input to the write circuit 284.

The control logic circuit 261 processes the signals (CE, WE, and RE) input from the outside, and generates control signals for the row decoder 271 and the column decoder 281. CE denotes a chip enable signal, WE denotes a write enable signal, and RE denotes a rea enable signal. The signals processed by the control logic circuit 261 are not limited thereto, and other control signals may be input as necessary. For example, a control signal for determining a defective bit may be input so that a defective bit may be identified with a data signal read from an address of a particular memory cell.

Note that whether each circuit or each signal described above is provided or not can be determined as appropriate as needed.

When the circuit HC described in Configuration example 1 to Configuration example 6 described in Embodiment 1 is used in the above memory device, a negative potential applied to the back gate of the transistor ME provided in the memory cell MC can be retained for a long time. Accordingly, the transistor ME can have a high threshold voltage and thus the transistor ME can have a low off-state current. Since the off-state current of the transistor ME is low, the number of refresh operations of data retained in the memory cell MC can be reduced.

Note that this embodiment can be combined with any of the other embodiments in this specification as appropriate.

Embodiment 3

This embodiment will describe structure examples of the semiconductor device described in the above embodiments and structure examples of transistors that can be used in the semiconductor device described in the above embodiments.

Structure Example 1 of Semiconductor Device

Figure 13:
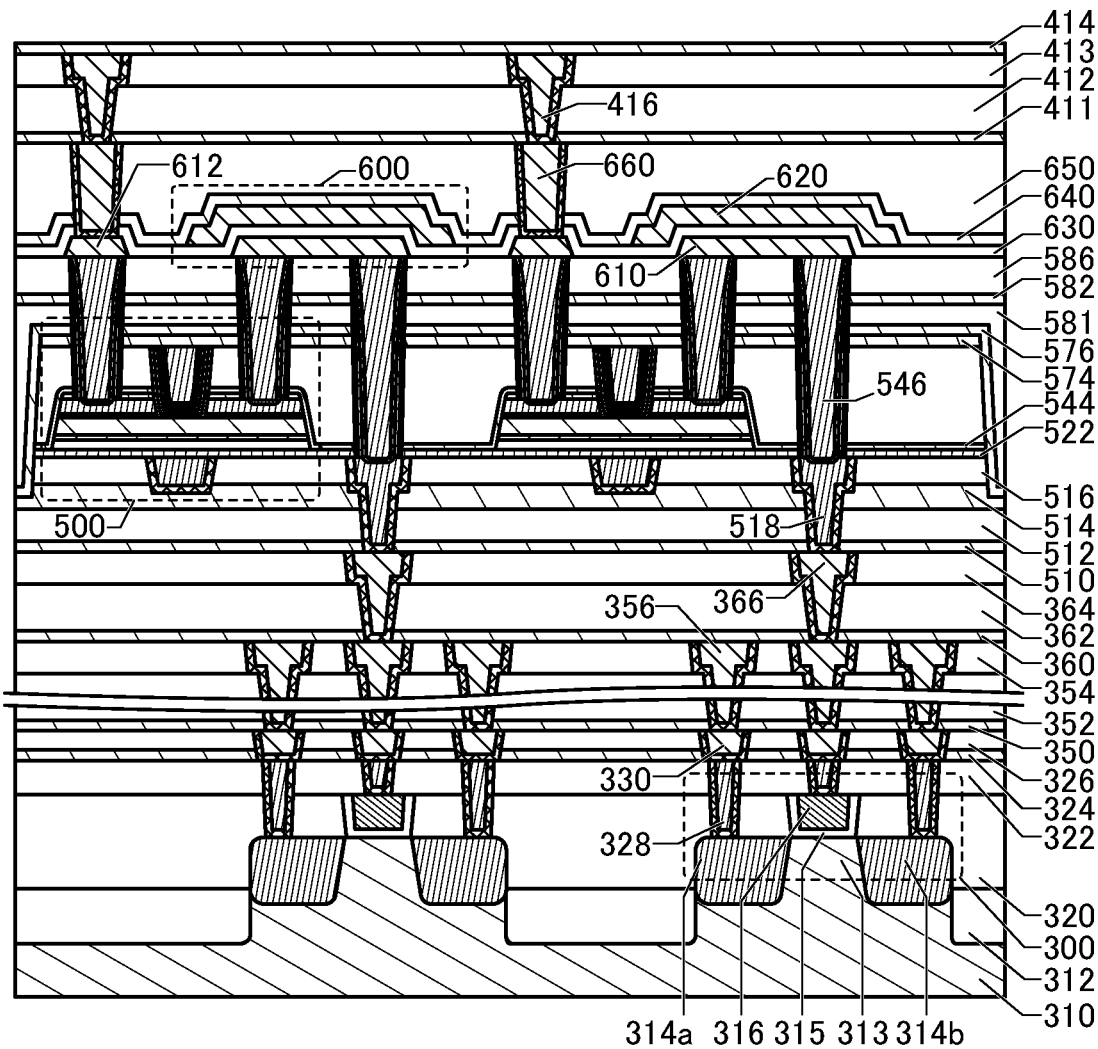
FIG. 13 is a schematic cross-sectional diagram illustrating a configuration example of a semiconductor device.
Figure 14A:
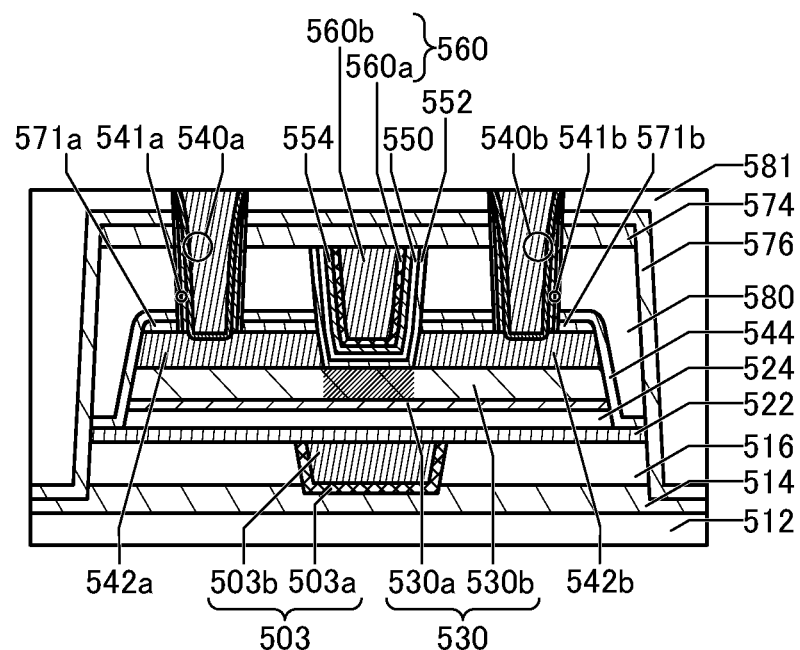
FIG. 14A to FIG. 14C are schematic cross-sectional diagrams illustrating a configuration example of a transistor.
Figure 14B:
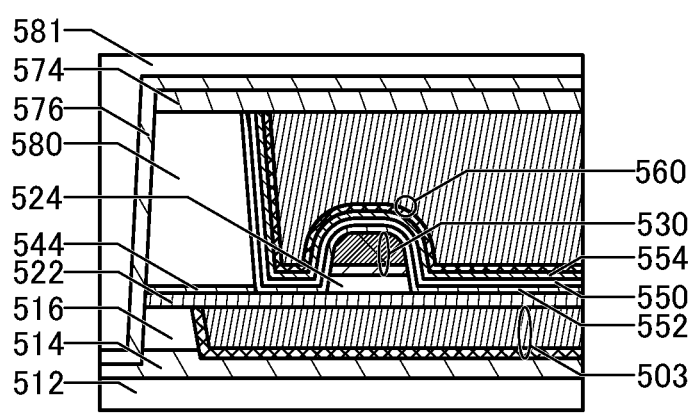
Figure 14C:
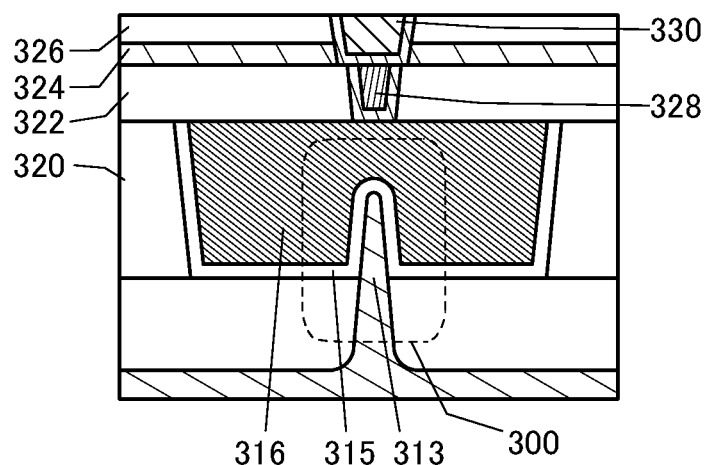

FIG. 13 illustrates the semiconductor device described in the above embodiment as an example, and the semiconductor device includes a transistor 300, a transistor 500, and a capacitor 600. FIG. 14A is a cross-sectional view of the transistor 500 in the channel length direction, FIG. 14B is a cross-sectional view of the transistor 500 in the channel width direction, and FIG. 14C is a cross-sectional view of the transistor 300 in the channel width direction.

The transistor 500 is a transistor including a metal oxide in a channel formation region (an OS transistor). The transistor 500 has features that the off-state current is low and that the field-effect mobility hardly changes even at high temperatures. When the transistor 500 is used as semiconductor devices, for example, the transistor M1 and the transistor M2 included in the circuit HC, the transistors ME included in the memory cells MC in FIG. 11A and FIG. 11B, the transistor M3 included in the memory cell MC in FIG. 11B, and the like described in the above embodiments, the semiconductor devices can have operating performance that hardly lowers even at high temperatures. In particular, when the transistor 500 is used as, for example, the transistor ME by utilizing the feature of a low off-state current, a potential written to a capacitor (the capacitor CA in FIG. 11A and the capacitor CB in FIG. 11B) in the memory cell MC can be retained for a long time.

The transistor 500 is provided above the transistor 300, for example, and the capacitor 600 is provided above the transistor 300 and the transistor 500, for example. Note that the capacitor 600 can be the capacitor C1, the capacitor C2, the capacitor CA, the capacitor CB, or the like described in the above embodiments. Note that depending on a circuit configuration, the capacitor 600 illustrated in FIG. 13 is not necessarily provided.

The transistor 300 is provided on a substrate 310 and includes an element isolation layer 312, a conductor 316, an insulator 315, a semiconductor region 313 that is part of the substrate 310, and a low-resistance region 314$a$ and a low-resistance region 314$b$ functioning as a source region and a drain region. Note that the transistor 300 can be used as, for example, the transistor M3 or the like. Note that FIG. 13 illustrates a structure in which a gate of the transistor 300 is electrically connected to one of a source and a drain of the transistor 500; however, depending on the structure of the semiconductor device of one embodiment of the present invention, it is possible to employ a structure in which one of a source and a drain of the transistor 300 is electrically connected to one of the source and the drain of the transistor 500, a structure in which one of the source and the drain of the transistor 300 is electrically connected to a gate of the transistor 500, or a structure in which each terminal of the transistor 300 is not electrically connected to each terminal of the transistor 500 or each terminal of the capacitor 600.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 14C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314$a$ and the low-resistance region 314$b$ functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314$a$ and the low-resistance region 314$b$ contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 15:
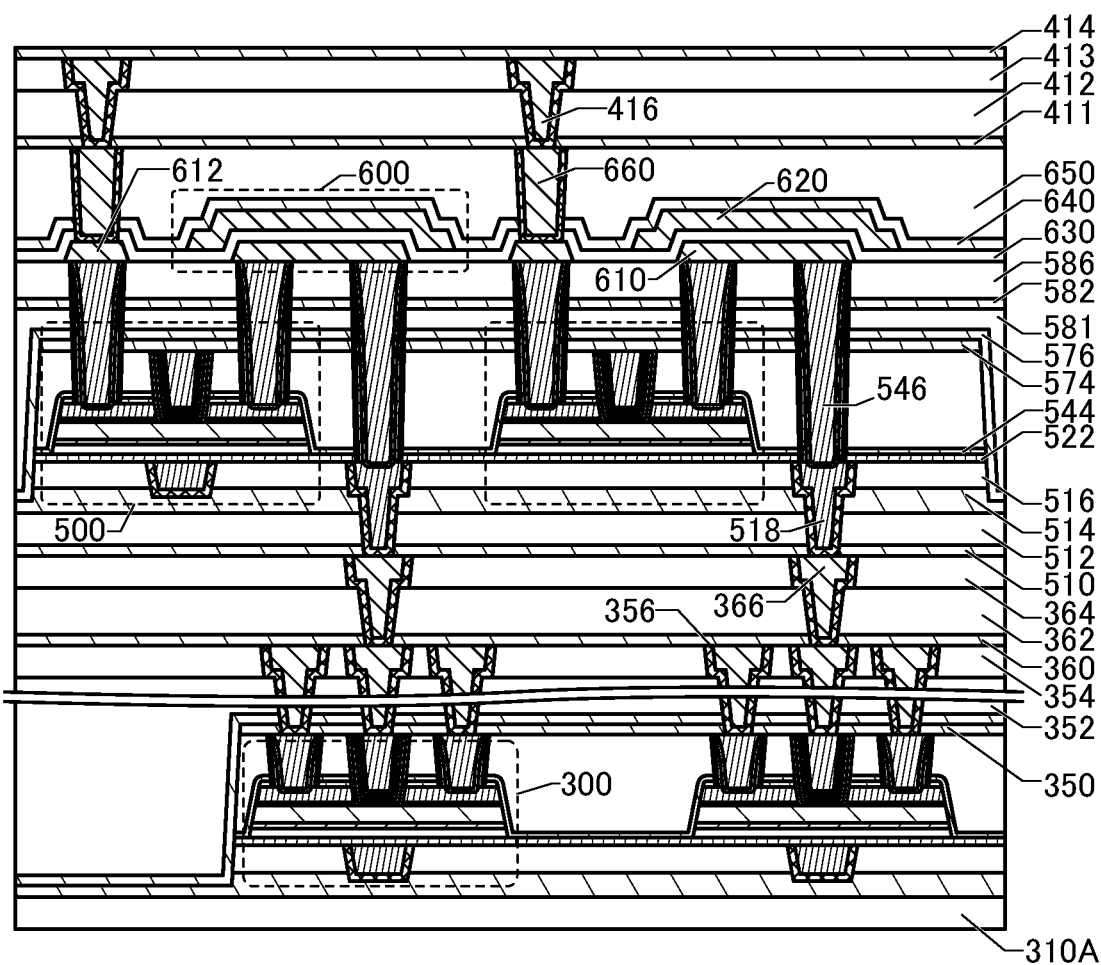
FIG. 15 is a schematic cross-sectional diagram illustrating a configuration example of a semiconductor device.

Note that the transistor 300 illustrated in FIG. 13 is an example and the structure is not limited thereto; an appropriate transistor is used in accordance with a circuit structure, a driving method, or the like. For example, the transistor 300 may have a planar structure instead of a FIN-type structure illustrated in FIG. 14C. For example, when a semiconductor device is configured as a single-polarity circuit using only OS transistors, the transistor 300 can have a structure similar to that of the transistor 500 using an oxide semiconductor, as illustrated in FIG. 15. Note that the details of the transistor 500 will be described later. In this specification and the like, a single-polarity circuit refers to a circuit including only either n-channel transistors or p-channel transistors.

Note that in FIG. 15, the transistor 300 is provided over a substrate 310A; in this case, a semiconductor substrate may be used as the substrate 310A, as in the case of the substrate 310 in the semiconductor device in FIG. 13. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 13, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 13, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is provided in regions of the insulator 360, the insulator 362, and the insulator 364 that overlap with part of the conductor 356, and the conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the fabrication process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor included in the conductor 518 and the transistor 500 (e.g., a conductor 503 illustrated in FIG. 14A and FIG. 14B) and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water; hence, diffusion of hydrogen from the transistor 300 into the transistor 500 can be inhibited.

The transistor 500 is provided above the insulator 516.

As illustrated in FIG. 14A and FIG. 14B, the transistor 500 includes the insulator 516 over the insulator 514, the conductor 503 (a conductor 503a and a conductor 503b) embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) being positioned over the insulator 554 and overlapping with part of the oxide 530b, and an insulator 544 over the insulator 522, the insulator 524, the oxide 530a, the oxide 530b, the conductor 542a, the conductor 542b, the insulator 571a, and the insulator 571b. An insulator 580 is positioned over the insulator 544. Here, as illustrated in FIG. 14A and FIG. 14B, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of the insulator 580, and a bottom surface of the insulator 550. A top surface of the conductor 560 is placed to be substantially level with an upper portion of the insulator 554, an upper portion of the insulator 550, an upper portion of the insulator 552, and a top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580. An insulator 576 is positioned on an upper portion and a side surface of the insulator 574, the side surface of the insulator 580, the side surface of the insulator 544, a side surface of the insulator 522, a side surface of the insulator 516, and a side surface and a top surface of the insulator 514. An insulator 581 is positioned on atop surface of the insulator 576.

An opening reaching the oxide 530*b* is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542*a* and the conductor 542*b* and between the insulator 571*a* and the insulator 571*b* in the channel length direction of the transistor 500. The insulator 554 includes a region in contact with the side surface of the conductor 560 and a region in contact with the bottom surface of the conductor 560.

The oxide 530 preferably includes the oxide 530*a* provided over the insulator 524 and the oxide 530*b* provided over the oxide 530*a*. Including the oxide 530*a* under the oxide 530*b* makes it possible to inhibit diffusion of impurities into the oxide 530*b* from components formed below the oxide 530*a*.

Although a structure in which two layers, the oxide 530*a* and the oxide 530*b*, are stacked as the oxide 530 in the transistor 500 is described, the present invention is not limited thereto. For example, the transistor 500 can include a single-layer structure of the oxide 530*b* or a stacked-layer structure of three or more layers. Alternatively, the oxide 530*a* and the oxide 530*b* can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542*a* functions as one of a source and a drain, and the conductor 542*b* functions as the other of the source and the drain. At least part of a region of the oxide 530 that overlaps with the conductor 560 functions as a channel formation region.

Figure 16A:
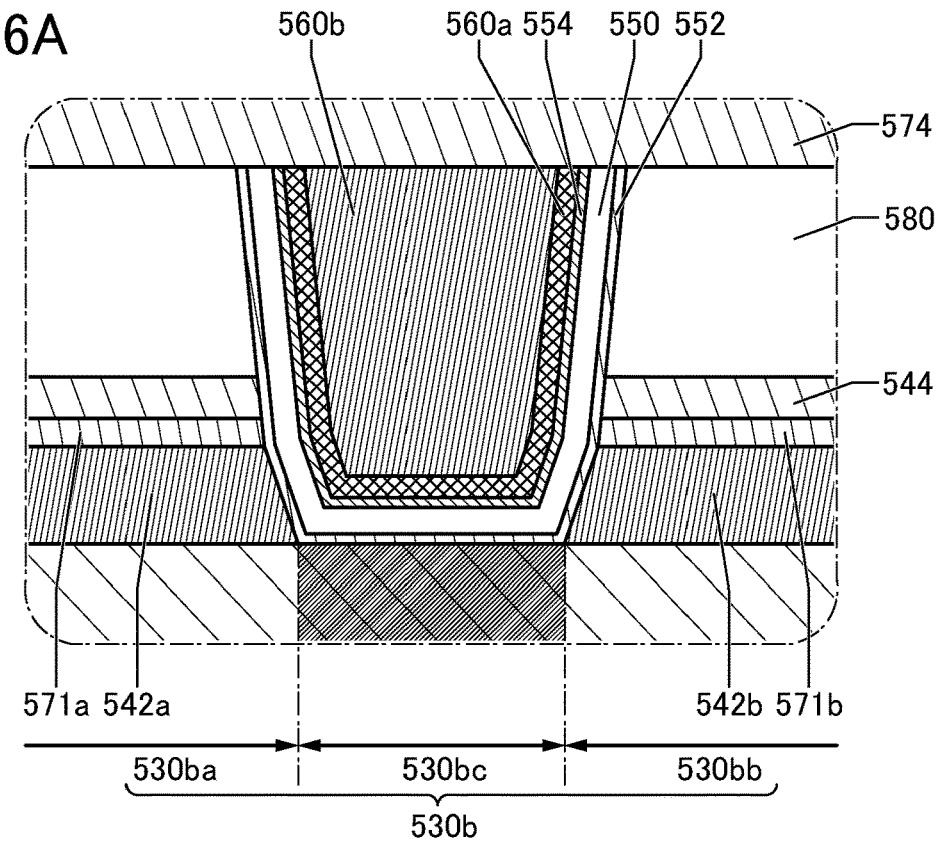
FIG. 16A and FIG. 16B are schematic cross-sectional diagrams each illustrating a configuration example of a transistor.

Here, FIG. 16A is an enlarged view of the vicinity of the channel formation region in FIG. 14A. Supply of oxygen to the oxide 530*b* forms the channel formation region in a region between the conductor 542*a* and the conductor 542*b*. As illustrated in FIG. 16A, the oxide 530*b* includes a region 530*bc* functioning as the channel formation region of the transistor 500 and a region 530*ba* and a region 530*bb* that are provided to sandwich the region 530*bc* and function as a source region and a drain region. At least part of the region 530*bc* overlaps with the conductor 560. In other words, the region 530*bc* is provided between the conductor 542*a* and the conductor 542*b*. The region 530*ba* is provided to overlap with the conductor 542*a*, and the region 530*bb* is provided to overlap with the conductor 542*b*.

The region 530*bc* functioning as the channel formation region has a smaller amount of oxygen vacancies (an oxygen vacancy in a metal oxide is sometimes referred to as $V_O$ in this specification and the like) or a lower impurity concentration than the region 530*ba* and the region 530*bb* to be a high-resistance region having a low carrier concentration. Thus, the region 530*bc* can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_O H$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_O H$ are preferably reduced as much as possible in the region of the oxide semiconductor where a channel is formed.

The region 530*ba* and the region 530*bb* functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530*ba* and the region 530*bb* are each an n-type region having a higher carrier concentration and a lower resistance than the region 530*bc*.

The carrier concentration in the region 530*bc* functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530*bc* functioning as the channel formation region is not particularly limited and can be, for example, $1 \times 10^{-9}$ cm$^{-3}$.

Between the region 530*bc* and the region 530*ba* or the region 530*bb*, a region having a carrier concentration that is lower than or substantially equal to the carrier concentrations in the region 530*ba* and the region 530*bb* and higher than or substantially equal to the carrier concentration in the region 530*bc* may be formed. That is, the region functions as a junction region between the region 530*bc* and the region 530*ba* or the region 530*bb*. The hydrogen concentration in the junction region is lower than or substantially equal to the hydrogen concentrations in the region 530*ba* and the region 530*bb* and higher than or substantially equal to the hydrogen concentration in the region 530*bc* in some cases. The amount of oxygen vacancies in the junction region is smaller than or substantially equal to the amounts of oxygen vacancies in the region 530*ba* and the region 530*bb* and larger than or substantially equal to the amount of oxygen vacancies in the region 530*bc* in some cases.

Although FIG. 16A illustrates an example in which the region 530*ba*, the region 530*bb*, and the region 530*bc* are formed in the oxide 530*b*, the present invention is not limited thereto. For example, the above regions may be formed not only in the oxide 530*b* but also in the oxide 530*a*.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., 400° C. to 600° C. inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and $V_OH$ in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and $V_OH$ in the region 530bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, $V_OH$ in the region 530bc can be cut; thus, hydrogen H can be removed from the region 530bc and an oxygen vacancy $V_O$ can be filled with oxygen. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b and the conductor 542. Hence, a reduction in $V_OH$ and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with the side surface of the conductor 542 and the surface of the region 530bc, thereby preventing oxygen more than necessary from being supplied to the region 530bc and preventing the side surface of the conductor 542 from being oxidized. Furthermore, the side surface of the conductor 542 can be inhibited from being oxidized when an insulating film to be the insulator 550 is formed.

The oxygen supplied into the region 530bc has any of a variety of forms such as an oxygen atom, an oxygen molecule, and an oxygen radical (an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_O H$ can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the n-type can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 14B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 14A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be fabricated.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ Ωcm, the insulator 512, the insulator 544, and the insulator 576 can sometimes reduce charge up of the conductor 503, the conductor 542, the conductor 560, or the like in treatment using plasma or the like in the fabrication process of a semiconductor device. The resistivities of the insulator 512, the insulator 544, and the insulator 576 are preferably higher than or equal to $1 \times 10^{10}$ Ωcm and lower than or equal to $1 \times 10^{15}$ Ωcm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503*a* and the conductor 503*b*. The conductor 503*a* is provided in contact with a bottom surface and a sidewall of the opening. The conductor 503*b* is provided to be embedded in a recessed portion formed in the conductor 503*a*. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 14B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 14B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a fabrication process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be fabricated.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. For example, an insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 14B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_OH$ formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 14A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that the above-described lower limits and upper limits can be combined with each other. In that case, at least part of the insulator 550 includes a region having the above-described thickness.

Although FIG. 14A, FIG. 14B, and the like illustrate a single-layer structure of the insulator 550, the present invention is not limited to this structure, and a stacked-layer structure of two or more layers may be employed. For example, as illustrated in FIG. 16B, the insulator 550 may have a stacked-layer structure including two layers of an insulator 550a and an insulator 550b over the insulator 550a.

Figure 16B:
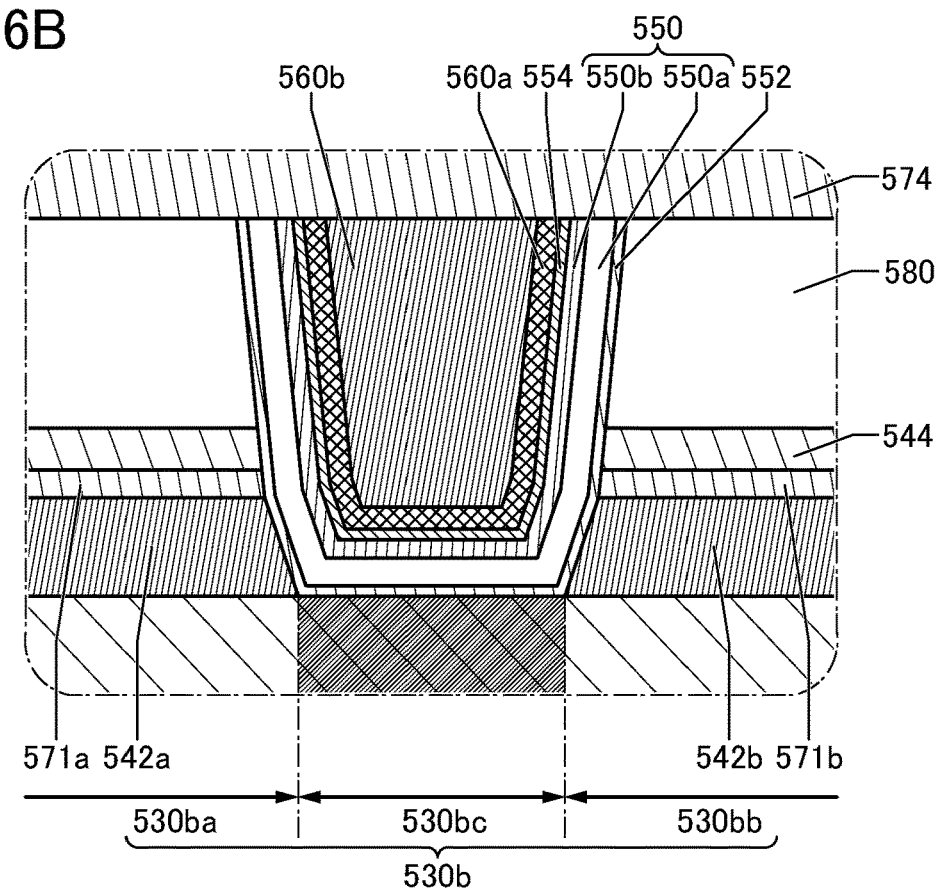

In the case where the insulator 550 has a stacked-layer structure of two layers as illustrated in FIG. 16B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 14A and FIG. 14B, the upper portion of the conductor 560 is substantially level with the upper portion of the insulator 550. Note that although the conductor 560 has a two-layer structure of the conductor 560a and the conductor 560b in FIG. 14A and FIG. 14B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 14B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 14A and in an insulator 582 and an insulator 586 illustrated in FIG. 13 in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 14A and in the insulator 582 and the insulator 586 illustrated in FIG. 13 in the region overlapping with the conductor 542b, and the conductor 540b is provided inside the opening portion. Note that the insulator 582 and the insulator 586 will be described later.

As illustrated in FIG. 14A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as the insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 14A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 13, a conductor 610, a conductor 612, and the like serving as wirings may be provided in contact with the upper portion of the conductor 540a and the upper portion of the conductor 540b. For the conductor 610 and the conductor 612, a conductive material containing tungsten, copper, or aluminum as its main component is preferably used. The conductors can each have a stacked-layer structure. Specifically, the conductors may each be a stack of titanium or titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 13, FIG. 14A, FIG. 14B, and FIG. 15. The structure of the transistor included in the semiconductor device of one embodiment of the present invention may be changed in accordance with circumstances.

Figure 17:
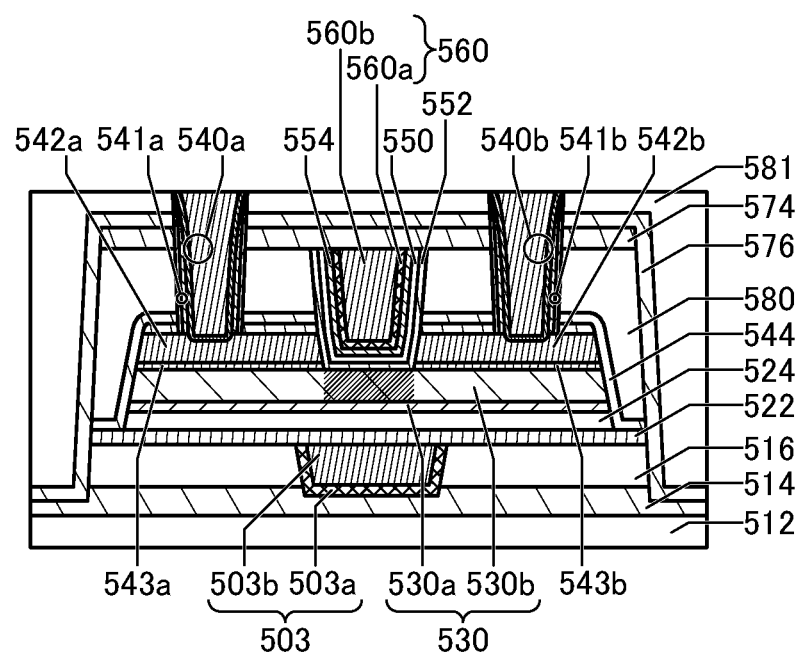
FIG. 17 is a schematic cross-sectional diagram illustrating a configuration example of a transistor.

For example, the transistor 500 illustrated in FIG. 13, FIG. 14A, FIG. 14B, and FIG. 15 may have a structure illustrated in FIG. 17. The transistor in FIG. 17 is different from the transistor 500 illustrated in FIG. 13, FIG. 14A, FIG. 14B, and FIG. 15 in including an oxide 543a and an oxide 543b. Note that in this specification and the like, the oxide 543a and the oxide 543b are collectively referred to as an oxide 543. The cross section in the channel width direction of the transistor in FIG. 17 can have a structure similar to the cross section of the transistor 500 illustrated in FIG. 14B.

The oxide 543a is provided between the oxide 530b and the conductor 542a, and the oxide 543b is provided between the oxide 530b and the conductor 542b. Here, the oxide 543a is preferably in contact with the top surface of the oxide 530b and the bottom surface of the conductor 542a. The oxide 543b is preferably in contact with the top surface of the oxide 530b and the bottom surface of the conductor 542b.

The oxide 543 preferably has a function of inhibiting passage of oxygen. The oxide 543 having a function of inhibiting passage of oxygen is preferably provided between the oxide 530b and the conductor 542 functioning as the source electrode or the drain electrode, in which case the electric resistance between the conductor 542 and the oxide 530b can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530b. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582. A substance having a barrier property against oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 13 and FIG. 15 will be described. Note that the capacitor 600 and the wiring and/or the plug are provided above the transistor 500 illustrated in FIG. 13 and FIG. 15.

The capacitor 600 includes the conductor 610, a conductor 620, and an insulator 630, for example.

The conductor 610 is provided over a conductor 546, the insulator 586, and one of the conductor 540a and the conductor 540b. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like that electrically connects the transistor 500 to a circuit element, a wiring, and the like provided above the transistor 500.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 13; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate (SrTiO₃), or (Ba,Sr)TiO₃ (BST) may be used as the insulator 630. For the insulator 630, a compound containing hafnium and zirconium may be used, for example. As scaling down and high integration of semiconductor devices progress, a problem such as leakage current from a transistor, a capacitor, and the like might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

The conductor 620 is provided to overlap with the conductor 610 with the insulator 630 therebetween. The conductor 610 has a function of one of the pair of electrodes of the capacitor 600.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents hydrogen, impurities, or the like from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials that can be used for the insulator 324, for example.

Although the capacitor 600 illustrated in FIG. 13 and FIG. 15 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 13, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are each preferably formed using an insulator having a barrier property against impurities such as water and hydrogen, for example. Thus, the insulator 411 and the insulator 414 can be formed using any of the materials that can be used for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

<Structure Examples of Transistor and Ferroelectric Capacitor>

Next, a structure will be described in which a dielectric that can have ferroelectricity is provided in and around the transistor 500 including a metal oxide in its channel formation region.

Figure 18A:
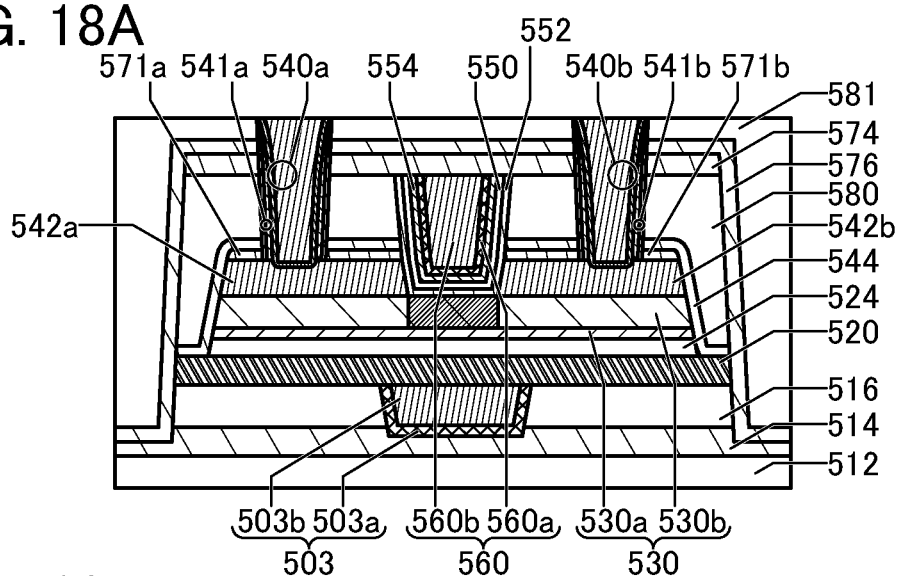
FIG. 18A to FIG. 18C are schematic cross-sectional diagrams each illustrating a configuration example of a transistor.

FIG. 18A illustrates an example of a transistor structure in which a dielectric that can have ferroelectricity is provided in the transistor 500 in FIG. 13, FIG. 14A, or the like.

The transistor illustrated in FIG. 18A has a structure in which the insulator 522 functioning as the second gate insulator is replaced with an insulator 520. As the insulator 520, a dielectric that can have ferroelectricity can be used, for example.

Accordingly, in the transistor in FIG. 18A, a ferroelectric capacitor can be provided between the conductor 503 functioning as the second gate electrode and the oxide 530. In other words, the transistor in FIG. 18A can be an FeFET (Ferroelectric FET) in which part of the second gate insulator is provided with a dielectric that can show ferroelectricity.

Examples of the material that can have ferroelectricity include hafnium oxide, zirconium oxide, HfZrOx (X is a real number greater than 0), a material obtained by adding the element J1 (the element J1 here is zirconium (Zr), silicon (Si), aluminum (Al), gadolinium (Gd), yttrium (Y), lanthanum (La), strontium (Sr), or the like) to hafnium oxide, and a material obtained by adding the element J2 (the element J2 here is hafnium (Hf), silicon (Si), aluminum (Al), gadolinium (Gd), yttrium (Y), lanthanum (La), strontium (Sr), or the like) to zirconium oxide. As the material that can have ferroelectricity, piezoelectric ceramic having a perovskite structure, such as PbTiOx, barium strontium titanate (BST), strontium titanate, lead zirconate titanate (PZT), strontium bismuth tantalate (SBT), bismuth ferrite (BFO), or barium titanate may be used. The material that can have ferroelectricity can be, for example, a mixture or a compound selected from the above-listed materials. Alternatively, the material that can have ferroelectricity can be a stacked-layer structure of a plurality of materials selected from the above-listed materials. Note that each of hafnium oxide, zirconium oxide, HfZrOx, the material obtained by adding the element J1 to hafnium oxide, and the like possibly changes its crystal structure (characteristics) depending not only on the deposition condition but also on a variety of processes or the like; thus, a material that exhibits ferroelectricity is referred to not only as a ferroelectric but also as a material that can show ferroelectricity or a material that shows ferroelectricity in this specification and the like.

As the material that can have ferroelectricity, hafnium oxide or a material containing hafnium oxide and zirconium oxide is particularly preferable because it can have ferroelectricity even when being processed into a thin film of several nanometers. Here, the thickness of the insulator 520 can be less than or equal to 100 nm, preferably less than or equal to 50 nm, further preferably less than or equal to 20 nm, still further preferably less than or equal to 10 nm. With the use of a ferroelectric layer having a thin film form, a ferroelectric capacitor can be combined with the miniaturized transistor 500 to form a semiconductor device.

Figure 18B:
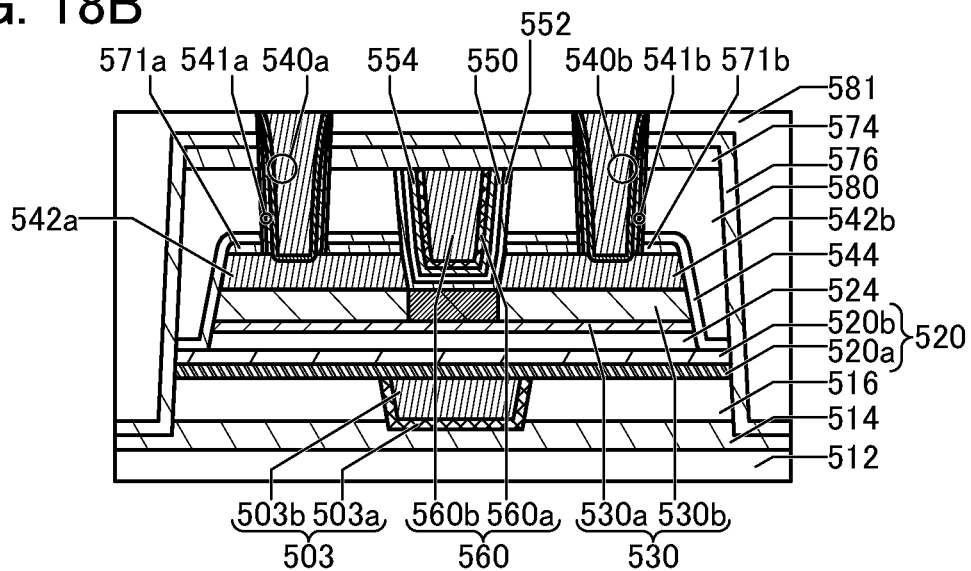

Although the insulator 520 is illustrated as a single layer in FIG. 18A, the insulator 520 may be an insulating film including two or more layers including a dielectric that can have ferroelectricity. FIG. 18B illustrates a specific example of the transistor including such an insulator 520. In FIG. 18B, the insulator 520 includes an insulator 520a and an insulator 520b. The insulator 520a is provided over a top surface of each of the insulator 516 and the conductor 503, and the insulator 520b is provided over a top surface of the insulator 520a.

For the insulator 520a, a dielectric that can have ferroelectricity can be used, for example. For the insulator 520b, silicon oxide can be used, for example. Alternatively, silicon oxide may be used for the insulator 520a and a dielectric that can have ferroelectricity may be used for the insulator 520b.

When the insulator 520 includes two layers as illustrated in FIG. 18B, one of the layers is provided with a dielectric that can have ferroelectricity and the other is provided with silicon oxide, a leakage current flowing between the conductor 503 functioning as a gate electrode and the oxide 530 can be inhibited.

Figure 18C:
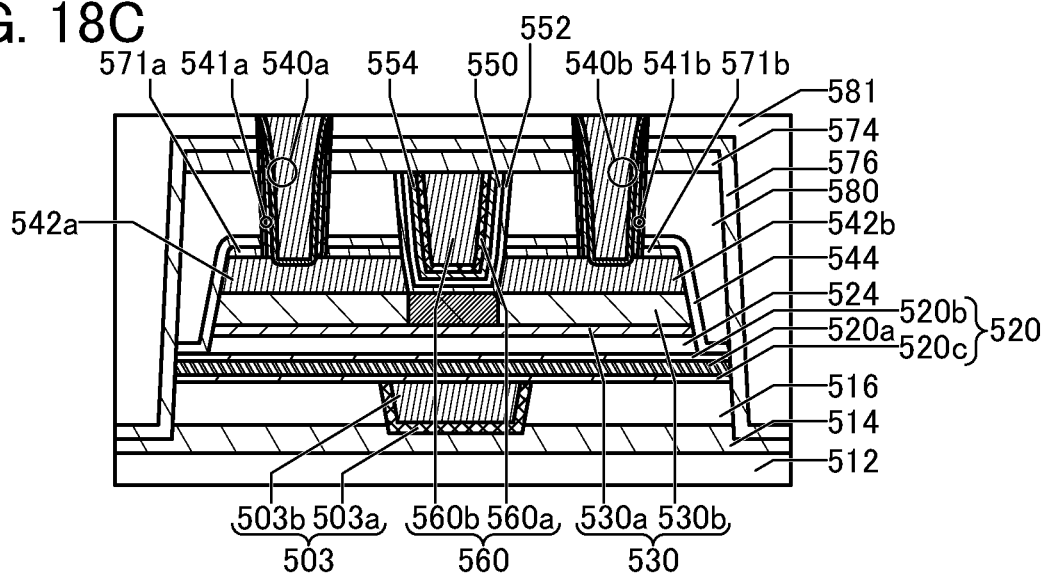

FIG. 18C illustrates a structure example of a transistor in which the insulator 520 includes three layers. In FIG. 18C, the insulator 520 includes the insulator 520a, the insulator 520b, and an insulator 520c, for example. The insulator 520c is provided over a top surface of each of the insulator 516 and the conductor 503, the insulator 520a is provided over a top surface of the insulator 520c, and the insulator 520b is provided over atop surface of the insulator 520a.

For the insulator 520a, a dielectric that can have ferroelectricity can be used, for example. For the insulator 520b and the insulator 520c, silicon oxide can be used, for example.

Figure 1B:
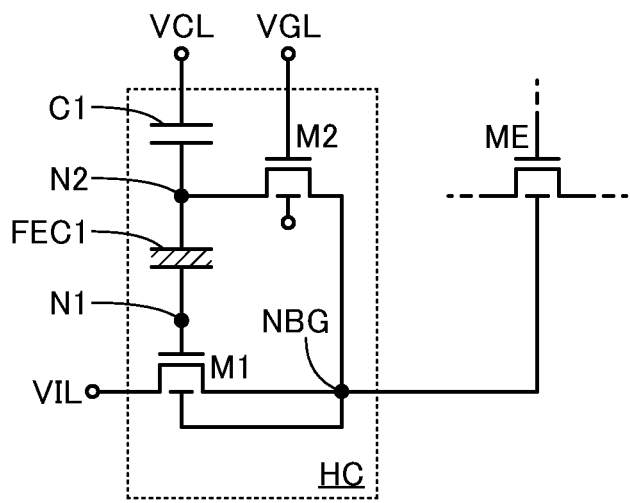

The structures of the transistors and the ferroelectric capacitors illustrated in FIG. 18A to FIG. 18C can be used for, for example, the transistor M1, the capacitor FEC1, and the like illustrated in FIG. 1A, FIG. 1B, and the like described in Embodiment 1. Any of the transistors in FIG. 18A to FIG. 18C may be an FeFET, and used as the transistor FEM in FIG. 8B.

Figure 19:
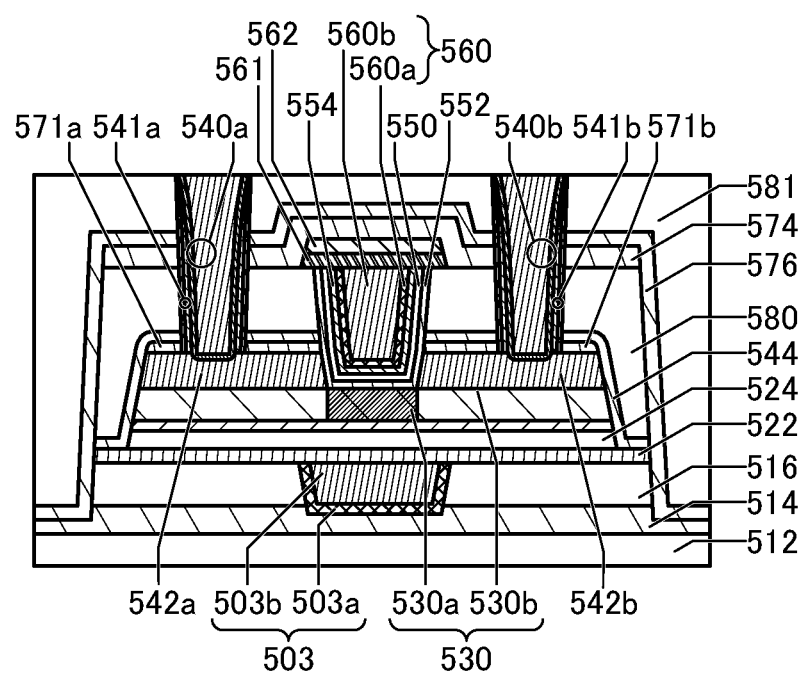
FIG. 19 is a schematic cross-sectional diagram illustrating a configuration example of a transistor.

FIG. 19 illustrates an example of a transistor structure, which is different from the transistors in FIG. 18A to FIG. 18C, in which a dielectric that can have ferroelectricity is provided in the transistor 500 in FIG. 13, FIG. 14A, or the like.

FIG. 19 illustrates a structure example of a transistor in which a dielectric that can show ferroelectricity is provide over the insulator 552, the insulator 550, and the insulator 554 functioning as the first gate insulator, the conductor 560 functioning as the first gate electrode, and a region of the insulator 580.

Specifically, an insulator 561 is provided to be in contact with the insulator 552, the insulator 550, the insulator 554, the conductor 560, and a region of the insulator 580. For the insulator 561, the dielectric that can show ferroelectricity applicable to the insulator 520 in FIG. 18A can be used, for example.

A conductor 562 is provided over and in contact with the insulator 561. The conductor 562 can be provided using a material similar to those for the conductor 328 and the conductor 330, for example.

Owing to the transistor structure illustrated in FIG. 19, a ferroelectric capacitor can be provided between the conductor 503 functioning as the first gate electrode and the conductor 562.

Note that the insulator 561 may have a stacked-layer structure of two or more layers like the insulator 520 illustrated in FIG. 18B or FIG. 18C.

The structures of the transistor and the ferroelectric capacitor illustrated in FIG. 19 can be applied to the transistor M1 and the capacitor FEC1 which are illustrated in FIG. TA, FIG. 1B, and the like and described in Embodiment 1, for example.

Figure 20A:
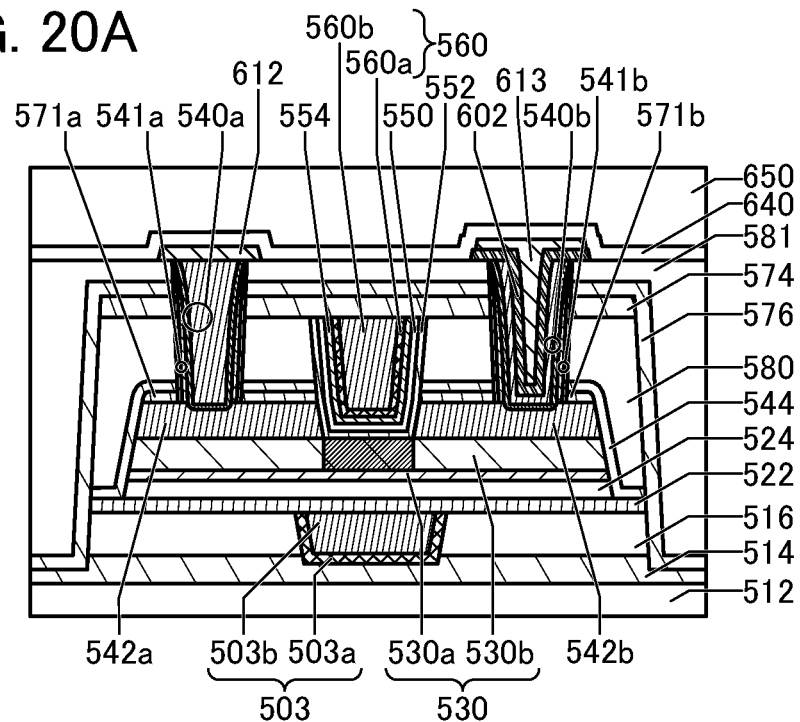
FIG. 20A and FIG. 20B are schematic cross-sectional diagrams each illustrating a configuration example of a transistor.

FIG. 20A illustrates a structure example of a transistor, which is different from the transistors illustrated in FIG. 18A to FIG. 18C and FIG. 19, in which a dielectric that can show ferroelectricity is provided in the structure of the transistor 500 illustrated in FIG. 13, FIG. 14A, and the like.

In the transistor illustrated in FIG. 20A, an insulator 602 is provided in an opening portion provided in the insulator 544, the insulator 571b, the insulator 580, the insulator 574, the insulator 576, and the insulator 581 in a region overlapping with the conductor 542b. Specifically, in the opening portion, the insulator 541b is provided on a side surface of the opening portion, the conductor 540b is provided over the insulator 541b and the conductor 542b which is a bottom portion of the opening portion, the insulator 602 is provided over the conductor 540b and a region of the insulator 581, and a conductor 613 is provided over the insulator 602 to fill the rest of the opening portion.

As another specific example, in the opening portion, the insulator 541b may be provided on the side surface of the opening portion; the conductor 540b may be provide over the insulator 541b; the insulator 602 may be provided over the conductor 540b, a region of the insulator 581, and the conductor 542b which is the bottom portion of the opening portion; and the conductor 613 may be provided over the insulator 602 to fill the rest of the opening portion.

For the insulator 602, the dielectric that can show ferroelectricity applicable to the insulator 520 in FIG. 18A can be used, for example.

The conductor 613 can be provided using a material similar to those for the conductor 328 and the conductor 330, for example.

Owing to the transistor structure illustrated in FIG. 20A, a ferroelectric capacitor can be provided between the conductor 540b and the conductor 613 in the opening portion provided in a region overlapping with the conductor 542b.

Note that the insulator 602 may have a stacked-layer structure of two or more layers like the insulator 520 illustrated in FIG. 18B or FIG. 18C.

The structures of the transistor and the ferroelectric capacitor illustrated in FIG. 20A can be applied to the transistor M1 and the capacitor FEC1 which are illustrated in FIG. 1A, FIG. 1B, and the like and described in Embodiment 1, for example.

Figure 20B:
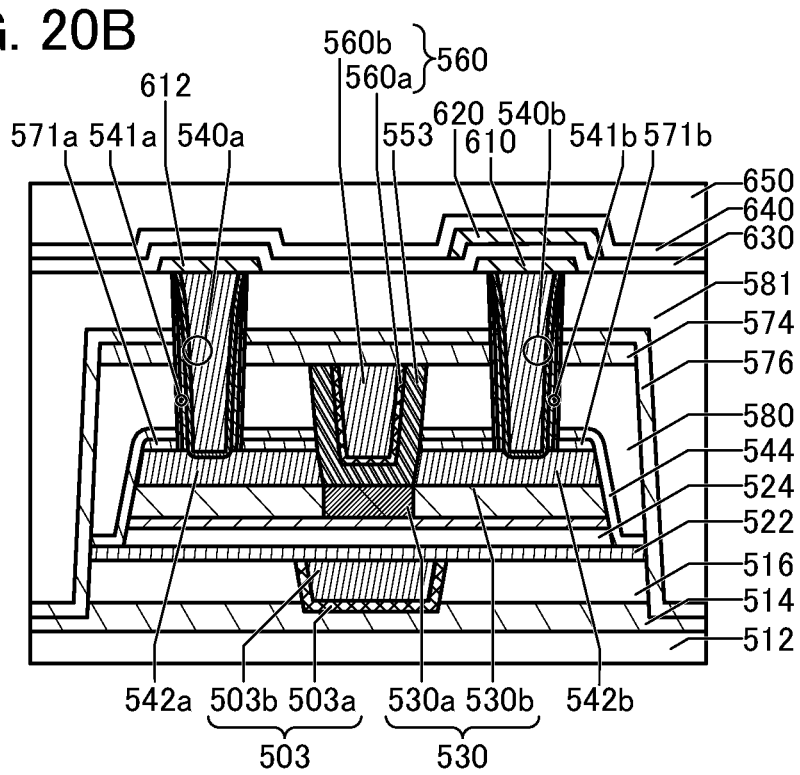

FIG. 20B illustrates a structure example of a transistor, which is different from the transistors illustrated in FIG. 18A to FIG. 18C, FIG. 19, and FIG. 20A, in which a dielectric that can show ferroelectricity is provided in the structure of the transistor 500 illustrated in FIG. 13, FIG. 14A, and the like.

The transistor illustrated in FIG. 20B has a structure in which the insulator 552, the insulator 550, and the insulator 554 functioning as the first gate insulator are replaced with an insulator 553. For the insulator 553, the dielectric that can show ferroelectricity applicable to the insulator 520 in FIG. 18A can be used, for example.

Thus, a ferroelectric capacitor can be provided in the transistor in FIG. 20B between the conductor 560 functioning as the first gate electrode and the oxide 530. In other words, the transistor in FIG. 20B can be an FeFET in which a dielectric that can show ferroelectricity is provided in part of the first gate insulator.

Note that the insulator 553 may have a stacked-layer structure of two or more layers like the insulator 520 illustrated in FIG. 18B or FIG. 18C.

Although FIG. 20B illustrates the structure in which the insulator 552, the insulator 550, and the insulator 554 are replaced with the insulator 553, a structure in which at least one of the insulator 552, the insulator 550, and the insulator 554 is replaced with the insulator 553 and the rest of the insulators and the insulator 553 are stacked may be employed as another structure example.

The structures of the transistor and the ferroelectric capacitor illustrated in FIG. 20B can be used for, for example, the transistor M1, the capacitor FEC1, and the like illustrated in FIG. TA, FIG. 1B, and the like described in Embodiment 1. The transistor in FIG. 20B may be an FeFET, and used as the transistor FEM in FIG. 8B.

Figure 21A:
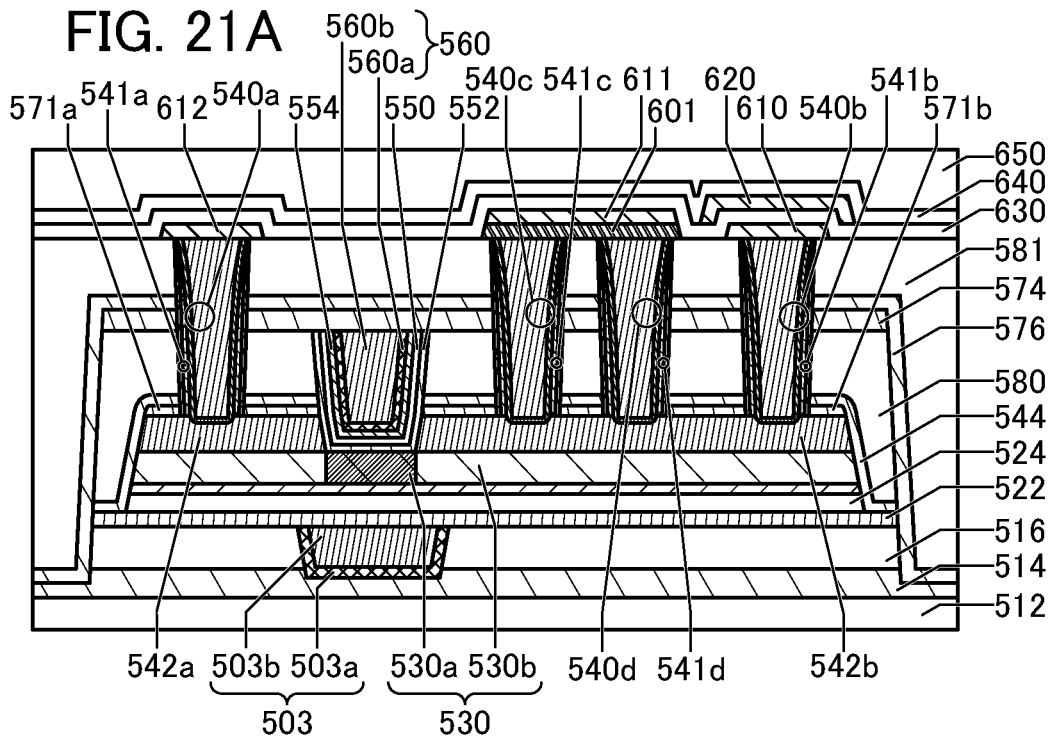
FIG. 21A and FIG. 21B are schematic cross-sectional diagrams each illustrating a configuration example of a transistor.

FIG. 21A illustrates a structure example of the transistor 500 and a capacitor including a dielectric that can show ferroelectricity provided in the vicinity of the transistor 500.

In the transistor illustrated in FIG. 21A, a plurality of opening portions are formed in the insulator 544, the insulator 571*b*, the insulator 580, the insulator 574, the insulator 576, and the insulator 581 in regions overlapping with the conductor 542*b*, for example. A conductor 540*c* functioning as a plug is provided in one of the opening portions, and an insulator 541*c* is provided between a side surface of the opening portion and the conductor 540*c*, as an insulator having a barrier property against an impurity. Furthermore, a conductor 540*d* functioning as a plug is provided in another one of the opening portions, and an insulator 541*d* is provided between a side surface of the opening portion and the conductor 540*d*, as an insulator having a barrier property against an impurity. Note that the material applicable to the conductor 540*a* and the conductor 540*b* can be used for the conductor 540*c* and the conductor 540*d*, for example, and the material applicable to the insulator 541*a* and the insulator 541*b* can be used for the insulator 541*c* and the insulator 541*d*, for example.

An insulator 601 is provided over and in contact with the conductor 540*c* and the conductor 540*d*. For the insulator 601, the dielectric that can show ferroelectricity applicable to the insulator 520 in FIG. 18A can be used, for example.

A conductor 611 is provided over and in contact with the insulator 601. The conductor 611 can be provided using a material similar to those for the conductor 328 and the conductor 330, for example.

Owing to the structure illustrated in FIG. 21A, a ferroelectric capacitor can be provided between the conductor 611 and each of the conductor 540*c* and the conductor 540*d* functioning as plugs.

Note that the insulator 601 may have a stacked-layer structure of two or more layers like the insulator 520 illustrated in FIG. 18B or FIG. 18C.

Although the number of plugs in contact with the insulator 601 is two (the conductor 540*c* and the conductor 540*d*) in FIG. 21A, the number of the plugs may be one, or three or more. In other words, although FIG. 21A illustrates an example where a region overlapping with the insulator 601 is provided with two opening portions in which conductors are provided as plugs, the number of opening portions provided in the region overlapping with the insulator 601 may be one, or three or more.

The structures of the transistor and the ferroelectric capacitor illustrated in FIG. 21A can be applied to the transistor M2 and the capacitor FEC1 which are illustrated in FIG. TA, FIG. 1B, and the like and described in Embodiment 1, for example.

Figure 21B:
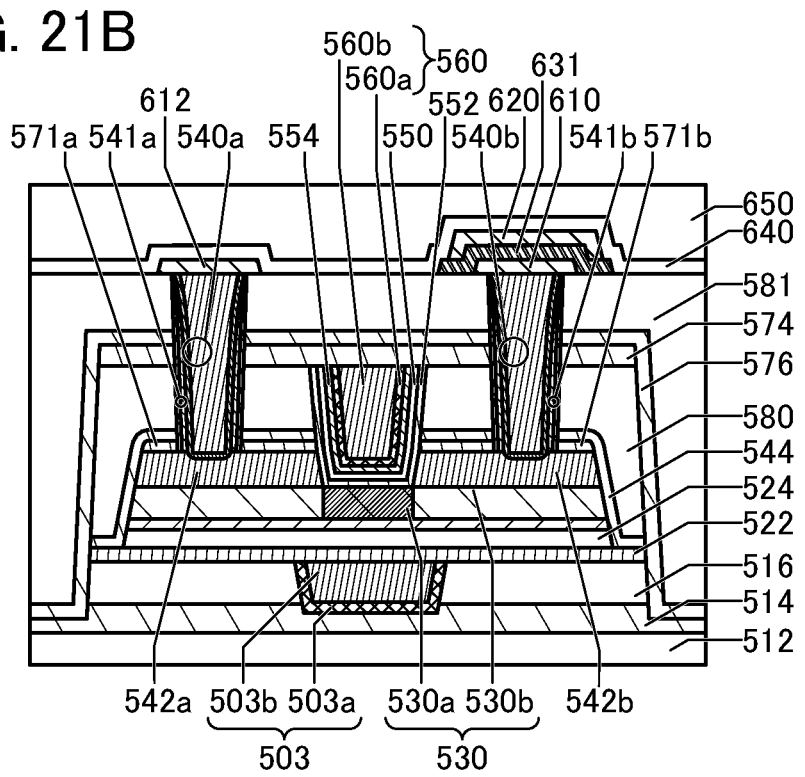

FIG. 21B illustrates a structure example, which is different from that in FIG. 21A, of the transistor 500 and a capacitor including a dielectric that can show ferroelectricity provided in the vicinity of the transistor 500.

In the transistor illustrated in FIG. 21B, an insulator 631 is provided on the top surface of the conductor 610 positioned over the conductor 540*b* functioning as a plug and the top surface of a region of the insulator 581. For the insulator 631, the dielectric that can show ferroelectricity applicable to the insulator 520 in FIG. 18A can be used, for example.

The conductor 620 is provided on the top surface of the insulator 631, and the insulator 640 and the insulator 650 are provided in this order on the top surfaces of the insulator 581, the conductor 612, the conductor 620, and a region of the insulator 631.

Owing to the structure illustrated in FIG. 21B, a ferroelectric capacitor can be provided between the conductor 610 and the conductor 620.

Note that the insulator 631 may have a stacked-layer structure of two or more layers like the insulator 520 illustrated in FIG. 18B or FIG. 18C.

The structure of the transistor and the ferroelectric capacitor illustrated in FIG. 21B can be applied to the transistor M2, the capacitor FEC1, and the like which are illustrated in FIG. TA, FIG. 1B, and the like and described in Embodiment 1, for example.

Figure 22:
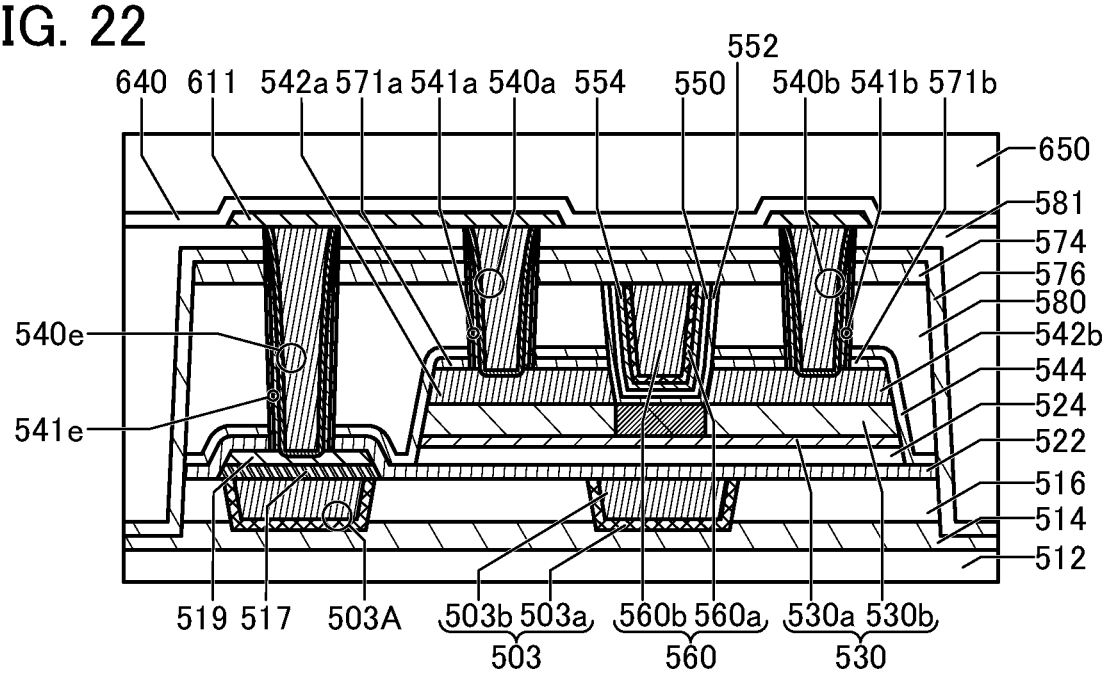
FIG. 22 is a schematic cross-sectional diagram illustrating a configuration example of a transistor.

FIG. 22 illustrates a structure example, which is different from those in FIG. 21A and FIG. 25B, of the transistor 500 and a capacitor including a dielectric that can show ferroelectricity provided in the vicinity of the transistor 500.

In FIG. 22, a plurality of openings are formed in the insulator 516; the conductor 503 is embedded in one opening and a conductor 503A is embedded in another opening. For example, a material usable for the conductor 503 can be used for the conductor 503A.

An insulator 517 and a conductor 519 are provided in this order in an upper portion of the conductor 503A. The insulator 517 and the conductor 519 are covered with the insulator 522 described in the transistor 500 in FIG. 14A. The insulator 522 is covered with the insulator 544 described in the transistor 500 in FIG. 14A.

For the insulator 517, the dielectric that can show ferroelectricity applicable to the insulator 520 in FIG. 18A can be used, for example.

The conductor 519 can be provided using a material similar to those for the conductor 328 and the conductor 330, for example.

Owing to the structure illustrated in FIG. 22, a ferroelectric capacitor can be provided between the conductor 503A and the conductor 519.

Note that the insulator 517 may have a stacked-layer structure of two or more layers like the insulator 520 illustrated in FIG. 18B or FIG. 18C.

After components up to the insulator 581 are provided, an opening portion is formed in the insulator 522, the insulator 544, the insulator 580, the insulator 574, the insulator 576, and the insulator 581 in a region overlapping with the conductor 503, for example. Furthermore, a conductor 540*e* functioning as a plug is provided in another one of the opening portions, and an insulator 541*e* is provided between a side surface of the opening portion and the conductor 540e, as an insulator having a barrier property against an impurity. Note that the material applicable to the conductor 540a and the conductor 540b can be used for the conductor 540e, for example, and the material applicable to the insulator 541a and the insulator 541b can be used for the insulator 541e, for example.

The conductor 611 is provided on top surfaces of the conductors 540a and 540e functioning as plugs and a top surface of part of the insulator 581. The conductor 611 can be provided using a material similar to those for the conductor 328 and the conductor 330, for example.

The insulator 640 and the insulator 650 are provided in this order on the top surface of the conductor 611 and the top surface of part of the insulator 581.

The structure of the transistor and the ferroelectric capacitor illustrated in FIG. 22 can be applied to the transistor M2, the capacitor FEC1, and the like which are illustrated in FIG. TA, FIG. 1B, and the like and described in Embodiment 1, for example.

Structure Example 2 of Semiconductor Device

Next, a structure example of the semiconductor device including a ferroelectric capacitor is described.

Figure 23:
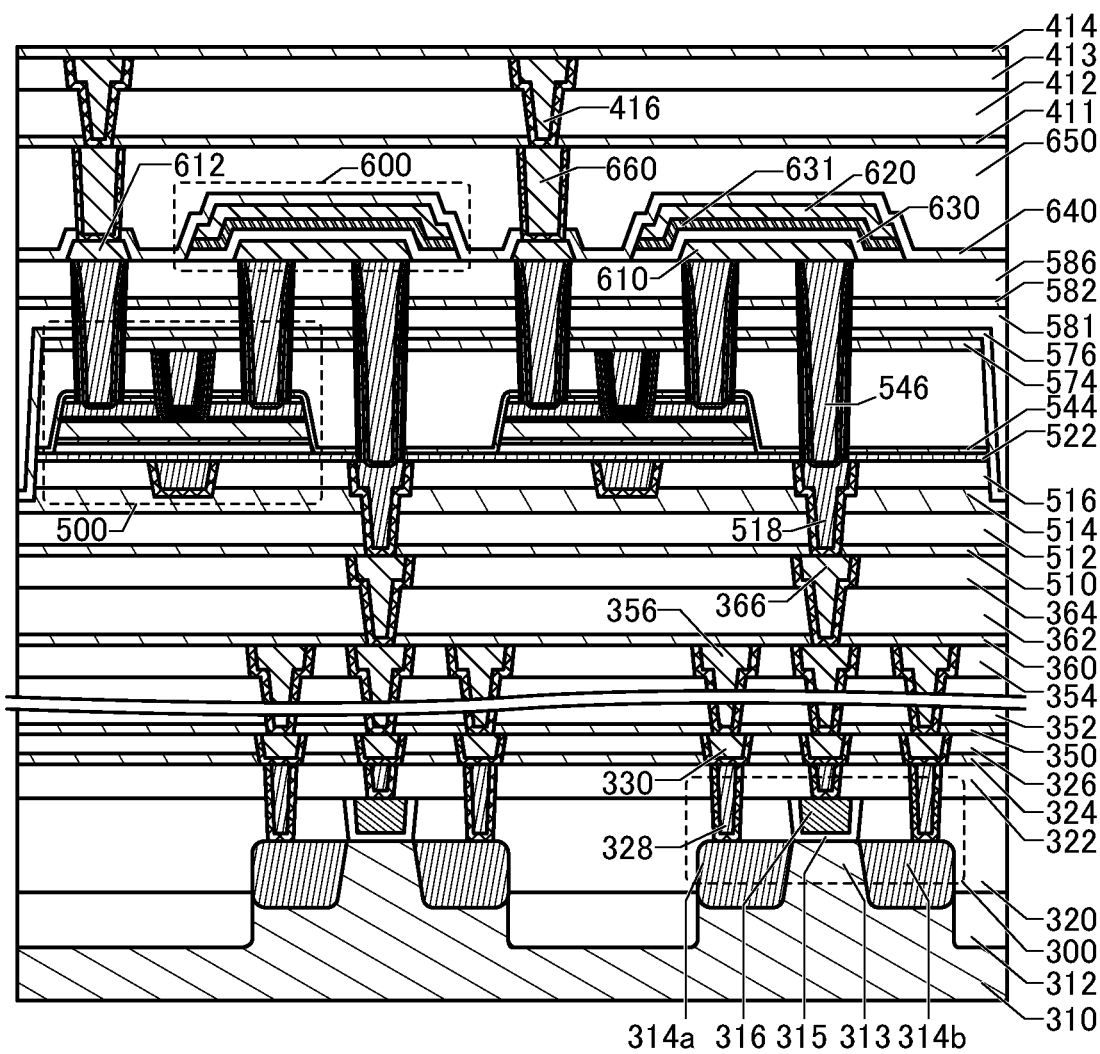
FIG. 23 is a schematic cross-sectional diagram illustrating a configuration example of a semiconductor device.

FIG. 23 illustrates an example in which the structure of the capacitor 600 positioned on the top surfaces of the insulator 582 and the conductor 546 in the semiconductor device in FIG. 13 is changed.

Specifically, the capacitor 600 includes, for example, the conductor 610, the conductor 620, the insulator 630, and the insulator 631. In particular, a dielectric that can show ferroelectricity can be used as the insulator 631 as described with reference to FIG. 21B.

In FIG. 23, the conductor 610 and the conductor 612 can be formed using materials similar to those for the conductor 610 and the conductor 612 in FIG. 13. In FIG. 23, the conductor 610 and the conductor 612 can be formed by methods similar to those for the conductor 610 and the conductor 612 in FIG. 13.

In FIG. 23, the insulator 630 is provided on atop surface of the conductor 610 and atop surface of part of a region of the insulator 586. The insulator 631 is provided on atop surface of the insulator 630, and the conductor 620 is provided on atop surface of the insulator 631.

A material that can be used for the insulator 630 in FIG. 13 can be used for the insulator 630, for example.

In FIG. 23, the insulator 640 is provided on top surfaces of a region of the insulator 630 including an end portion, a region of the insulator 631 including an end portion, the conductor 620, and part of a region of the insulator 586.

For the insulator 640, any of the materials usable for the insulator 640 in FIG. 13 can be used, for example.

By employing the structure of the capacitor 600 as illustrated in FIG. 23, the ferroelectric capacitor can be provided in the semiconductor device illustrated in FIG. 13.

Next, a structure example of a semiconductor device including a ferroelectric capacitor different from that in FIG. 23 will be described.

Figure 24:
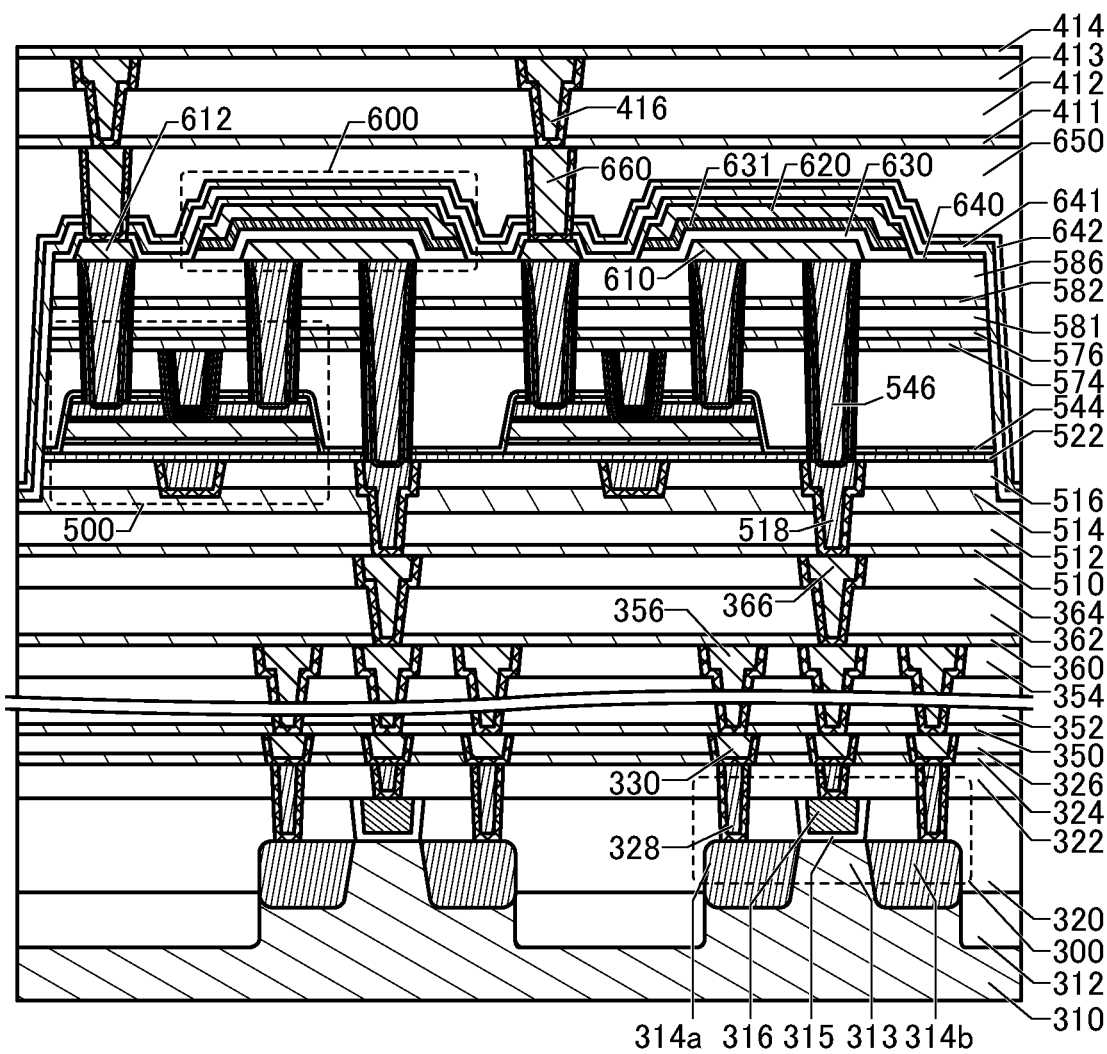
FIG. 24 is a schematic cross-sectional diagram illustrating a configuration example of a semiconductor device.

A semiconductor device illustrated in FIG. 24 is a variation example of the semiconductor device in FIG. 23 and has a structure in which the transistor 500 and the capacitor 600 are surrounded by the insulator 514, the insulator 544, the insulator 574, the insulator 576, the insulator 581, an insulator 641, an insulator 642, and the like.

In the semiconductor devices in FIG. 13 and FIG. 23, an opening portion reaching the insulator 514 is formed after the components from the substrate 310 to the insulator 574 are sequentially provided; whereas in the semiconductor device in FIG. 24, an opening portion reaching the insulator 514 is formed after the components from the substrate 310 to the insulator 640 are sequentially provided.

In the semiconductor device in FIG. 24, the insulator 641, the insulator 642, and the insulator 650 are provided in this order on a bottom portion of the opening portion and atop surface of the insulator 640.

The insulator 641 and the insulator 642 preferably function as barrier insulating films that inhibit diffusion of impurities such as water and hydrogen into the transistor 500 and the capacitor 600 from above the transistor 500 and the capacitor 600, for example.

As a method for depositing the insulator 641, for example, a sputtering method can be used. For example, silicon nitride deposited by a sputtering method can be used as the insulator 641. Since a sputtering method does not need to use a molecule containing hydrogen as a deposition gas, the hydrogen concentration in the insulator 641 can be reduced. The hydrogen concentration in the insulator 641, which is in contact with the conductor 610, the conductor 612, and the insulator 586, is reduced in the above manner; hence, diffusion of hydrogen into the conductor 610, the conductor 612, and the insulator 586 from the insulator 641 can be suppressed.

The insulator 642 is preferably deposited by, for example, an ALD method, particularly a PEALD method. For example, silicon nitride deposited by a PEALD method can be used as the insulator 642. Accordingly, the insulator 642 can be formed with good coverage; thus, even when a pinhole, disconnection, or the like is caused in the insulator 641 because of unevenness of a base, covering such a defect with the insulator 642 can inhibit diffusion of hydrogen into the conductor 610, the conductor 612, and the insulator 586.

Employing the structure illustrated in FIG. 24 can prevent impurities such as water and hydrogen from diffusing to the transistor 500 side and the capacitor 600 side through the insulator 512, the insulator 514, the insulator 641, the insulator 642, and the like. Moreover, oxygen contained in the insulator 580 and the like can be prevented from diffusing to the outside through the insulator 574, the insulator 641, the insulator 642, and the like.

When a semiconductor device using a transistor including an oxide semiconductor has the structure described in this embodiment, a change in electrical characteristics of the transistor can be inhibited and the reliability can be improved.

Furthermore, in the semiconductor device using the transistor including the oxide semiconductor, employing a stacked-layer structure and achieving scaling down and higher integration, for example, can reduce the area of circuits constituting the semiconductor device. In particular, the use of a ferroelectric capacitor as the capacitor included in the semiconductor device can increase an electrostatic capacitance value of the capacitor; thus, the capacitor can be scaled down. This can reduce the area of the circuit including the capacitor. In addition, as described in this embodiment, stacking the transistor and the capacitor makes it possible to increase the circuit scale while the increase in the circuit area in the semiconductor device is suppressed.

Note that this embodiment can be combined with any of the other embodiments in this specification as appropriate.

Embodiment 4

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 25A. FIG. 25A is a diagram showing the classification of crystal structures of an oxide semiconductor, typically IGZO (a metal oxide containing In, Ga, and Zn).

As shown in FIG. 25A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 25A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 25B shows an XRD spectrum, which is obtained by GIXD (Grazing-Incidence XRD) measurement, of a CAAC-IGZO film classified into "Crystalline" (the horizontal axis represents 2θ[deg.] and the vertical axis represents intensity in arbitrary unit (a.u.)). Note that a GIXD method is also referred to as a thin film method or a Seemann-Bohlin method. The XRD spectrum that is shown in FIG. 25B and obtained by GIXD measurement may be hereinafter simply referred to as an XRD spectrum. The CAAC-IGZO film in FIG. 25B has a composition in the neighborhood of In:Ga:Zn=4:2:3 [atomic ratio]. The CAAC-IGZO film in FIG. 25B has a thickness of 500 nm.

As shown in FIG. 25B, a clear peak indicating crystallinity is detected in the XRD spectrum of the CAAC-IGZO film. Specifically, a peak indicating c-axis alignment is detected at 2θ of around 310 in the XRD spectrum of the CAAC-IGZO film. As shown in FIG. 25B, the peak at 2θ of around 310 is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 25C shows a diffraction pattern of the CAAC-IGZO film. FIG. 25C shows a diffraction pattern obtained by the NBED method in which an electron beam is incident in the direction parallel to the substrate. The composition of the CAAC-IGZO film in FIG. 25C is In:Ga:Zn=4:2:3 [atomic ratio] or the neighborhood thereof. In the nanobeam electron diffraction method, electron diffraction is performed with a probe diameter of 1 nm.

As shown in FIG. 25C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 25A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[Caac-Os]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[Nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^{-3}$, preferably lower than or equal to $2\times10^{17}$ atoms/cm$^{-3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^{-3}$, preferably lower than or equal to $2\times10^{16}$ atoms/cm$^{-3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^{-3}$, preferably lower than or equal to $5\times10^{18}$ atoms/cm$^{-3}$, further preferably lower than or equal to $1\times10^{18}$ atoms/cm$^{-3}$, still further preferably lower than or equal to $5\times10^{17}$ atoms/cm$^{-3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^{-3}$, preferably lower than $1\times10^{19}$ atoms/cm$^{-3}$, further preferably lower than $5\times10^{18}$ atoms/cm$^{-3}$, still further preferably lower than $1\times10^{18}$ atoms/cm$^{-3}$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 5

In this embodiment, examples of a semiconductor wafer where the memory device or the like described in the above embodiment is formed and electronic components incorporating the memory device will be described.

<Semiconductor Wafer>

First, an example of a semiconductor wafer where a memory device or the like is formed is described with reference to FIG. 26A.

Figure 26A:
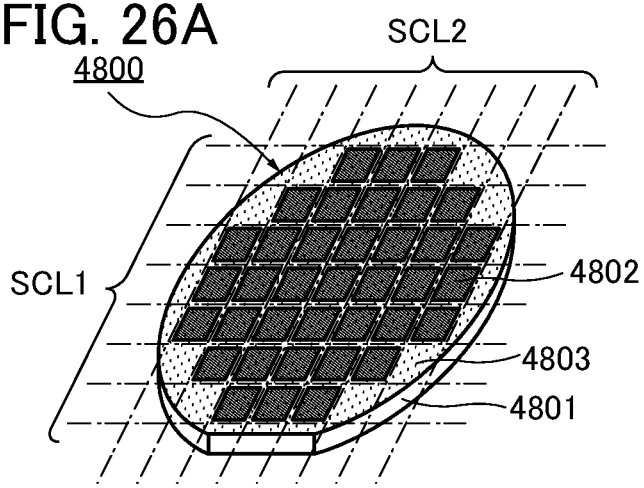
FIG. 26A is a perspective view illustrating an example of a semiconductor wafer.

A semiconductor wafer 4800 illustrated in FIG. 26A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is performed along scribe lines SCL1 and scribe lines SCL2 (referred to as dicing lines or cutting lines in some cases) indicated by dashed-dotted lines. To perform the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 intersect each other perpendicularly.

Figure 26B:
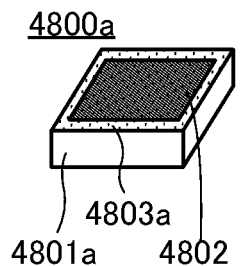
FIG. 26B is a perspective view illustrating an example of a chip.

With the dicing step, a chip 4800a as illustrated in FIG. 26B can be cut out from the semiconductor wafer 4800. The chip 4800a includes a wafer 4801a, the circuit portion 4802, and a spacing 4803a. Note that it is preferable to make the spacing 4803a as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 26A. The element substrate may be a rectangular semiconductor wafer, for example. The shape of the element substrate can be changed as appropriate, depending on a fabrication process of an element and an apparatus for fabricating the element.

<Electronic Component>

Figure 26C:
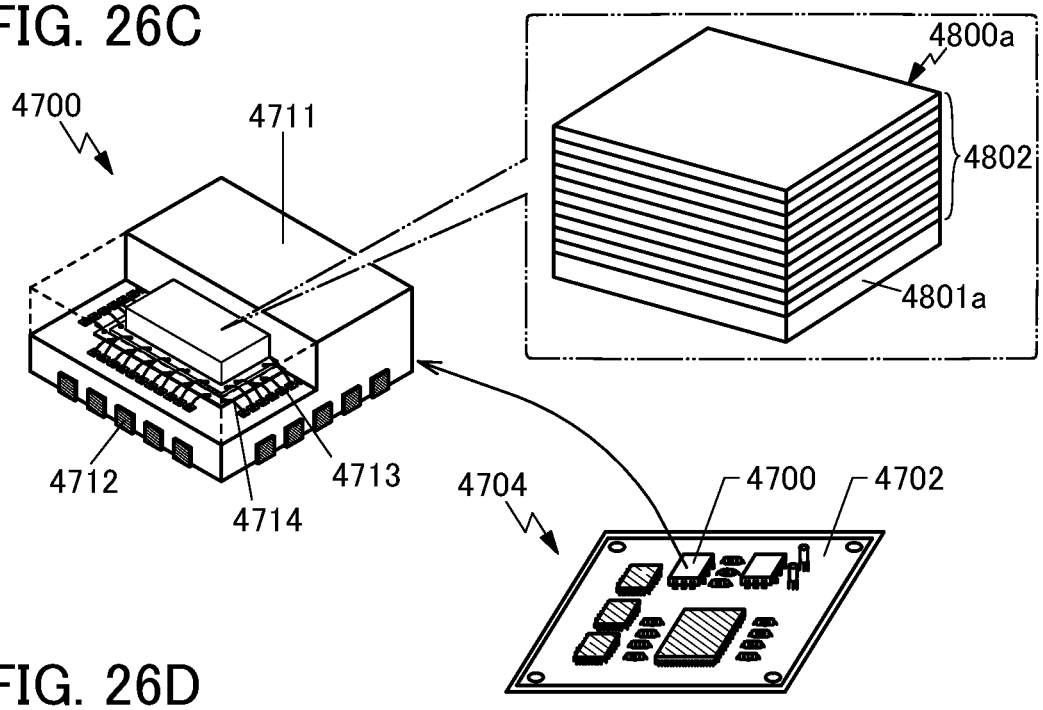
FIG. 26C and FIG. 26D are perspective views each illustrating an example of an electronic component.

FIG. 26C is a perspective view of an electronic component 4700 and a substrate (a mounting board 4704) on which the electronic component 4700 is mounted. The electronic component 4700 illustrated in FIG. 26C includes the chip 4800a in a mold 4711. Note that the chip 4800a illustrated in FIG. 26C is shown to have a structure in which the circuit portions 4802 are stacked. That is, the memory device described in the above embodiment can be used for the circuit portion 4802. To illustrate the inside of the electronic component 4700, some portions are omitted in FIG. 26C. The electronic component 4700 includes a land 4712 outside the mold 4711. The land 4712 is electrically connected to an electrode pad 4713, and the electrode pad 4713 is electrically connected to the chip 4800a via a wire 4714. The electronic component 4700 is mounted on a printed circuit board 4702, for example. A plurality of such electronic components are combined and electrically connected to each other on the printed circuit board 4702; thus, the mounting board 4704 is completed.

Figure 26D:
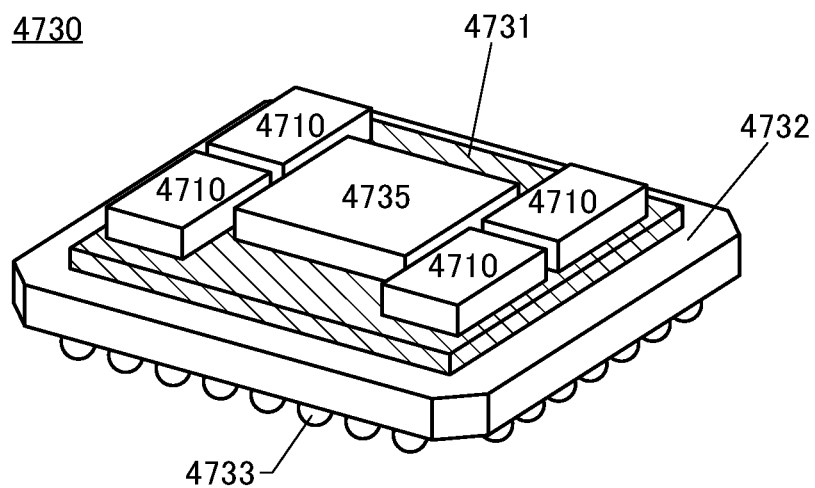

FIG. 26D is a perspective view of an electronic component 4730. The electronic component 4730 is an example of a SiP (System in package) or an MCM (Multi Chip Module). In the electronic component 4730, an interposer 4731 is provided over a package substrate 4732 (a printed circuit board), and a semiconductor device 4735 and a plurality of semiconductor devices 4710 are provided over the interposer 4731.

The electronic component 4730 includes the semiconductor devices 4710. Examples of the semiconductor device 4710 include the memory device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. The interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". A through electrode is provided in the interposer 4731 and the through electrode is used to electrically connect the integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be fabricated at lower cost than an integrated circuit because the silicon interposer need not to be provided with an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom portion of the package substrate 4732 to mount the electronic component 4730 on another substrate. FIG. 26D illustrates an example in which the electrode 4733 is formed of a solder ball. Solder balls are provided in a matrix on the bottom portion of the package substrate 4732, whereby a BGA (Ball Grid Array) can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Note that this embodiment can be combined with any of the other embodiments in this specification as appropriate.

Embodiment 6

In this embodiment, a CPU that can include the memory device of the above embodiment will be described.

Figure 27:
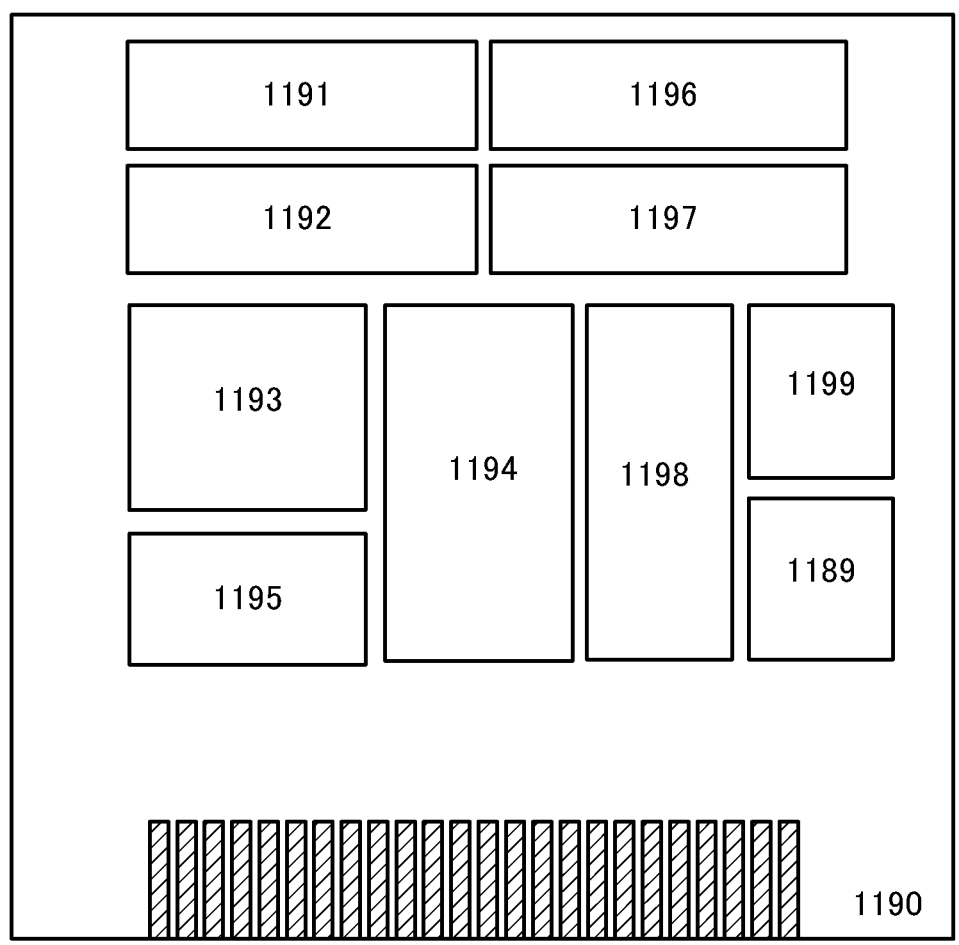
FIG. 27 is a block diagram illustrating a CPU.

FIG. 27 is a block diagram illustrating a structure example of a CPU in part of which the memory device described in the above embodiment is used.

The CPU illustrated in FIG. 27 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over separate chips. Needless to say, the CPU illustrated in FIG. 27 is just an example of a simplified structure, and an actual CPU may have a variety of structures depending on the usage. For example, the CPU may have a structure in which a plurality of cores each including the CPU illustrated in FIG. 27 or an arithmetic circuit are included and operate in parallel, i.e., a GPU-like structure. The number of bits that the CPU can process in an internal arithmetic circuit or a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device, a peripheral circuit, or the like on the basis of its priority or a mask state, and processes the request. The register controller 1197 generates an address of the register 1196, and reads or writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above various circuits.

In the CPU illustrated in FIG. 27, a memory cell is provided in the register 1196. The register 1196 may include the memory device described in the above embodiment, for example.

In the CPU illustrated in FIG. 27, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 7

This embodiment will show examples of electronic devices including the memory device described in the above embodiment. FIG. 28A to FIG. 28J and FIG. 29A to FIG. 29E illustrate electronic devices each of which includes the electronic component 4700 including the memory device.

[Mobile Phone]

Figure 28A:
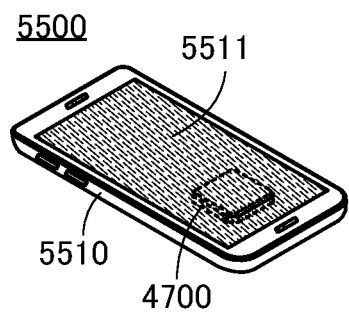
FIG. 28A to FIG. 28J are each a perspective view or a schematic view illustrating an example of a product.

An information terminal 5500 illustrated in FIG. 28A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device described in the above embodiment, the information terminal 5500 can retain a temporary file generated at the time of executing an application (e.g., a web browser's cache).

[Wearable Terminal]

Figure 28B:
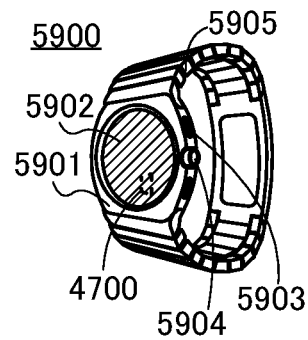

FIG. 28B illustrates an information terminal 5900 that is an example of a wearable terminal. The information terminal 5900 includes a housing 5901, a display portion 5902, an operation button 5903, a crown 5904, a band 5905, and the like.

Like the information terminal 5500 described above, the wearable terminal can retain a temporary file generated at the time of executing an application by using the memory device described in the above embodiment.

[Information Terminal]

Figure 28C:
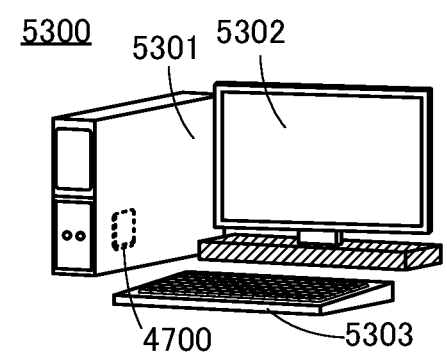

FIG. 28C illustrates a desktop information terminal 5300. The desktop information terminal 5300 includes a main body 5301 of the information terminal, a display 5302, and a keyboard 5303.

Like the information terminal 5500 described above, the desktop information terminal 5300 can retain a temporary file generated at the time of executing an application by using the memory device described in the above embodiment.

Note that although the smartphone, the wearable terminal, and the desktop information terminal are respectively illustrated in FIG. 28A and FIG. 28C as examples of the electronic device, one embodiment of the present invention can be applied to an information terminal other than a smartphone, a wearable terminal, and a desktop information terminal. Examples of an information terminal other than a smartphone, a wearable terminal, and a desktop information terminal include a PDA (Personal Digital Assistant), a laptop information terminal, and a workstation.

[Household Appliance]

Figure 28D:
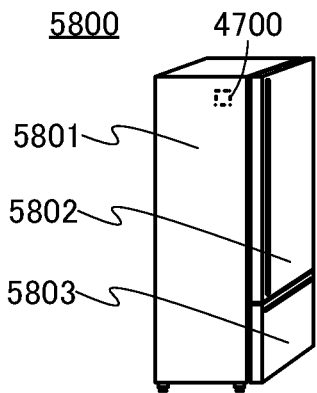

FIG. 28D illustrates an electric refrigerator-freezer 5800 as an example of a household appliance. The electric refrigerator-freezer 5800 includes a housing 5801, a refrigerator door 5802, a freezer door 5803, and the like.

When the memory device described in the above embodiments is used in the electric refrigerator-freezer 5800, the electric refrigerator-freezer 5800 can be used for IoT (Internet of Things), for example. When used for IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the memory device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machines]

Figure 28E:
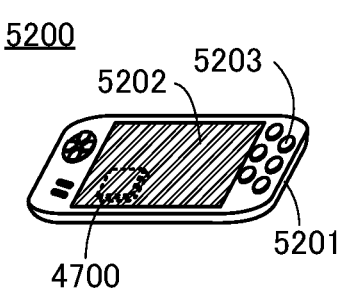

FIG. 28E illustrates a portable game machine 5200 that is an example of a game machine. The portable game machine 5200 includes a housing 5201, a display portion 5202, a button 5203, and the like.

Figure 28F:
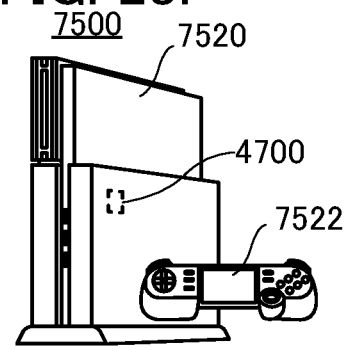

FIG. 28F illustrates a stationary game machine 7500 that is another example of a game machine. The stationary game machine 7500 includes a main body 7520 and a controller 7522. The controller 7522 can be connected to the main body 7520 with or without a wire. Although not illustrated in FIG. 28F, the controller 7522 can include a display portion that displays a game image, and an input interface besides a button, such as a touch panel, a stick, a rotating knob, and a sliding knob, for example. The shape of the controller 7522 is not limited to that illustrated in FIG. 28F, and can be changed variously in accordance with the genres of games. For example, for a shooting game such as an FPS (First Person Shooter) game, a gun-shaped controller having a trigger button can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

Videos displayed on the game machine can be output with a display device such as a television device, a personal computer display, a game display, or a head-mounted display.

When the memory device described in the above embodiment is used in the portable game machine 5200 and the stationary game machine 7500, the portable game machine 5200 with low power consumption can be achieved. Furthermore, heat generation from a circuit can be reduced owing to low power consumption; thus, the influence of heat generation on the circuit itself, the peripheral circuit, and the module can be reduced.

Moreover, with the use of the memory device described in the above embodiment, the portable game machine 5200 and the stationary game machine 7500 can retain a temporary file necessary for arithmetic operation that occurs during game play.

Although FIG. 28E and FIG. 28F illustrate a portable game machine and a stationary game machine, respectively, as examples of game machines, the electronic device of one embodiment of the present invention is not limited thereto. Examples of the electronic device of one embodiment of the present invention include an arcade game machine installed in entertainment facilities (e.g., a game center and an amusement park) and a throwing machine for batting practice installed in sports facilities.

[Moving Vehicle]

The memory device described in the above embodiment can be used for an automobile, which is a moving vehicle, and around the driver's seat in an automobile.

Figure 28G:
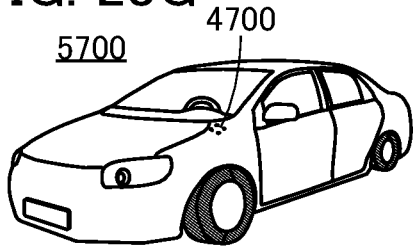

FIG. 28G illustrates an automobile 5700 that is an example of a moving vehicle.

An instrument panel that provides various kinds of information by displaying a speedometer, a tachometer, a mileage, a fuel meter, a gearshift state, and air-conditioning settings is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, which improves safety.

The memory device described in the above embodiment can temporarily retain data, and thus the memory device can be used to retain temporary data necessary in an automatic driving system for the automobile 5700 and a system for navigation and risk prediction, for example. The display device may be configured to display temporary information regarding navigation, risk prediction, or the like. Moreover, the memory device may be configured to retain a video taken by a driving recorder provided in the automobile 5700.

Although an automobile is described above as an example of a moving vehicle, a moving vehicle is not limited to an automobile. Examples of moving vehicles include a train, a monorail train, a ship, and a flying object (a helicopter, an unmanned aircraft (a drone), an airplane, and a rocket).

[Camera]

The memory device described in the above embodiment can be used in a camera.

Figure 28H:
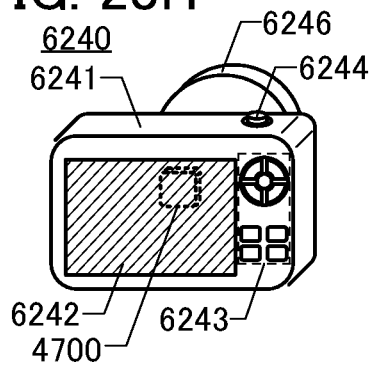

FIG. 28H illustrates a digital camera 6240 that is an example of an imaging device. The digital camera 6240 includes a housing 6241, a display portion 6242, operation buttons 6243, a shutter button 6244, and the like, and an attachable lens 6246 is attached to the digital camera 6240. Here, the lens 6246 of the digital camera 6240 is detachable from the housing 6241 for replacement; alternatively, the lens 6246 may be incorporated into the housing 6241. A stroboscope, a viewfinder, or the like may be additionally attached to the digital camera 6240.

When the memory device described in the above embodiment is used in the digital camera 6240, the digital camera 6240 with low power consumption can be achieved. Furthermore, heat generation from a circuit can be reduced owing to low power consumption; thus, the influence of heat generation on the circuit itself, the peripheral circuit, and the module can be reduced.

[Video Camera]

The memory device described in the above embodiment can be used in a video camera.

Figure 28I:
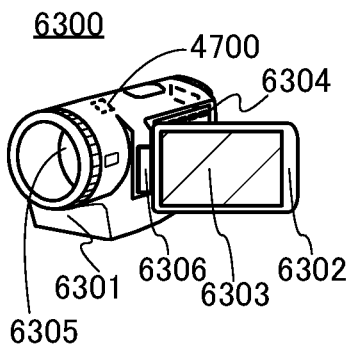

FIG. 28I illustrates a video camera 6300 that is an example of an imaging device. The video camera 6300 includes a first housing 6301, a second housing 6302, a display portion 6303, operation keys 6304, a lens 6305, a joint 6306, and the like. The operation keys 6304 and the lens 6305 are provided in the first housing 6301, and the display portion 6303 is provided in the second housing 6302. The first housing 6301 and the second housing 6302 are connected to each other with the joint 6306, and the angle between the first housing 6301 and the second housing 6302 can be changed with the joint 6306. Images displayed on the display portion 6303 may be changed in accordance with the angle at the joint 6306 between the first housing 6301 and the second housing 6302.

When images taken by the video camera 6300 are recorded, the images need to be encoded in accordance with a data recording format. With the use of the above memory device, the video camera 6300 can retain a temporary file generated in encoding.

[ICD]

The memory device described in the above embodiment can be used in an implantable cardioverter-defibrillator (ICD).

Figure 28J:
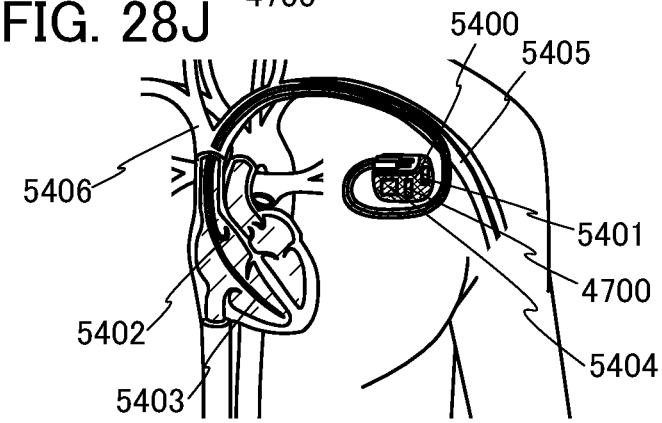

FIG. 28(J) is a schematic cross-sectional view illustrating an example of an ICD. An ICD main unit 5400 includes at least a battery 5401, an electric component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, the safety can be improved. Specifically, even if one of the batteries in the ICD main unit 5400 is dead, the other batteries can work properly; hence, the batteries also function as an auxiliary power source.

In addition to the antenna 5404 capable of receiving electric power, an antenna that can transmit physiological signals may be included to construct, for example, a system that monitors the cardiac activity by checking physiological signals such as a pulse, a respiratory rate, a heart rate, and body temperature with an external monitoring device.

[Expansion Device for PC]

The memory device described in the above embodiment can be used in a calculator such as a PC (Personal Computer) and an extension device for an information terminal.

Figure 29A:
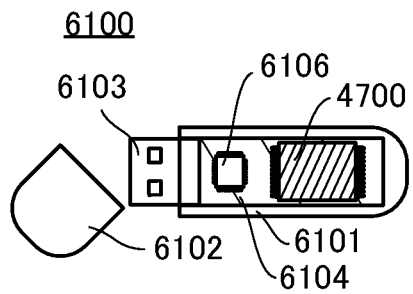
FIG. 29A to FIG. 29E are each a perspective view or a schematic view illustrating an example of a product.

FIG. 29A illustrates, as an example of the extension device, a portable extension device 6100 that includes a chip capable of retaining data and is externally provided on a PC. The extension device 6100 can retain data using the chip when connected to a PC with a USB (Universal Serial Bus), for example. FIG. 29A illustrates the portable extension device 6100; however, the extension device of one embodiment of the present invention is not limited thereto and may be a relatively large extension device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

[SD Card]

The memory device described in the above embodiment can be used in an SD card that can be attached to an electronic device such as an information terminal or a digital camera.

Figure 29B:
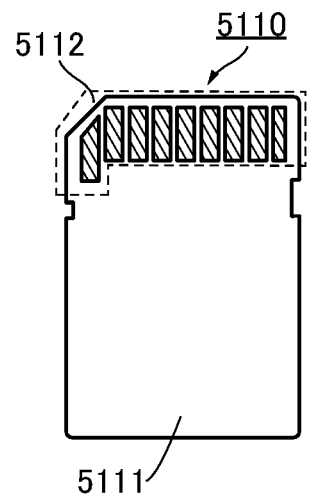
Figure 29C:
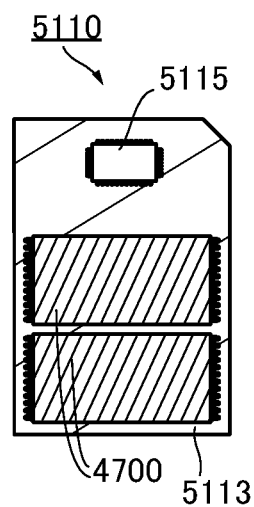

FIG. 29B is a schematic external view of an SD card, and FIG. 29C is a schematic view of the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a storage device and a circuit for driving the storage device. For example, electronic components 4700 and a controller chip 5115 are attached to the substrate 5113. Note that the circuit structures of the electronic components 4700 and the controller chip 5115 are not limited to those described above, and can be changed as appropriate according to circumstances. For example, a write circuit, a row driver, a readout circuit, and the like that are provided in an electronic component may be incorporated into the controller chip 5115 instead of the electronic component 4700.

When the electronic components 4700 are provided also on a rear surface side of the substrate 5113, the capacitance of the SD card 5110 can be increased. In addition, a wireless chip with a wireless communication function may be provided on the substrate 5113. This allows wireless communication between an external device and the SD card 5110 and enables data reading and writing from/to the electronic components 4700.

[SSD]

The memory device described in the above embodiment can be used in a solid state drive (SSD) that can be attached to an electronic device such as an information terminal.

Figure 29D:
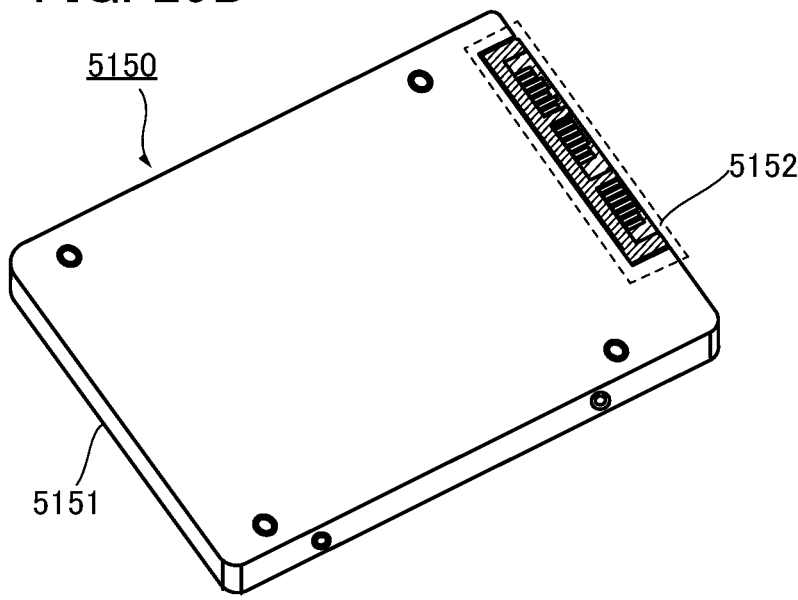
Figure 29E:
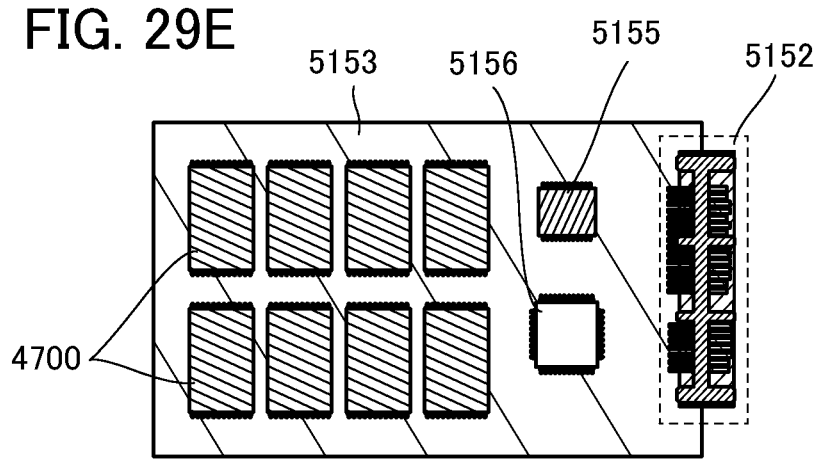

FIG. 29D is a schematic external view of an SSD, and FIG. 29E is a schematic view of the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a storage device and a circuit for driving the storage device. For example, the electronic components 4700, a memory chip 5155, and a controller chip 5156 are attached to the substrate 5153. When the electronic components 4700 are also provided on a rear surface side of the substrate 5153, the capacitance of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit structures of the electronic components 4700, the memory chip 5155, and the controller chip 5156 are not limited to those described above, and the circuit structures can be changed as appropriate according to circumstances. For example, a memory functioning as a work memory can also be provided in the controller chip 5156.

The semiconductor device or the memory device described in Embodiment 1 or Embodiment 2 is used for memory devices included in the above electronic devices, whereby novel electronic devices can be provided.

Note that this embodiment can be combined with any of the other embodiments in this specification as appropriate.

REFERENCE NUMERALS

HC: circuit, HC1: circuit, HC2: circuit, CP: circuit, NGE: negative voltage generation circuit, MCA: memory cell array, MC: memory cell, M1: transistor, M2: transistor, M2B: transistor, M3: transistor, ME: transistor, FEM: transistor, C1: capacitor, C1B: capacitor, C2: capacitor, CA: capacitor, CB: capacitor, FEC1: capacitor, FEC1B: capacitor, FEC2: capacitor, VIL: wiring, VCL: wiring, VCL1: wiring, VCL2: wiring, VCLB: wiring, VGL: wiring, VGL1: wiring, VGL2: wiring, VGLB: wiring, VBL: wiring, BGL: wiring, BL: wiring, WL: wiring, WWL: wiring, RWL: wiring, WBL: wiring, RBL: wiring, SL: wiring, CL: wiring, N1: node, N1B: node, N2: node, N2B: node, NBG: node, SCL1: scribe line, SCL2: scribe line, 200: semiconductor device, 251: wiring, 252: wiring, 261: control logic circuit, 262: row driver circuit, 263: column driver circuit, 264: output circuit, 271: row decoder, 272: word line driver circuit, 280: peripheral circuit, 281: column decoder, 282: precharge circuit, 283: amplifier circuit, 284: circuit, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 503A: conductor, 510: insulator, 512: insulator, 514: insulator, 516: insulator, 518: conductor, 519: conductor, 520: insulator, 520a: insulator, 520b: insulator, 520c: insulator, 522: insulator, 524: insulator, 530: oxide, 530a: oxide, 530b: oxide, 530ba: region, 530bb: region, 530bc: region, 540a: conductor, 540b: conductor, 540c: conductor, 540d: conductor, 540e: conductor, 541a: insulator, 541b: insulator, 541c: insulator, 541d: insulator, 541e: insulator, 542a: conductor, 542b: conductor, 543a: oxide, 543b: oxide, 544: insulator, 546: conductor, 550: insulator, 550a: insulator, 550b: insulator, 552: insulator, 553: insulator, 554: insulator, 560: conductor, 560a: conductor, 560b: conductor, 561: insulator, 562: conductor, 571a: insulator, 571b: insulator, 574: insulator, 576: insulator, 580: insulator, 581: insulator, 582: insulator, 586: insulator, 600: capacitor, 601: insulator, 602: insulator, 610: conductor, 611: conductor, 612: conductor, 613: conductor, 620: conductor, 630: insulator, 631: insulator, 640: insulator, 641: insulator, 642: insulator, 650: insulator, 660: conductor, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 4700: electronic component, 4702: printed circuit board, 4704: mounting board, 4710: semiconductor device, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5110: SD card, 5111: housing, 5112: connector, 5113: substrate, 5115: controller chip, 5150: SSD, 5151: housing, 5152: connector, 5153: substrate, 5155: memory chip, 5156: controller chip, 5200: portable game machine, 5201: housing, 5202: display portion, 5203: button, 5300: desktop information terminal, 5301: main body, 5302: display, 5303: keyboard, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: crown, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens, 6300: video camera, 6301: first housing, 6302: second housing, 6303: display portion, 6304: operation key, 6305: lens, 6306: joint, 7500: stationary game machine, 7520: main body, 7522: controller

The invention claimed is:

1. A semiconductor device comprising:
a first transistor, a second transistor, a ferroelectric capacitor, and a first capacitor,
wherein a first gate of the first transistor is electrically connected to a first terminal of the ferroelectric capacitor,
wherein a first terminal of the first transistor is electrically connected to a second gate of the first transistor and a first terminal of the second transistor, and
wherein a second terminal of the second transistor is electrically connected to a second terminal of the ferroelectric capacitor and a first terminal of the first capacitor.

2. The semiconductor device according to claim 1,
wherein the ferroelectric capacitor comprises a dielectric, and
wherein the dielectric comprises at least one of hafnium oxide and zirconium oxide.

3. The semiconductor device according to claim 1, further comprising a second capacitor,
wherein a first terminal of the second capacitor is electrically connected to the first terminal of the first transistor and the first terminal of the second transistor.

4. The semiconductor device according to claim 1,
wherein a first gate of the second transistor is electrically connected to a second gate of the second transistor,
wherein the first gate of the second transistor is one of a front gate and a back gate of the second transistor, and
wherein the second gate of the second transistor is the other of the front gate and the back gate of the second transistor.

5. The semiconductor device according to claim 1, further comprising a memory cell comprising a third transistor,
wherein one of a first gate and a second gate of the third transistor is electrically connected to the first terminal of the first transistor.

6. The semiconductor device according to claim 1,
wherein the first gate of the first transistor is one of a front gate and a back gate of the first transistor, and
wherein the second gate of the first transistor is the other of the front gate and the back gate of the first transistor.

7. A semiconductor device comprising:
a first transistor, a second transistor, a first ferroelectric capacitor, and a second ferroelectric capacitor,
wherein a first gate of the first transistor is electrically connected to a first terminal of the first ferroelectric capacitor,
wherein a first terminal of the first transistor is electrically connected to a second gate of the first transistor and a first terminal of the second transistor, and
wherein a second terminal of the second transistor is electrically connected to a second terminal of the first ferroelectric capacitor and a first terminal of the second ferroelectric capacitor.

8. The semiconductor device according to claim 7,
wherein each of the first ferroelectric capacitor and the second ferroelectric capacitor comprises a dielectric, and wherein the dielectric of each of the first ferroelectric capacitor and the second ferroelectric capacitor comprises at least one of hafnium oxide and zirconium oxide.

9. The semiconductor device according to claim 7, further comprising a second capacitor,
wherein a first terminal of the second capacitor is electrically connected to the first terminal of the first transistor and the first terminal of the second transistor.

10. The semiconductor device according to claim 7,
wherein a first gate of the second transistor is electrically connected to a second gate of the second transistor,
wherein the first gate of the second transistor is one of a front gate and a back gate of the second transistor, and
wherein the second gate of the second transistor is the other of the front gate and the back gate of the second transistor.

11. The semiconductor device according to claim 7, further comprising a memory cell comprising a third transistor,
wherein one of a first gate and a second gate of the third transistor is electrically connected to the first terminal of the first transistor.

12. The semiconductor device according to claim 7,
wherein the first gate of the first transistor is one of a front gate and a back gate of the first transistor, and
wherein the second gate of the first transistor is the other of the front gate and the back gate of the first transistor.

* * * * *